(12) United States Patent
Higa et al.

(10) Patent No.: US 12,731,959 B2
(45) Date of Patent: Sep. 8, 2026

(54) SURFACE EMITTING LASER DEVICE

(71) Applicants: SONY GROUP CORPORATION, Tokyo (JP); SONY SEMICONDUCTOR SOLUTIONS CORPORATION, Kanagawa (JP)

(72) Inventors: Yasutaka Higa, Tokyo (JP); Rintaro Koda, Tokyo (JP); Hideki Watanabe, Tokyo (JP); Tatsuya Matou, Tokyo (JP); Hayato Kamizuru, Kumamoto (JP); Hirohisa Yasukawa, Kanagawa (JP)

(73) Assignees: SONY SEMICONDUCTOR SOLUTIONS CORPORATION, Kanagawa (JP); SONY GROUP CORPORATION, Tokyo (JP)

( * ) Notice: Subject to any disclaimer, the term of this patent is extended or adjusted under 35 U.S.C. 154(b) by 571 days.

(21) Appl. No.: 18/256,423

(22) PCT Filed: Nov. 8, 2021

(86) PCT No.: PCT/JP2021/040954
§ 371 (c)(1),
(2) Date: Jun. 7, 2023

(87) PCT Pub. No.: WO2022/130825
PCT Pub. Date: Jun. 23, 2022

(65) Prior Publication Data

US 2026/0121376 A1 Apr. 30, 2026

(30) Foreign Application Priority Data

Dec. 15, 2020 (JP) ................................ 2020-207646

(51) Int. Cl.
*H01S 5/042* (2006.01)
*H01S 5/0233* (2021.01)
*H01S 5/42* (2006.01)

(52) U.S. Cl.
CPC ........ *H01S 5/04256* (2019.08); *H01S 5/0233* (2021.01); *H01S 5/423* (2013.01)

(58) Field of Classification Search
CPC ....................................................... H01S 5/423
See application file for complete search history.

(56) References Cited

U.S. PATENT DOCUMENTS 5,978,403 A 11/1999 Iwasa
2015/0340841 A1* 11/2015 Joseph ............... H01S 5/04257 372/50.12

(Continued)

FOREIGN PATENT DOCUMENTS

JP 07-283486 A 10/1995
JP 11-186670 A 7/1999

(Continued)

OTHER PUBLICATIONS

International Search Report and Written Opinion of PCT Application No. PCT/JP2021/040954, issued on Dec. 7, 2021, 11 pages of ISRWO.

*Primary Examiner* — Minsun O Harvey
*Assistant Examiner* — Stephen Sutton Kotter
(74) *Attorney, Agent, or Firm* — CHIP LAW GROUP

(57) ABSTRACT

The present technology provides a surface emitting laser device capable of reducing resistance. The present technology provides a surface emitting laser device including: a first wiring group including a plurality of first wiring lines insulated from each other; a second wiring group including a plurality of second wiring lines insulated from each other; a first board provided with a plurality of light emitting units electrically connected to any one of the plurality of first (Continued)

wiring lines and electrically connected to any one of the plurality of second wiring lines; and a second board disposed to face the first board and provided with the first wiring group and/or the second wiring group.

14 Claims, 83 Drawing Sheets

(56) References Cited

U.S. PATENT DOCUMENTS

| | | | | |
|---|---|---|---|---|
| 2020/0014169 | A1* | 1/2020 | Yu | H01S 5/0203 |
| 2020/0067278 | A1* | 2/2020 | Han | H01S 5/18311 |
| 2020/0083669 | A1 | 3/2020 | Na et al. | |
| 2020/0343695 | A1* | 10/2020 | Mathai | H01S 5/4012 |

FOREIGN PATENT DOCUMENTS

| | | | |
|---|---|---|---|
| JP | 2000-012973 | A | 1/2000 |
| JP | 2000-114656 | A | 4/2000 |
| JP | 2001-068795 | A | 3/2001 |
| JP | 2007-059673 | A | 3/2007 |
| JP | 2009-016588 | A | 1/2009 |
| WO | WO-2003003423 | A1 | 1/2003 |
| WO | WO-2020162390 | A1 | 8/2020 |

* cited by examiner

SURFACE EMITTING LASER DEVICE

CROSS REFERENCE TO RELATED APPLICATIONS

This application is a U.S. National Phase of International Patent Application No. PCT/JP2021/040954 filed on Nov. 8, 2021, which claims priority benefit of Japanese Patent Application No. JP 2020-207646 filed in the Japan Patent Office on Dec. 15, 2020. Each of the above-referenced applications is hereby incorporated herein by reference in its entirety.

TECHNICAL FIELD

The technology according to the present disclosure (hereinafter also referred to as "the present technology") relates to a surface emitting laser device.

BACKGROUND ART

Conventionally, there has been disclosed a laser array chip in which a plurality of two-dimensionally arranged surface emitting laser elements, and an anode wiring line and a cathode wiring line connected to each surface emitting laser element are formed on the same board (see, for example, Patent Document 1).

CITATION LIST

Patent Document

Patent Document 1: Japanese Patent Application Laid-Open No. 2000-12973

SUMMARY OF THE INVENTION

Problems to be Solved by the Invention

However, in the above-described conventional technique, there is room for improvement in reducing resistance.

Therefore, a main object of the present technology is to provide a surface emitting laser device capable of reducing resistance.

Solutions to Problems

The present technology provides a surface emitting laser device including:

- a first wiring group including a plurality of first wiring lines insulated from each other;
- a second wiring group including a plurality of second wiring lines insulated from each other;
- a first board provided with a plurality of light emitting units electrically connected to any one of the plurality of first wiring lines and electrically connected to any one of the plurality of second wiring lines; and
- a second board disposed to face the first board and provided with the first wiring group and/or the second wiring group.

Each of a plurality of the light emitting units may be joined to a corresponding wiring line of one wiring group provided on the second board among the first wiring group and the second wiring group.

Both the first wiring group and the second wiring group may be provided on the second board.

Each of the plurality of light emitting units may have a mesa protruding on the second board side, a first electrode provided at a top portion of the mesa of each light emitting unit among the plurality of light emitting units may be joined via a first bump to the first wiring line corresponding to the each light emitting unit, and a second electrode provided in a peripheral portion of each light emitting unit among the plurality of light emitting units on the first board may be joined via a second bump to the second wiring line corresponding to the each light emitting unit.

The first wiring group or the second wiring group may be provided on the second board.

Each of the plurality of light emitting units may have a mesa protruding on the second board side, the first wiring group may be provided on the second board, the second wiring group may be provided on the first board, a first electrode provided at the top portion of the mesa of each light emitting unit among the plurality of light emitting units may be joined via a first bump to the first wiring line corresponding to the each light emitting unit, and each second wiring line among the plurality of second wiring lines may be joined via a second bump to a wiring line provided on the second board and corresponding to the second wiring line.

Each of the plurality of second wiring lines may include a first portion provided along the first board and a second portion provided along a pedestal portion provided on the first board, and the second portion of each of the second wiring lines may be joined via the second bump to the wiring line that is corresponding.

A conductor may be further included that is disposed along at least a part of the first wiring group and/or the second wiring group and insulated from both the first wiring group and the second wiring group.

The conductor may be provided on the first board and/or the second board.

The conductor may be connected to a reference potential.

The conductor may be metal or an alloy.

The conductor may be a semiconductor containing impurities.

A third wiring line may be further included that is provided on the second board and insulated from both the first wiring group and the second wiring group, the conductor may be provided on the first board, and the conductor and the third wiring line may be joined via a bump.

The third wiring line may be provided along at least a part of the first wiring group and/or the second wiring group.

A third wiring line may be further included that is provided on the first board and/or the second board and insulated from both the first wiring group and the second wiring group, and the third wiring line may be provided along at least a part of the first wiring group and/or the second wiring group.

A total of the number of the plurality of first wiring lines and the number of the plurality of second wiring lines may be less than twice the number of the light emitting units.

The light emitting unit may include a layered structure in which a first multilayer film reflector, an active layer, and a second multilayer film reflector are layered in this order on the first board.

Both the first wiring group and the second wiring group may be connected to an electronic circuit.

The second board may contain an insulating material, an electronic circuit may be disposed on the second board or in the second board, and the first wiring group and the second wiring group may be connected to the electronic circuit.

A conductor may be further included that is disposed along at least a part of the first wiring group and/or the second wiring group and insulated from both the first wiring group and the second wiring group.

BRIEF DESCRIPTION OF DRAWINGS

FIG. 2 is a cross-sectional view taken along line A-A of FIG. 1.

FIG. 5 is a first step view of the manufacturing method for the surface emitting laser device of FIG. 1.

FIG. 8 is a cross-sectional view taken along line B-B in FIG. 6.

FIG. 10 is a cross-sectional view taken along line A-A of FIG. 9.

FIG. 16 is a cross-sectional view taken along line A-A of FIG. 15.

FIG. 19 is a cross-sectional view taken along line A-A of FIG. 18.

FIG. 20 is a cross-sectional view taken along line B-B in FIG. 18.

FIG. 22 is a cross-sectional view (before joining) taken along line A-A in FIG. 21.

Figure 25:
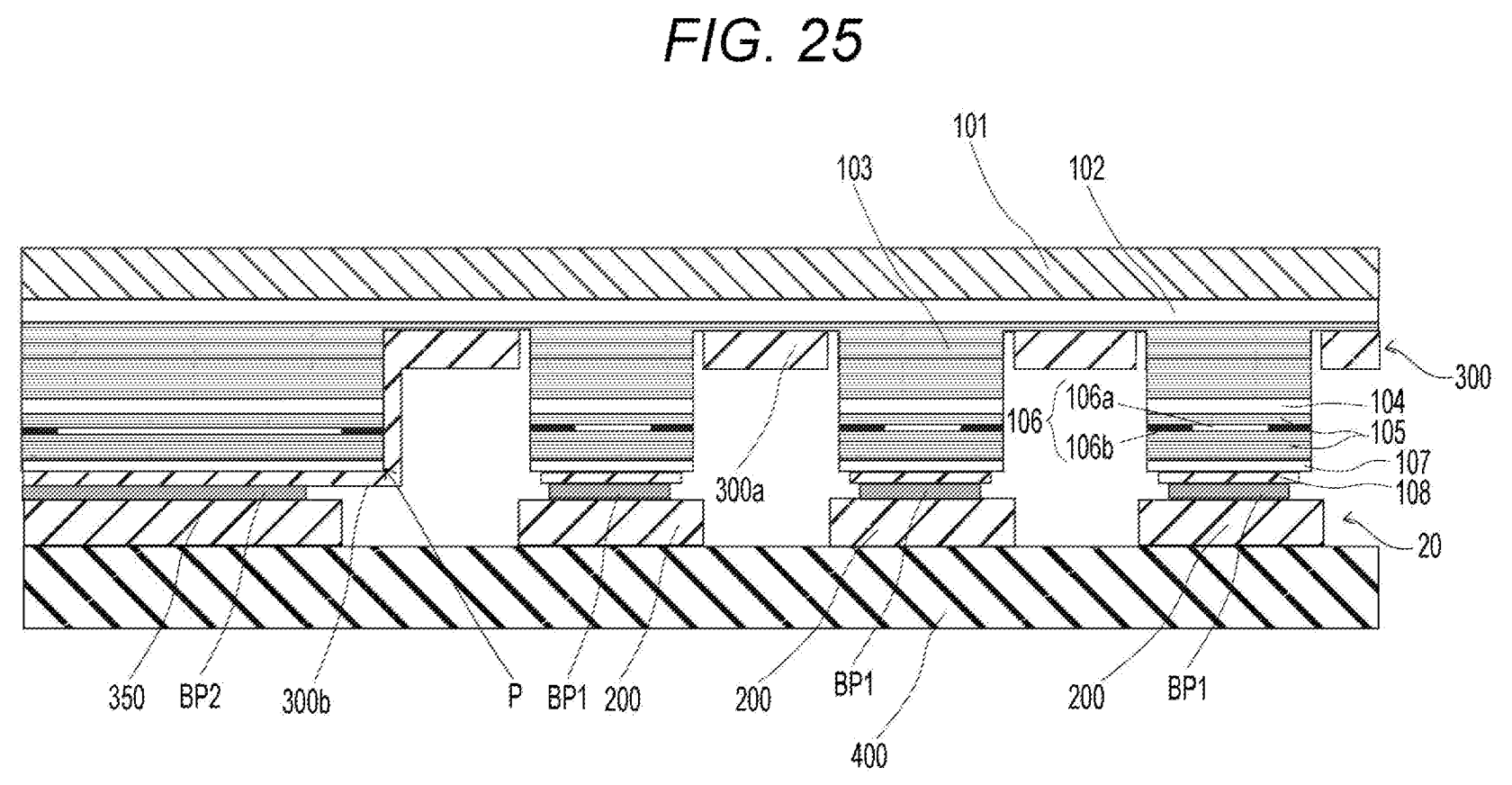

FIG. 25 is a cross-sectional view (after joining) taken along line B-B in FIG. 21.

FIG. 29 is a cross-sectional view taken along line B-B in FIG. 27.

FIG. 33 is a cross-sectional view taken along line B-B in FIG. 31.

FIG. 35 is a cross-sectional view taken along line A-A of FIG. 34.

FIG. 36 is a cross-sectional view taken along line B-B in FIG. 34.

FIG. 38 is a cross-sectional view taken along line A-A of FIG. 37.

FIG. 39 is a cross-sectional view taken along line B-B in FIG. 37.

FIG. 42 is a cross-sectional view taken along line B-B in FIG. 40.

FIG. 45 is a cross-sectional view taken along line B-B in FIG. 43.

Figure 50:
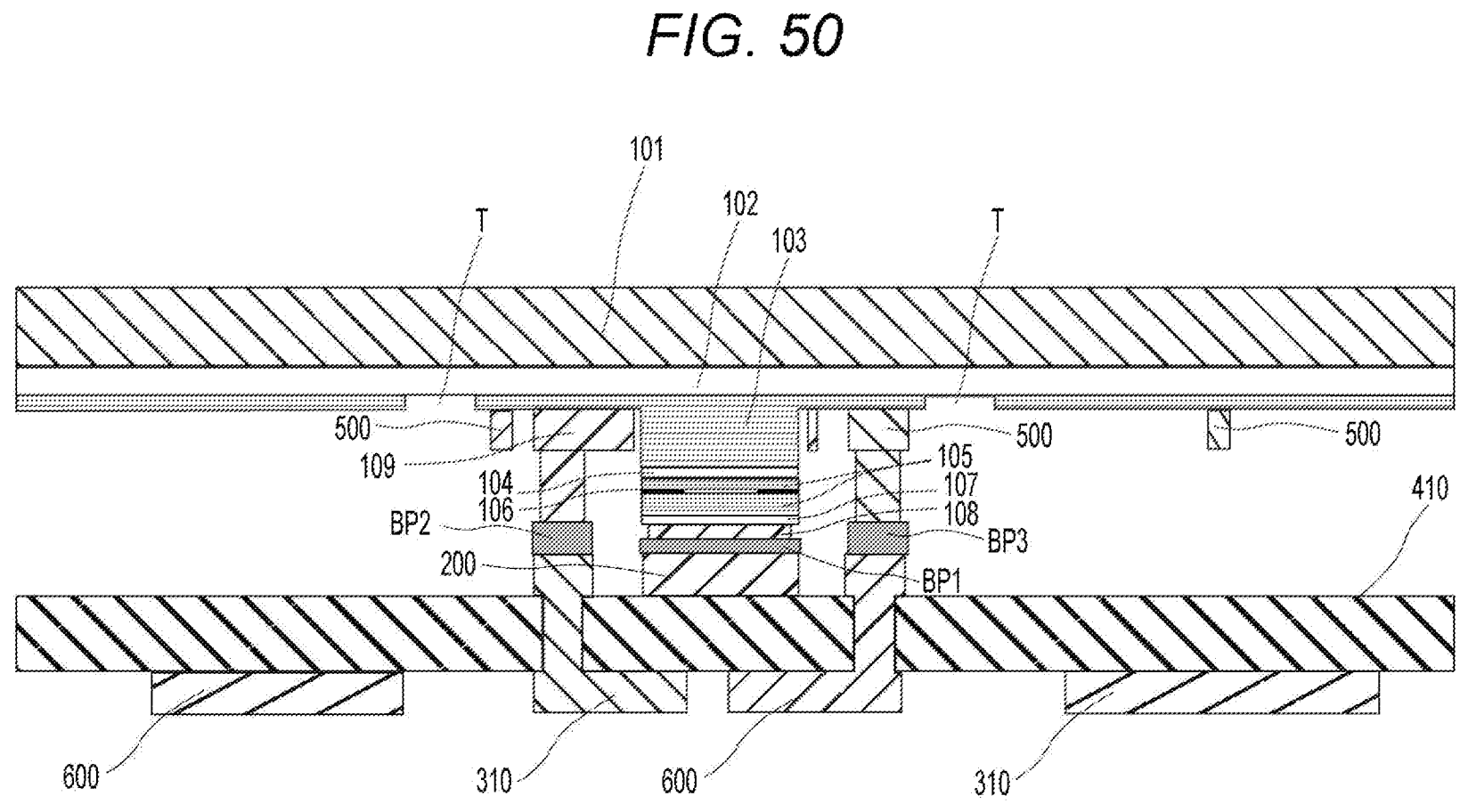

FIG. 50 is a cross-sectional view (after joining) taken along line B-B in FIG. 46.

FIG. 53 is a cross-sectional view taken along line A-A of FIG. 52.

FIG. 57 is a cross-sectional view taken along line B-B in FIG. 55.

FIG. 60 is a cross-sectional view taken along line B-B in FIG. 58.

FIG. 62 is a cross-sectional view taken along line A-A of FIG. 61.

FIG. 65 is a cross-sectional view taken along line A-A of FIG. 64.

FIG. 77 is a cross-sectional view taken along line B-B in FIG. 75.

MODE FOR CARRYING OUT THE INVENTION

Figure 1:
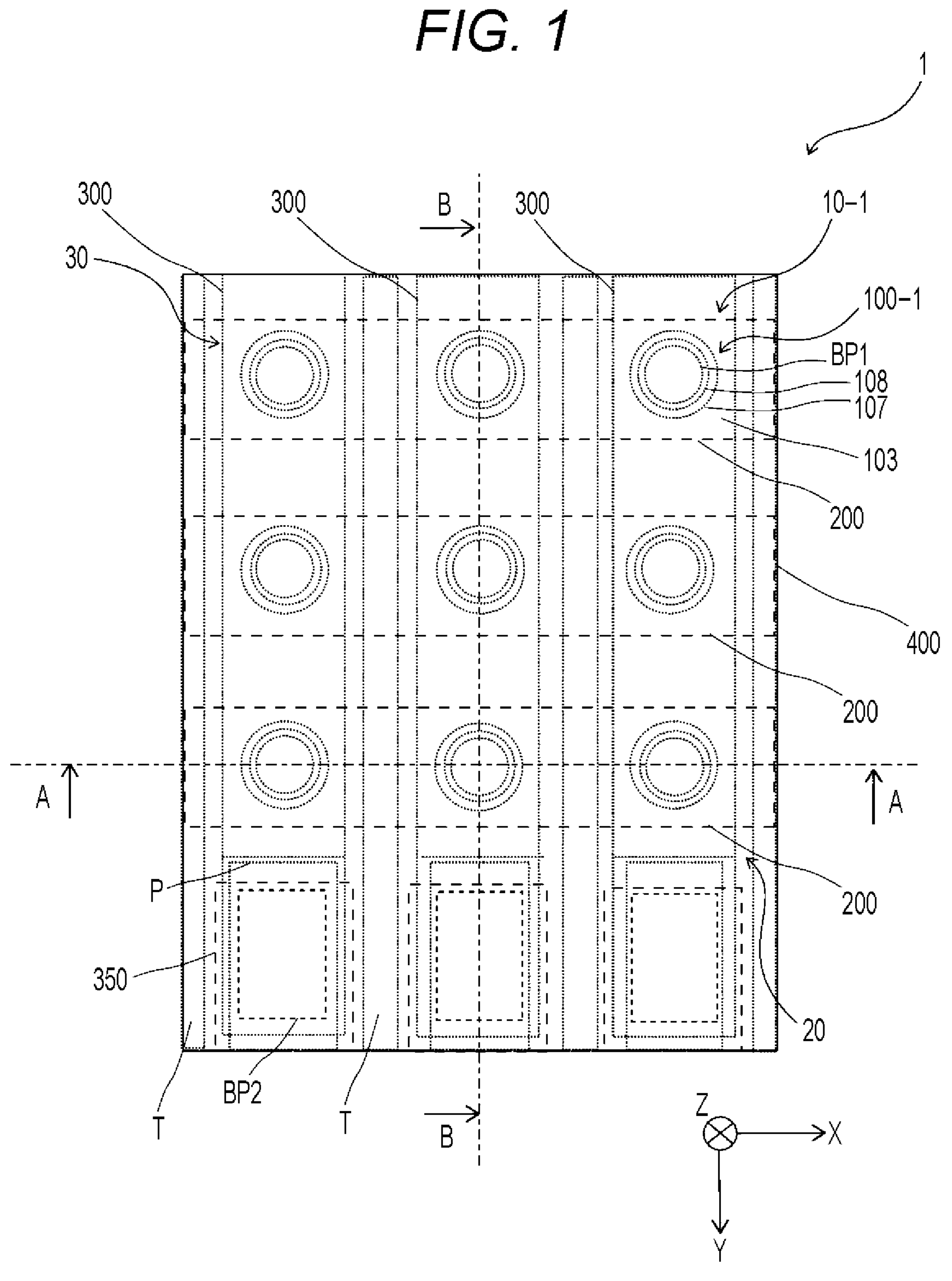
FIG. 1 is an extracted plan view illustrating a part of a surface emitting laser device according to a first embodiment of the present technology.

Hereinafter, preferred embodiments of the present technology will be described in detail with reference to the accompanying drawings. Note that, in this specification and the drawings, components having substantially the same functional configuration are denoted by the same reference numerals, and redundant explanations are omitted. The embodiments described below show one example of a representative embodiment of the present technology, and do not cause the scope of the present technology to be narrowly interpreted. In the present specification, even in a case where it is described that a surface emitting laser device according to the present technology exhibits a plurality of effects, it suffices that the surface emitting laser device according to the present technology exhibits at least one effect. The effects described in this specification are merely examples and are not limited, and other effects may also be present.

Furthermore, the description will be given in the following order.

1. Configuration of surface emitting laser device according to first embodiment of present technology
2. Operation of surface emitting laser device according to first embodiment of present technology
3. Manufacturing method for surface emitting laser device according to first embodiment of present technology
4. Effect of surface emitting laser device and effect of manufacturing method thereof according to first embodiment of present technology
5. Configuration of surface emitting laser device according to second embodiment of present technology
6. Manufacturing method for surface emitting laser device according to second embodiment of present technology
7. Effect of surface emitting laser device according to second embodiment of present technology
8. Surface emitting laser device according to third embodiment of present technology
9. Surface emitting laser device according to fourth embodiment of present technology
10. Surface emitting laser device according to fifth embodiment of present technology
11. Surface emitting laser device according to sixth embodiment of present technology
12. Surface emitting laser device according to seventh embodiment of present technology
13. Surface emitting laser device according to eighth embodiment of present technology
14. Surface emitting laser device according to ninth embodiment of present technology
15. Surface emitting laser device according to tenth embodiment of present technology
16. Surface emitting laser device according to eleventh embodiment of present technology
17. Modification of present technology
18. Application example to electronic device
19. Example in which surface emitting laser device is applied to distance measuring device
20. Example in which distance measuring device is installed on mobile object 1. <Configuration of Surface Emitting Laser Device According to First Embodiment of Present Technology>

(Overall Configuration)

Figure 2:
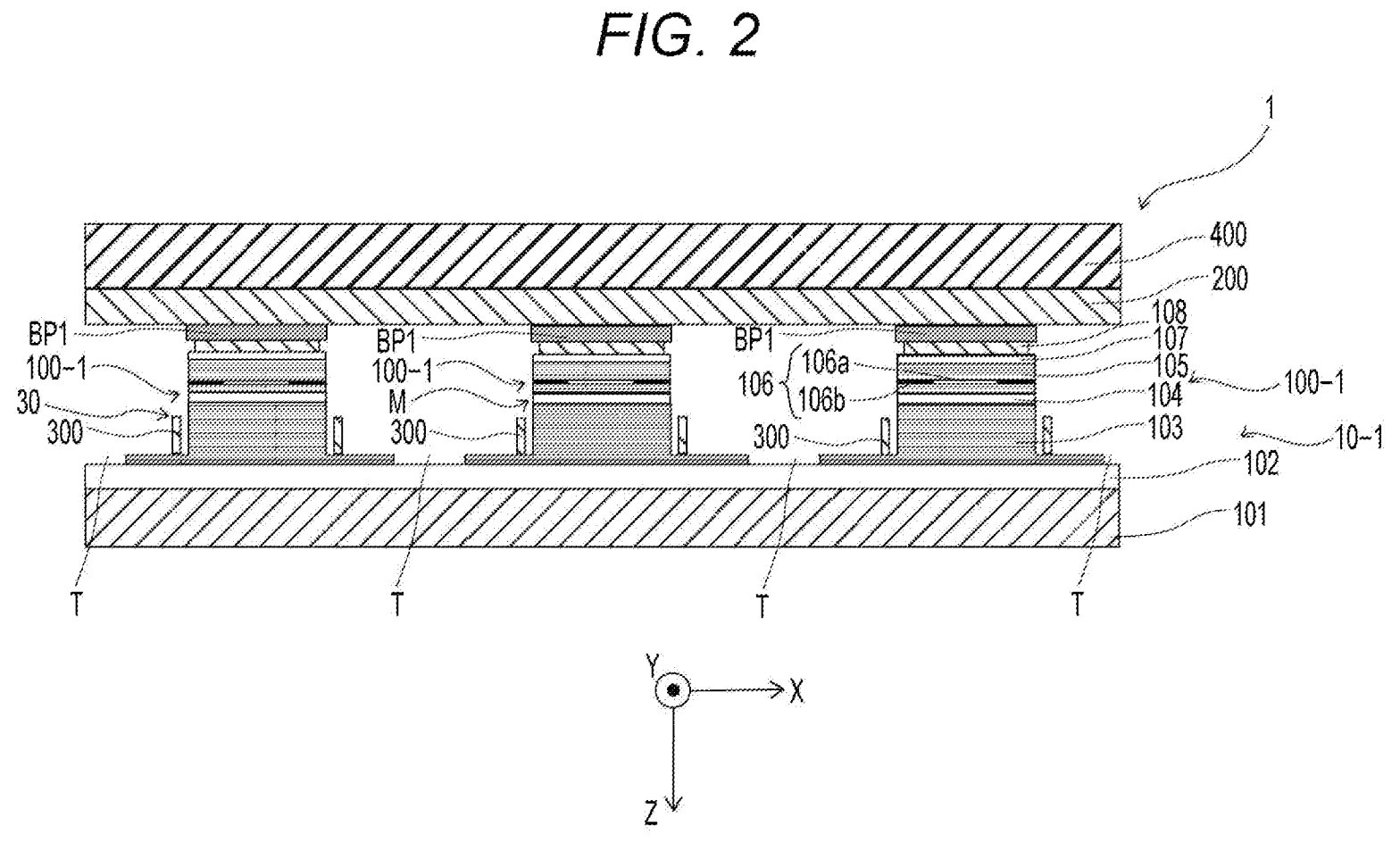
Figure 3:
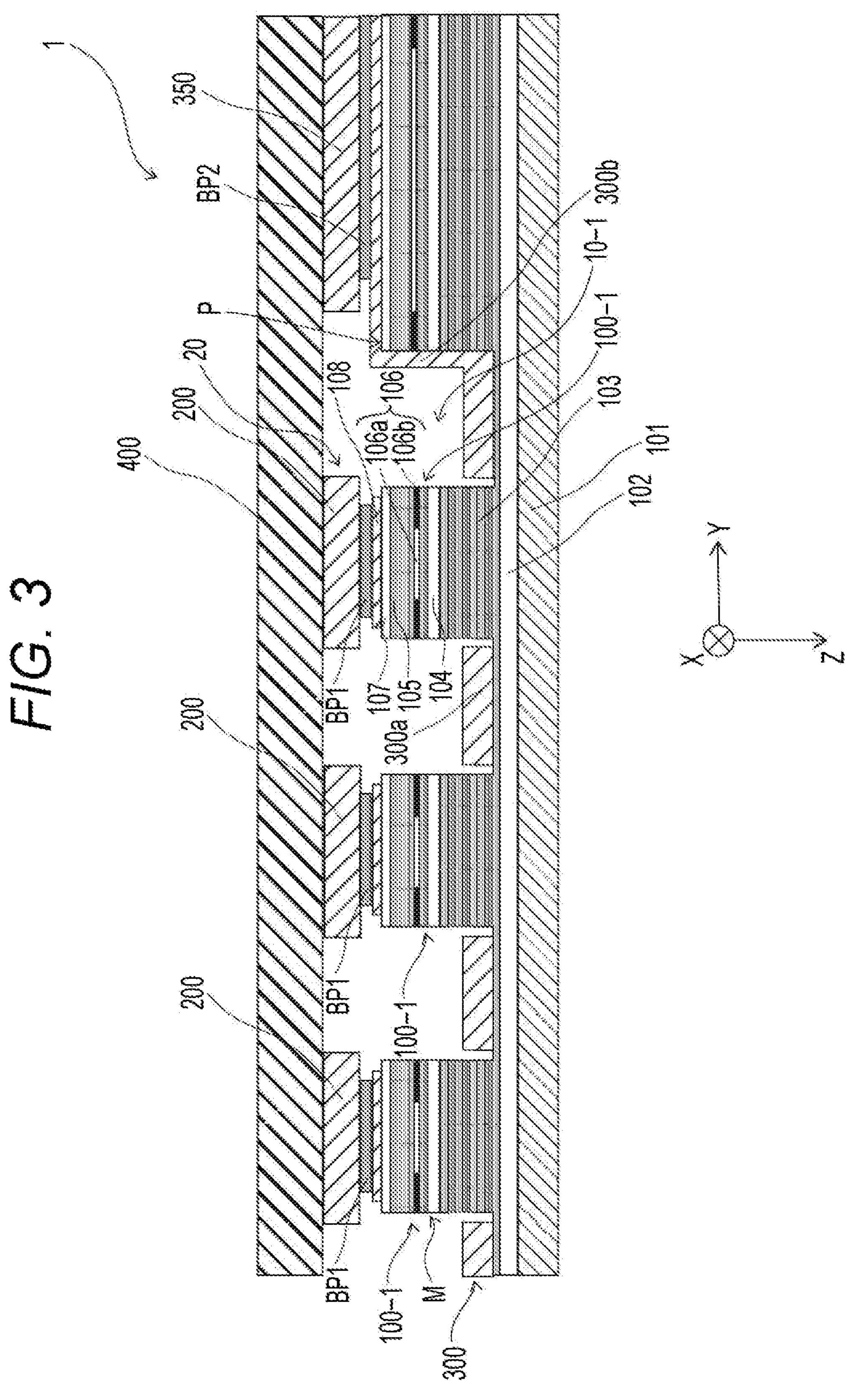
FIG. 3 is a cross-sectional view taken along line B-B in FIG. 1.

FIG. 1 is an extracted plan view illustrating a part of a surface emitting laser device 1 according to a first embodiment of the present technology. FIG. 2 is a cross-sectional view taken along line A-A in FIG. 1. FIG. 3 is a cross-sectional view taken along line B-B in FIG. 1.

As illustrated in FIG. 1, the surface emitting laser device 1 includes a surface emitting laser array 10-1 adopting a passive matrix type driving system.

More specifically, as can be seen from combining FIGS. 1 to 3, the surface emitting laser device 1 includes a first wiring group 20, a second wiring group 30, a first board 101 on which the surface emitting laser array 10-1 and the second wiring group 30 are formed, and a second board 400 on which the first wiring group 20 is formed.

Hereinafter, the description will be made by using an XYZ three-dimensional orthogonal coordinate system illustrated in FIG. 1 and the like as appropriate. However, a direction perpendicular to the first board 101 is defined as a Z direction.

As illustrated in FIGS. 2 and 3, the first board 101 and the second board 400 are disposed to face each other. More specifically, the first board 101 and the second board 400 are arranged substantially parallel to each other, as an example.

(First Board)

The first board 101 is, as an example, a semiconductor board of a first conductivity type (for example, n-type). More specifically, the first board 101 is a semiconductor board including, for example, a GaAs-based compound semiconductor such as Si—GaAs (GaAs doped with Si). The first board 101 is transparent to an oscillation wavelength of a surface emitting laser described later.

(Second Board)

The second board 400 is, as an example, an insulating board. As a material of the second board 400, for example, an organic material such as polyimide is preferable, and for example, a material having a high thermal conductivity such as copper-diamond (a composite material of copper diamond) is more preferable. Copper-diamond has a thermal conductivity equal to or higher than that of copper while having a thermal expansion coefficient close to that of a compound semiconductor such as GaAs or GaN.

(First Wiring Group)

The first wiring group 20 includes a plurality of first wiring lines 200 insulated from each other. As illustrated in FIGS. 2 and 3, the first wiring group 20 is formed on a surface of the second board 400 on the first board 101 side. The first wiring group 20 and the second board 400 constitute a "wiring board". On the second board 400, only each first wiring line 200 and each wiring line 350 as described later are formed as wiring lines, and each second wiring line 300 is not formed. Therefore, since a space for forming each first wiring line 200 and each wiring line 350 can be sufficiently secured in the second board 400, the first wiring line 200 and the wiring line 350 have a sufficiently large cross-sectional area (a thickness and a width). The thickness of each first wiring line 200 and each wiring line 350 is, for example, 5 to 10 μm. The width of each first wiring line 200 and each wiring line 350 is, for example, 50 to 200 μm.

As an example, each of the plurality of first wiring lines 200 extends in the X direction and is arranged at substantially equal intervals in the Y direction.

Each first wiring line 200 may have a single-layer structure or a layered structure.

Each first wiring line 200 contains, for example, at least one type of metal (including an alloy) selected from a group including Au, Ag, Pd, Pt, Ni, Ti, V, W, Cr, Al, Cu, Zn, Sn, and In.

In a case where each first wiring line 200 has a layered structure, the first wiring line 200 contains a material such as, for example, Ti/Au, Ti/Al, Ti/Al/Au, Ti/Pt/Au, Ni/Au, Ni/Au/Pt, Ni/Pt, Pd/Pt, or Ag/Pd.

(Second Wiring Group)

The second wiring group 30 includes a plurality of second wiring lines 300 insulated from each other. As illustrated in FIGS. 2 and 3, the second wiring group 30 is formed on a surface of the first board 101 on the second board 400 side. That is, the second wiring group 30 is formed on the first board 101, which is a board different from the second board 400 on which the first wiring group 20 is formed. That is, only each second wiring line 300 is formed as a wiring line on the first board 101, and each first wiring line 200 is not formed. Therefore, since a space for forming each second wiring line 300 can be sufficiently secured in the first board 101, each second wiring line 300 and each wiring line 350 also have a sufficiently large cross-sectional area (a thickness and a width). Furthermore, since there is no element structure (for example, a surface emitting laser structure) on the second board 400, restrictions on a process of forming each second wiring line 300 can be relaxed, and it is easy to form a wiring line having a larger cross-sectional area. The thickness of each second wiring line 300 is, for example, 10 to 30 μm. The width of each second wiring line 300 is, for example, 50 to 200 μm.

As an example, each of the plurality of second wiring lines 300 extends in the Y direction and is arranged at substantially equal intervals in the X direction. That is, as an example, each of the plurality of first wiring lines 200 and each of the plurality of second wiring lines 300 are not parallel to each other (for example, are orthogonal to each other) when viewed from the Z direction.

Each second wiring line 300 contains, for example, at least one type of metal (including an alloy) selected from a group including Au, Ag, Pd, Pt, Ni, Ti, V, W, Cr, Al, Cu, Zn, Sn, and In.

In a case where each second wiring line 300 has a layered structure, the second wiring line 300 contains a material such as, for example, Ti/Au, Ti/Al, Ti/Al/Au, Ti/Pt/Au, Ni/Au, Ni/Au/Pt, Ni/Pt, Pd/Pt, or Ag/Pd.

As an example, both the first wiring group 20 and the second wiring group 30 are connected to an electronic circuit. Each first wiring line 200 of the first wiring group 20 is selectively connected to, for example, a terminal (+ terminal) on a positive electrode side (anode side) of the electronic circuit, and each second wiring line 300 of the second wiring group 30 is selectively connected to, for example, a terminal (− terminal) on the negative electrode side (cathode side) of the electronic circuit. Examples of the electronic circuit include a laser driver that drives the surface emitting laser array 10-1. The laser driver includes, for example, a driver IC, and is mounted on a printed wiring board.

(Surface Emitting Laser Array)

As illustrated in FIGS. 1 to 3, the surface emitting laser array 10-1 includes a plurality of surface emitting lasers arranged two-dimensionally (for example, arranged in a matrix) on the first board 101. The surface emitting laser is also called a vertical cavity surface emitting laser (VCSEL).

As an example, each surface emitting laser includes a light emitting unit 100-1 formed on the board 101, and emits light to a back surface side (+Z side) of the board 101. That is, each surface emitting laser is a back-side emission surface emitting laser, and an emission direction is the +Z direction.

As an example, each light emitting unit 100-1 has a mesa M protruding on the second board 400 side. Upper surfaces of the mesas M each are substantially flush with each other. Each mesa M has, for example, a cylindrical shape, but may have another columnar shape such as a truncated cone shape or a polygonal columnar shape.

In the surface emitting laser array 10-1, as an example, a column direction coincides with the X direction, and a row direction coincides with the Y direction.

As an example, the surface emitting laser array 10-1 has a relatively large number of channels (for example, 100 ch×100 ch), and each channel is driven with a large current (>1 A) and a short pulse (<10 ns). Note that the number of channels is the number of light emitting units 100-1.

As an example, each light emitting unit 100-1 is disposed at an intersection of the first wiring line 200 and the second wiring line 300 when viewed from the Z direction. Each light emitting unit 100-1 is electrically connected to any one of the plurality of first wiring lines 200, and is electrically connected to any one of the plurality of second wiring lines 300.

Specifically, each first wiring line 200 is, for example, an anode wiring line (a wiring line that allows a current to flow into the corresponding light emitting unit 100-1). More specifically, each first wiring line 200 is an anode wiring line common to at least two light emitting units 100-1 aligned in the X direction.

Each second wiring line 300 is, for example, a cathode wiring line (a wiring line that allows a current to flow out from the corresponding light emitting unit 100-1). More specifically, each second wiring line 300 is a cathode wiring line common to at least two light emitting units 100-1 aligned in the Y direction.

That is, the number of the plurality of first wiring lines 200 is smaller than the number of columns of the surface emitting laser array 10-1 (the number of the light emitting units 100-1 aligned in the X direction). The number of the plurality of second wiring lines 300 is smaller than the number of rows of the surface emitting laser array 10-1 (the number of the light emitting units 100-1 aligned in the Y direction).

As a result, a total of the number of the plurality of first wiring lines 200 and the number of the plurality of second wiring lines 300 is smaller than twice the number of the light emitting units 100-1.

By energizing selection between at least one first wiring line 200 among the plurality of first wiring lines 200 and at least one second wiring line 300 among the plurality of second wiring lines 300 by using the passive matrix driving system configured as described above, at least one light emitting unit 100-1 can be independently driven (turned on).

Each light emitting unit 100-1 is joined to the corresponding first wiring line 200 of the first wiring group 20, which is one wiring group formed on the second board 400 among the first wiring group 20 and the second wiring group 30. More specifically, a first electrode 108 formed at a top portion of the mesa M of each of the plurality of light emitting units 100-1 is joined via a first bump BP1 to the first wiring line 200 corresponding to the light emitting unit 100-1.

The first bump BP1 contains a joining material having conductivity, for example, solder paste (cream solder). The solder paste has a property (thixotropy) in which a viscosity decreases (becomes the softened state) when stirred, and the viscosity returns to the original state (the cured state) when left to stand. Specific examples of the solder paste include Sn—Ag-based solder paste, Sn—Au-based solder paste, Sn—Cu-based solder paste, and the like.

As an example, the first electrode 108 is an anode electrode (an electrode into which a current flows). The first electrode 108 may have a single-layer structure or a layered structure.

The first electrode 108 contains, for example, at least one type of metal (including an alloy) selected from a group including Au, Ag, Pd, Pt, Ni, Ti, V, W, Cr, Al, Cu, Zn, Sn, and In.

In a case where the first electrode 108 has a layered structure, the first electrode 108 contains a material such as, for example, Ti/Au, Ti/Al, Ti/Al/Au, Ti/Pt/Au, Ni/Au, Ni/Au/Pt, Ni/Pt, Pd/Pt, or Ag/Pd.

Here, as illustrated in FIGS. 1 and 3, a plurality of pedestal portions P is formed individually corresponding to a plurality of light emitting unit rows that is aligned in the X direction and each includes a plurality of light emitting units 100-1 aligned on the first board 101 in the Y direction. More specifically, each pedestal portion P is formed at a position adjacent to the +Y side of the corresponding light emitting unit row.

As illustrated in FIGS. 1 to 3, each second wiring line 300 includes a first portion **300*a* extending in the Y direction and surrounding the plurality of light emitting units 100-2 of the corresponding light emitting unit row, and a second portion 300*b* continuous with the first portion 300*a* and disposed along the pedestal portion P. On a surface of the second board 400 on the first board 101 side, the wiring line 350 is formed at a position facing a portion of the second portion 300*b* covering a surface of the pedestal portion P on the −Z-side. The second portion 300*b* and the wiring line 350 are joined via a second bump BP2**.

The second bump BP2 contains a joining material having conductivity, for example, solder paste (cream solder). The solder paste has a property (thixotropy) in which a viscosity decreases (becomes the softened state) when stirred, and the viscosity returns to the original state (the cured state) when left to stand. Specific examples of the solder paste include Sn—Ag-based solder paste, Sn—Au-based solder paste, Sn—Cu-based solder paste, and the like.

As illustrated in FIGS. 2 and 3, each light emitting unit 100-1 has a layered structure in which a buffer layer 102, a first multilayer film reflector 103, an active layer 104, a second multilayer film reflector 105, and a contact layer 107 are layered in this order from the first board 101 side on the first board 101.

The buffer layer 102 is a semiconductor layer of the first conductivity type (for example, n-type).

The first multilayer film reflector 103 is, as an example, a semiconductor multilayer film reflector of the first conductivity type (for example, n-type), and has a structure in which a plurality of types (for example, two types) of semiconductor layers (refractive index layers) having mutually different refractive indexes are alternately layered with an optical thickness of ¼ wavelength of the oscillation wavelength. A semiconductor multilayer film reflector which is a type of multilayer film reflector (a distributed Bragg reflector) has low light absorption, high reflectance, and conductivity.

Each refractive index layer of the first multilayer film reflector 103 includes, for example, an AlGaAs-based compound semiconductor of the first conductivity type. The first multilayer film reflector 103 is also called a "lower DBR".

The active layer 104 has a quantum well structure including a barrier layer including, for example, an AlGaAs-based compound semiconductor, and a quantum well layer. This quantum well structure may be a single quantum well structure (QW structure) or a multiple quantum well structure (MQW structure).

The second multilayer film reflector 105 is, as an example, a semiconductor multilayer film reflector. The multilayer film reflector is also referred to as a distributed Bragg reflector. The second multilayer film reflector 105 is also referred to as an "upper DBR".

The second multilayer film reflector 105 is, as an example, a semiconductor multilayer film reflector of a second conductivity type (for example, p-type), and has a structure in which a plurality of types (for example, two types) of semiconductor layers (refractive index layers)

having mutually different refractive indexes are alternately layered with an optical thickness of ¼ (λ/4) of an oscillation wavelength λ.

Each refractive index layer of the second multilayer film reflector 105 includes, for example, an AlGaAs-based compound semiconductor of the second conductivity type.

Inside the second multilayer film reflector 105 of the light emitting unit 100-1, a current constriction layer 106 is disposed. As an example, the current constriction layer 106 includes a non-oxidized area **106*a* containing AlAs, and an oxidized area 106*b* containing an oxide of AlAs (for example, $Al_2O_3$) and surrounding the non-oxidized area 106*a***.

The contact layer 107 includes, as an example, a GaAs-based compound semiconductor of the second conductivity type (for example, p-type).

As illustrated in FIG. 3, the pedestal portion P has a layer configuration substantially same as the layer configuration of the light emitting unit 100-1. That is, a height dimension of the pedestal portion P is substantially same as a height dimension of each mesa M, and an upper surface of the pedestal portion P is substantially flush with an upper surface of each mesa M.

2. <Operation of Surface Emitting Laser Device According to First Embodiment of Present Technology>

Hereinafter, an operation of the surface emitting laser device 1 according to the first embodiment of the present technology will be briefly described.

When a current is supplied from the printed wiring board described above to the driver IC of the laser driver described above, the driver IC operates, and a voltage is selectively applied to at least one light emitting unit 100-1 (a light emitting unit as an emission target) among the plurality of light emitting units 100-1 of the surface emitting laser array 10-1. At this time, a current is injected into the light emitting unit 100-1 to which the voltage is applied, via the first electrode 108 formed at the top portion of the mesa M of the light emitting unit 100-1. The injected current is injected into the active layer 104 via the contact layer 107, the second multilayer film reflector 105, and the current constriction layer 106. As a result, when the active layer 104 emits light, the light is amplified while being repeatedly reflected between the first and second multilayer film reflectors 103 and 105, and an oscillation condition is satisfied, the light is emitted from a back surface (a surface on the +Z side) of the first board 101 as laser light.

3. <Manufacturing Method for Surface Emitting Laser Device According to First Embodiment of Present Technology>

Figure 4:
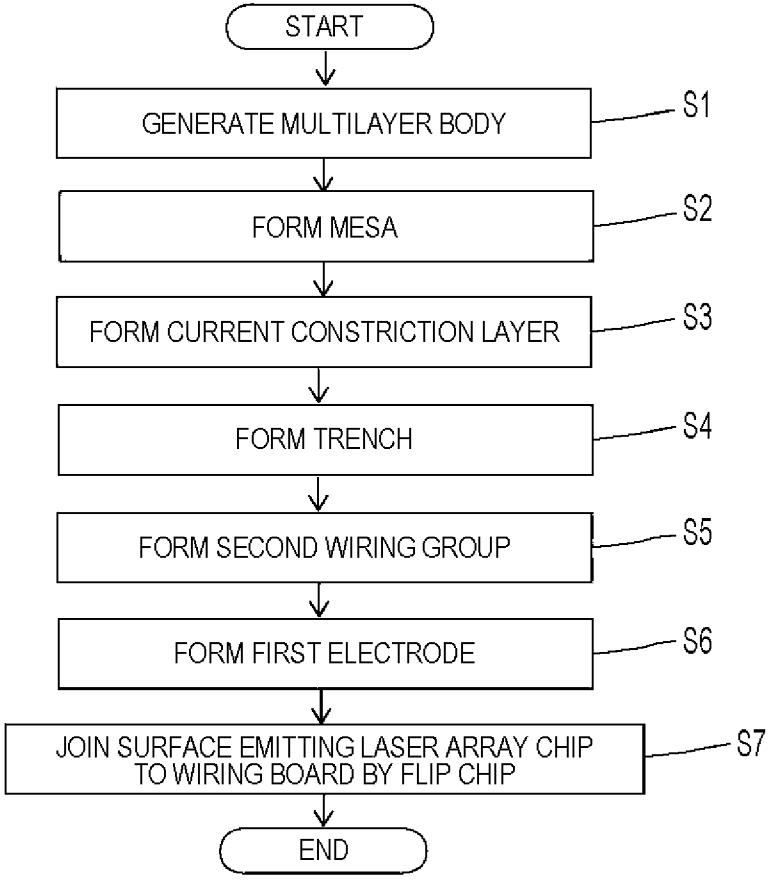
FIG. 4 is a flowchart for explaining a manufacturing method for the surface emitting laser device in FIG. 1.

Hereinafter, with reference to a flowchart of FIG. 4, a manufacturing method for the surface emitting laser device 1 according to the first embodiment will be described.

As a rough flow of the manufacturing method for the surface emitting laser device 1, by a semiconductor manufacturing method using a semiconductor manufacturing device, a plurality of surface emitting laser arrays 10-1 is simultaneously generated on one wafer that is a base material of the board 101. Next, the plurality of continuous and integrated surface emitting laser arrays 10-1 is separated from each other by dicing, to obtain a plurality of chip-shaped surface emitting laser arrays 10-1 (hereinafter also referred to as "surface emitting laser array chips"). Thereafter, the surface emitting laser array chip is joined to the second board 400, and the surface emitting laser device 1 is obtained.

Figure 5:
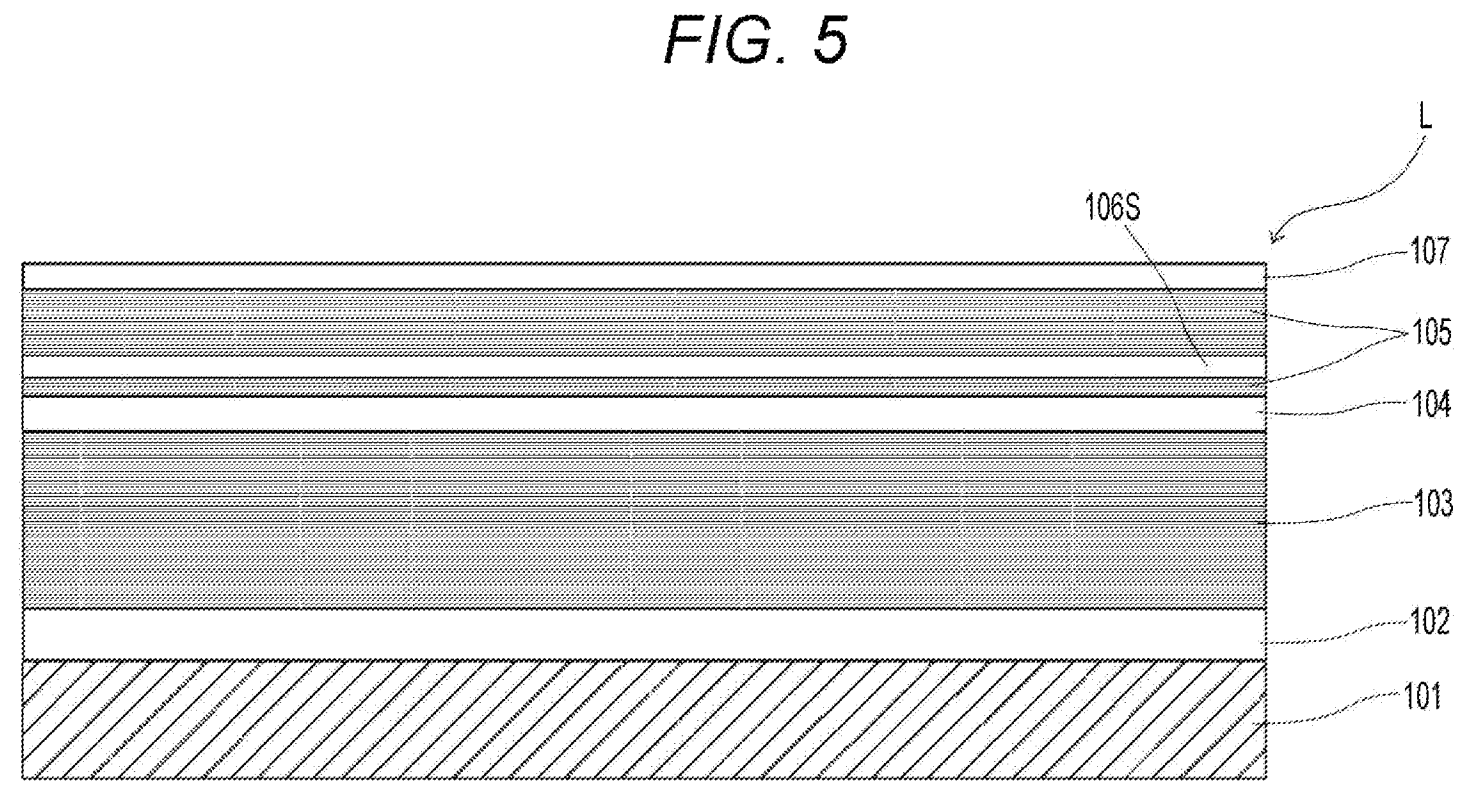

In the first step S1, a multilayer body L is generated. Specifically, the multilayer body L is generated by layering the buffer layer 102, the first multilayer film reflector 103, the active layer 104, the second multilayer film reflector 105 including a selectively oxidized layer 106S therein, and the contact layer 107 in this order on the board 101, by using a chemical vapor deposition (CVD) method, for example, a metal organic chemical vapor deposition (MOCVD) method (see FIG. 5).

In the next step S2, the mesa M is formed.

Figure 6:
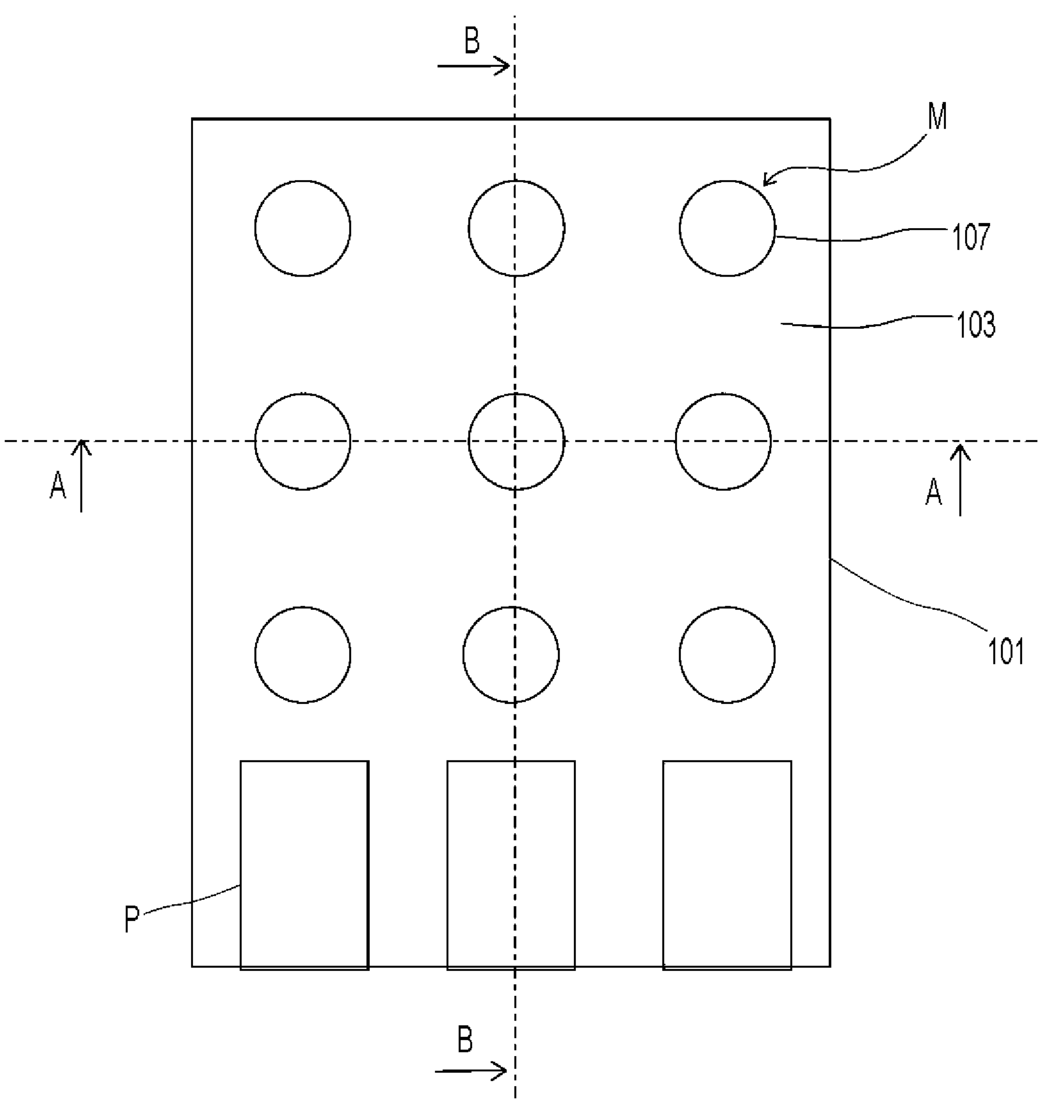
FIG. 6 is a second step view of the manufacturing method for the surface emitting laser device of FIG. 1.
Figure 7:
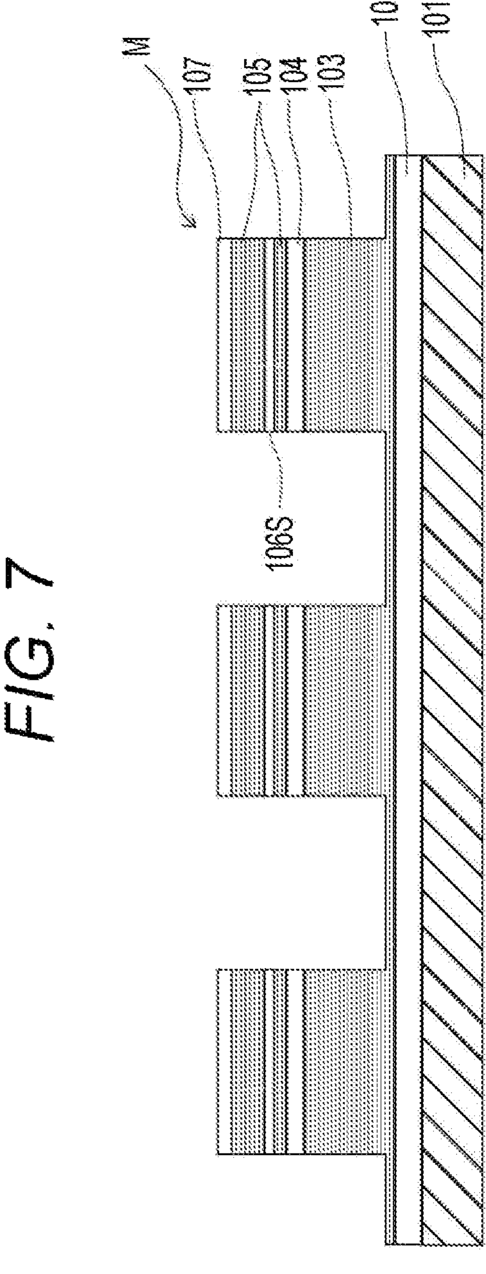
FIG. 7 is a cross-sectional view taken along line A-A of FIG. 6.
Figure 8:
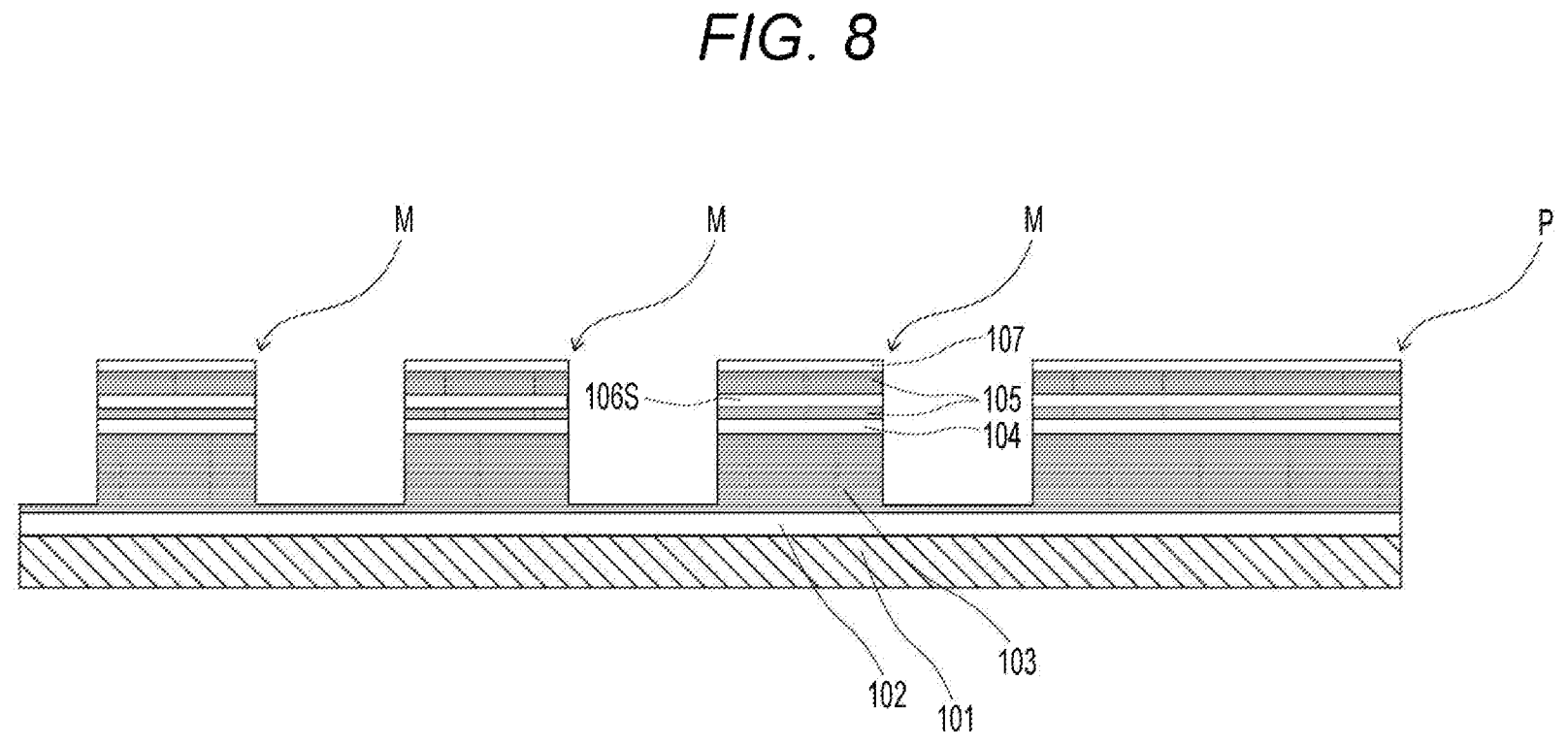

Specifically, the multilayer body L is etched to form a plurality of mesas M to be at least a part of the light emitting unit 100-1 (see FIGS. 6 to 8).

More specifically, first, a resist pattern is generated, which is for forming the plurality of mesas M arranged in a matrix in the XY two-dimensional direction and a plurality of pedestal portions P arranged in a line in the X direction, on the contact layer 107 of the multilayer body L. Next, the multilayer body L is etched (for example, wet etching using a sulfuric acid-based etchant) by using the resist pattern as a mask, to form the plurality of mesas M and a plurality of pedestal portions P. Here, etching is performed until a part (for example, more than half) of a side surface of the first multilayer film reflector 103 is exposed (so that an etching bottom surface is located in the first multilayer film reflector 103). Thereafter, the resist pattern is removed.

In the next step S3, the current constriction layer 106 is formed.

Figure 9:
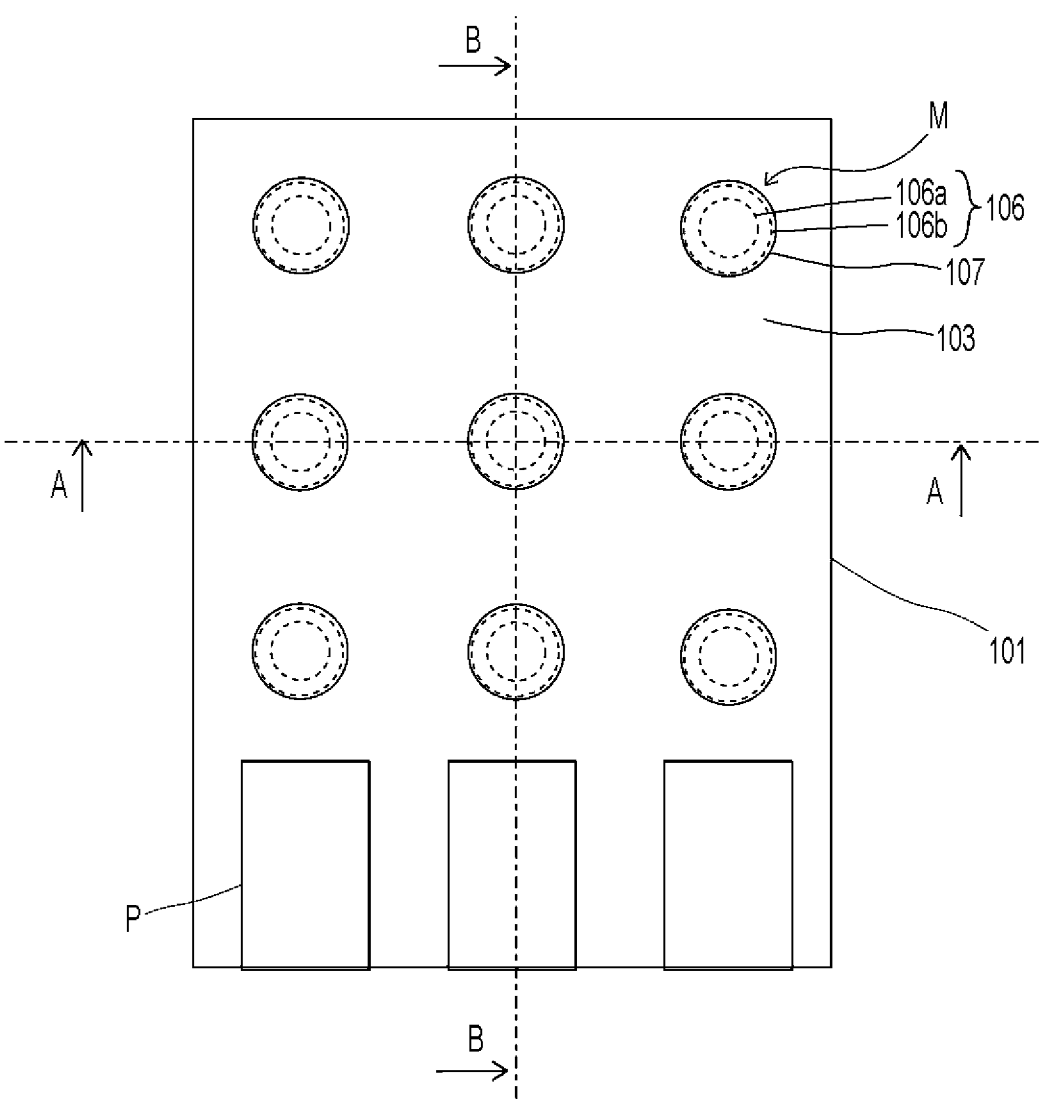
FIG. 9 is a third step view of the manufacturing method for the surface emitting laser device of FIG. 1.
Figure 10:
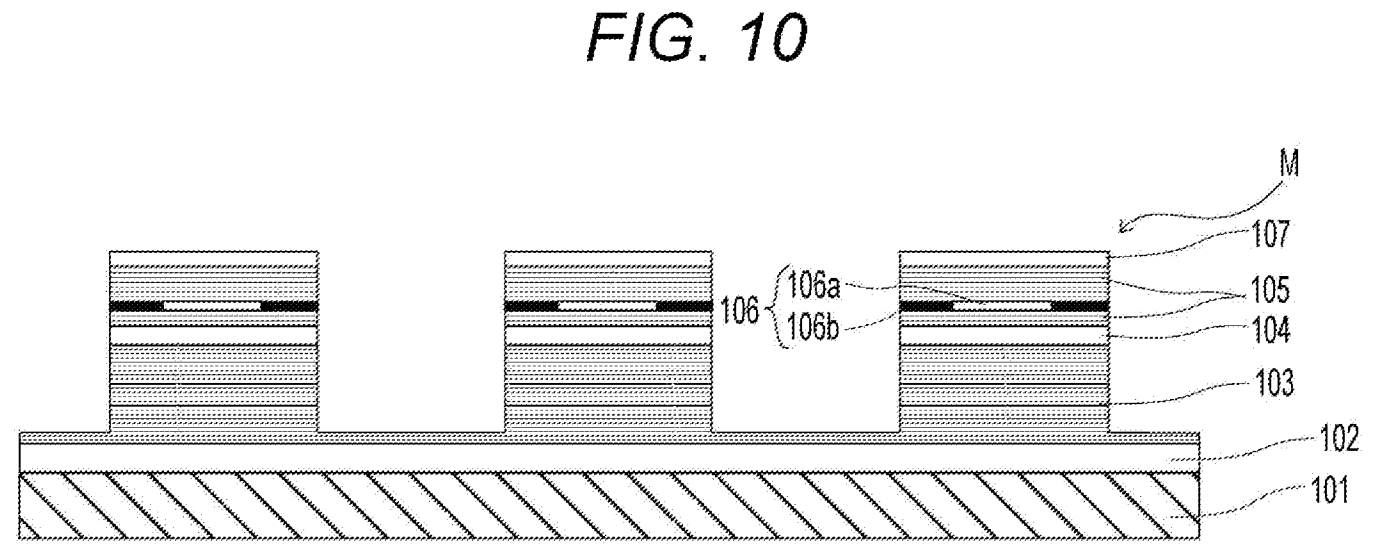
Figure 11:
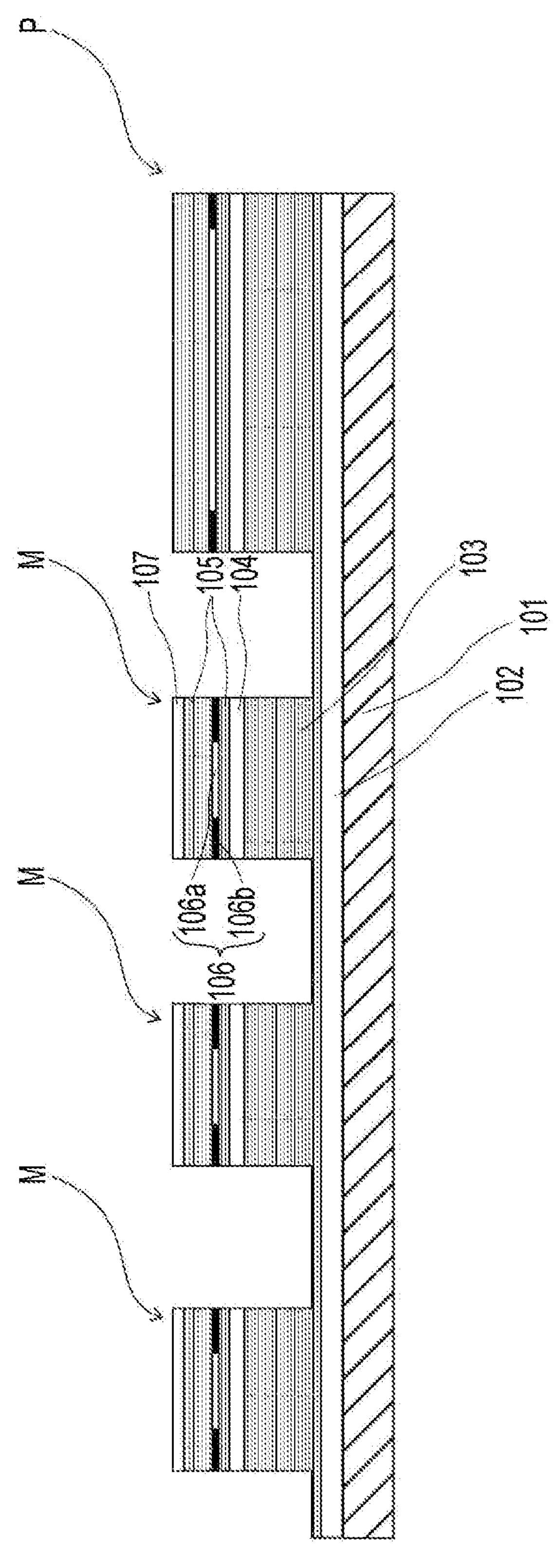
FIG. 11 is a cross-sectional view taken along line B-B in FIG. 9.

Specifically, a peripheral portion of the selectively oxidized layer 106S of each mesa M is oxidized to form the current constriction layer 106 (an oxide constriction layer) (see FIGS. 9 to 11).

Specifically, by exposing each mesa M to a water vapor atmosphere and oxidizing (selectively oxidizing) the selectively oxidized layer 106S from a side surface, the current constriction layer 106 is formed in which the non-oxidized area **106*a* is surrounded by the oxidized area 106*b*. At this time, an oxide constriction layer similar to the current constriction layer 106 is simultaneously formed also on the pedestal portion P (see FIG. 11**).

Figure 12:
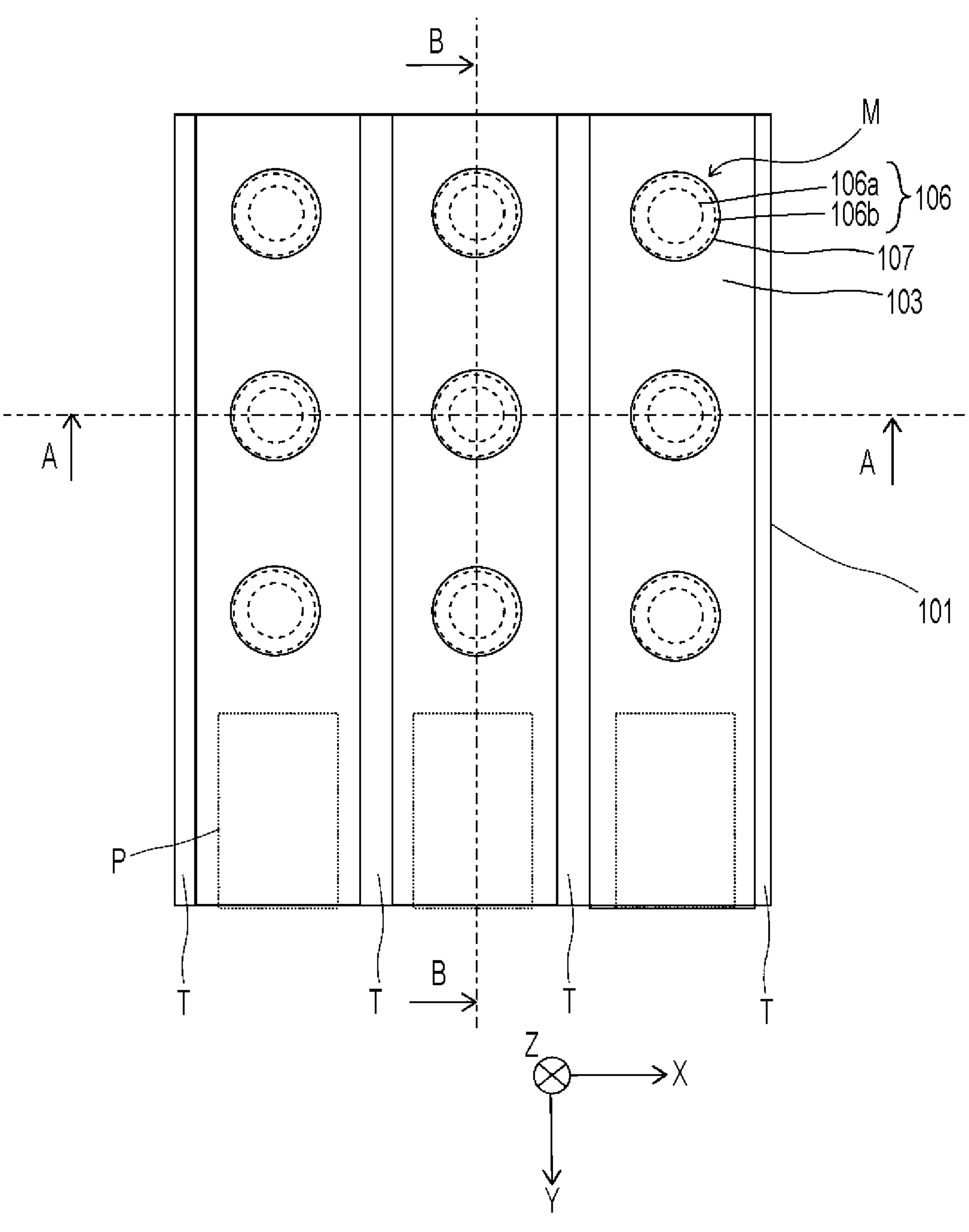
FIG. 12 is a fourth step view of the manufacturing method for the surface emitting laser device of FIG. 1.
Figure 13:
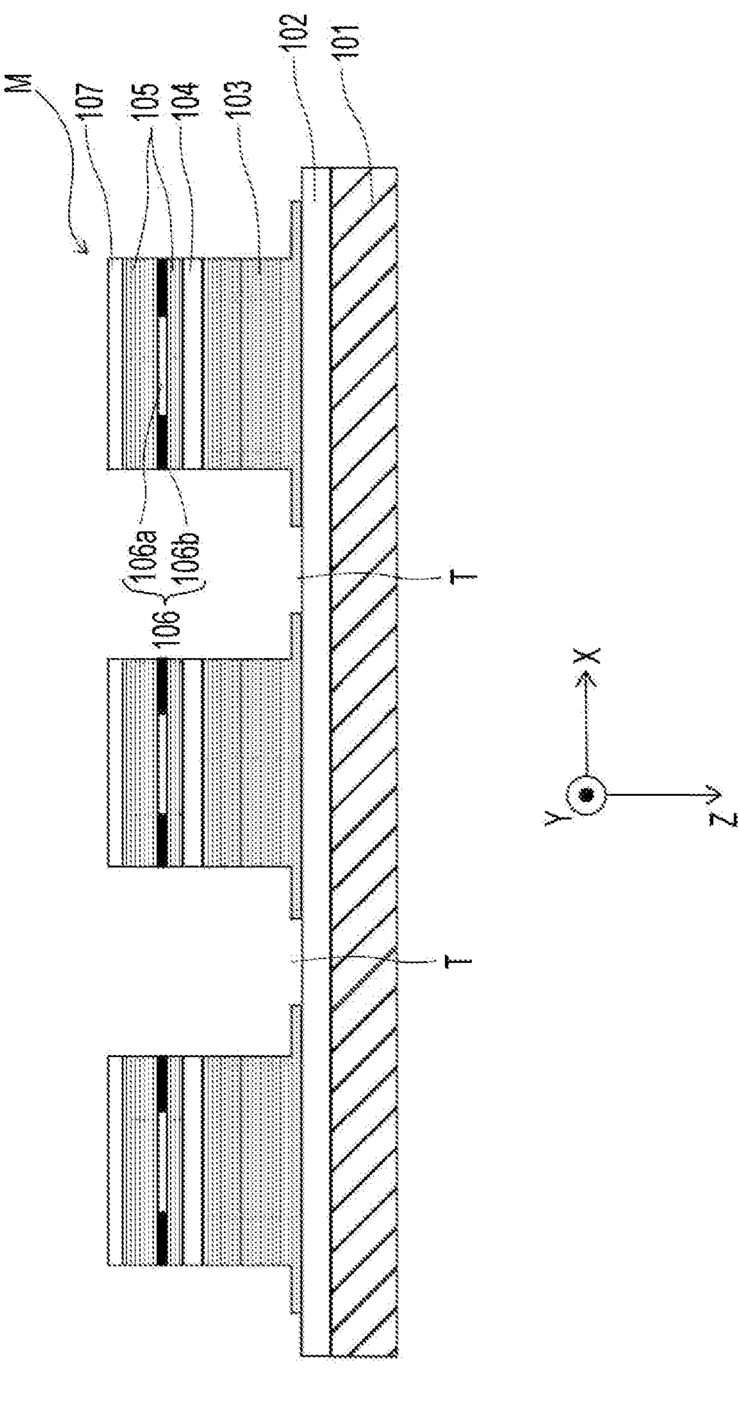
FIG. 13 is a cross-sectional view taken along line A-A of FIG. 12.
Figure 14:
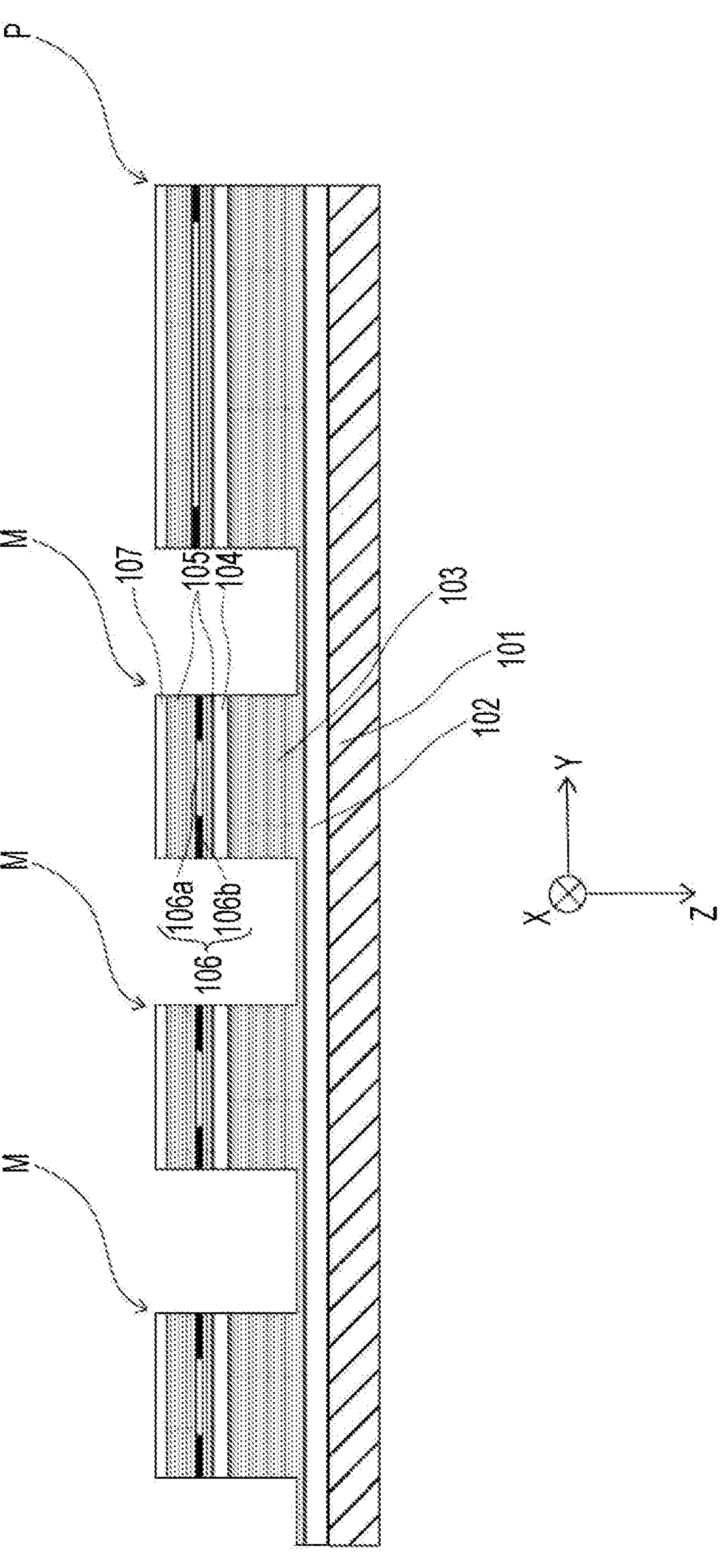
FIG. 14 is a cross-sectional view taken along line B-B in FIG. 12.

In the next step S4, a trench T (a groove) for separation of an element array (a mesa array) is formed. Specifically, by etching (for example, wet etching using a sulfuric acid-based etchant) and removing the first multilayer film reflector 103 (see FIG. 7) remaining between two adjacent mesa rows among a plurality of mesa rows aligned in the X direction and each including a plurality of mesas M aligned in the Y direction (the row direction), the trench T is formed between the two adjacent mesa rows (see FIGS. 12 to 14).

Figure 15:
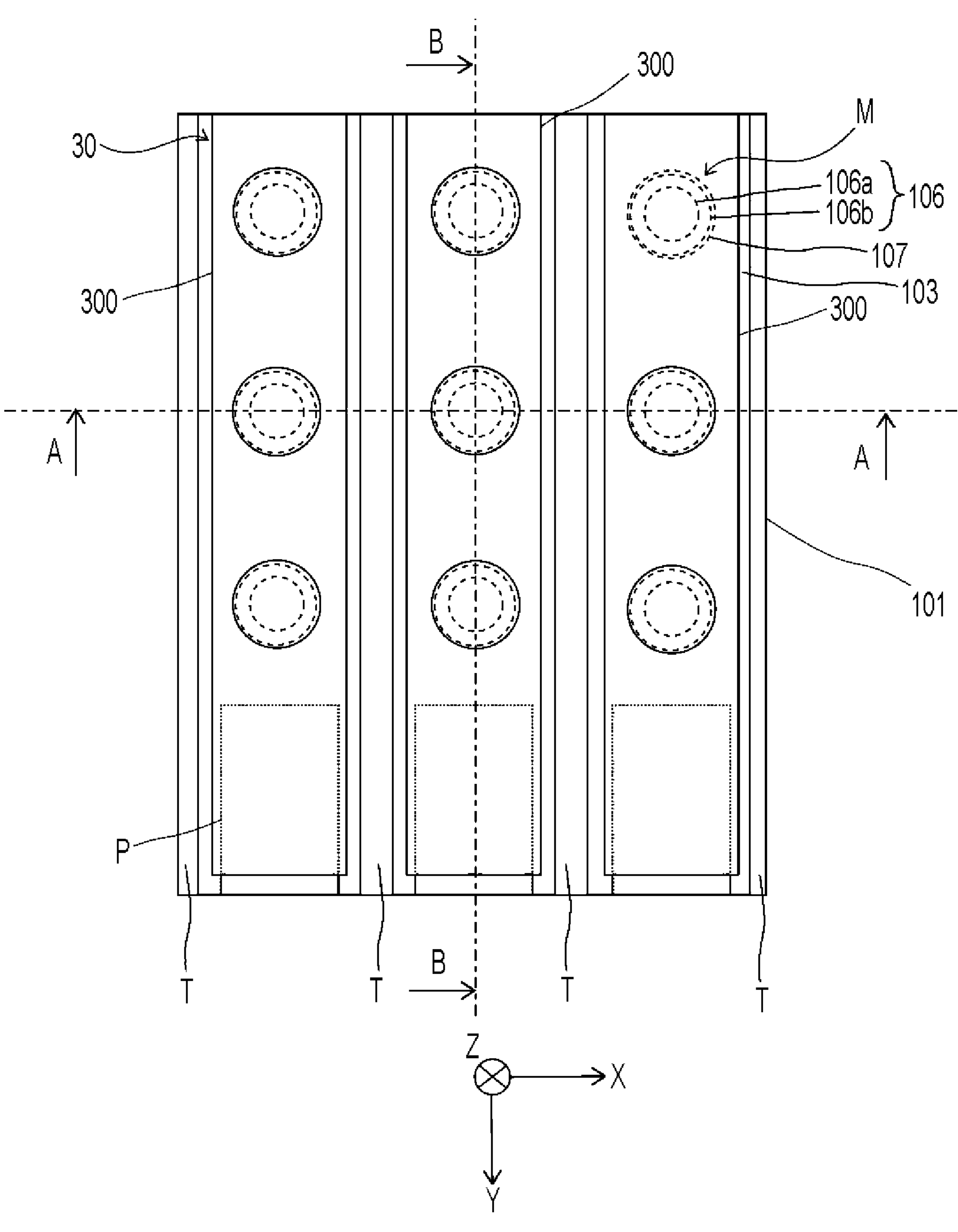
FIG. 15 is a fifth step view of the manufacturing method for the surface emitting laser device of FIG. 1.
Figure 16:
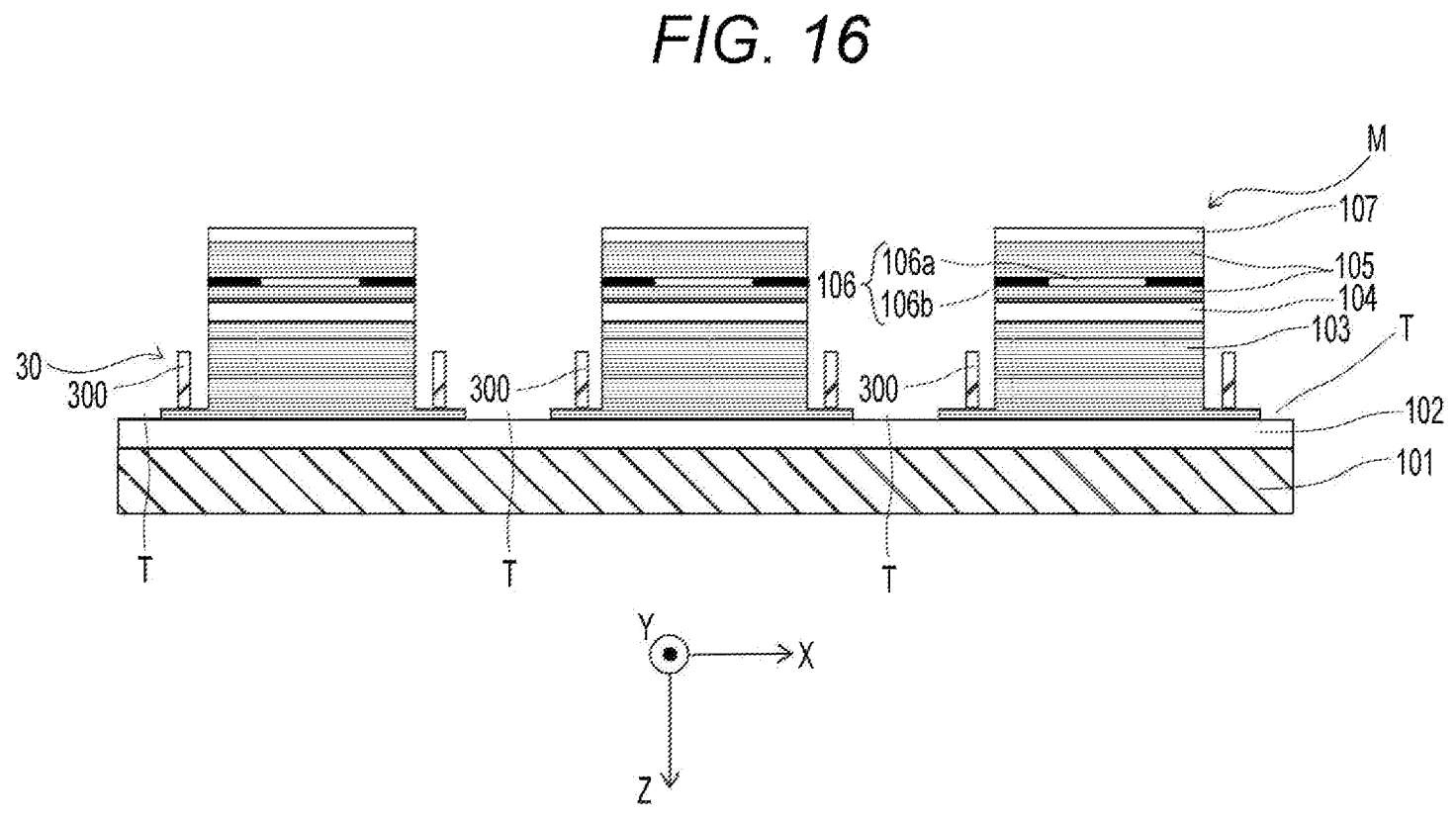
Figure 17:
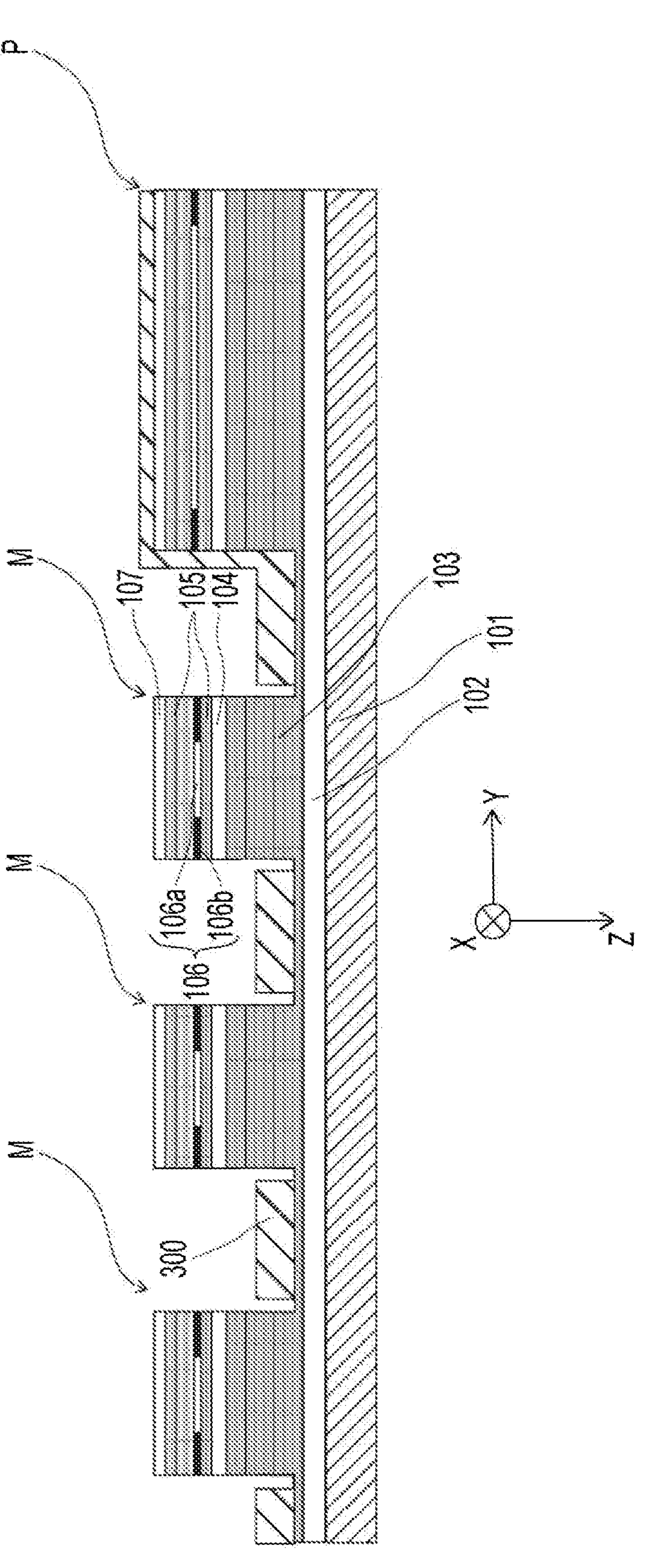
FIG. 17 is a cross-sectional view taken along line B-B in FIG. 15.

In the next step S5, the second wiring group 30 is formed. Specifically, a plurality of second wiring lines 300 extending in the Y direction and surrounding the plurality of mesas M in the mesa row described above is formed by a plating method (see FIGS. 15 to 17). Note that, before the plating method is used, it is preferable to form an underlayer to be a plating seed at a portion of the first multilayer film reflector 103 where the second wiring line 300 is to be formed by using, for example, vapor deposition, sputtering, or the like.

In the next step S6, the first electrode 108 is formed.

Figure 18:
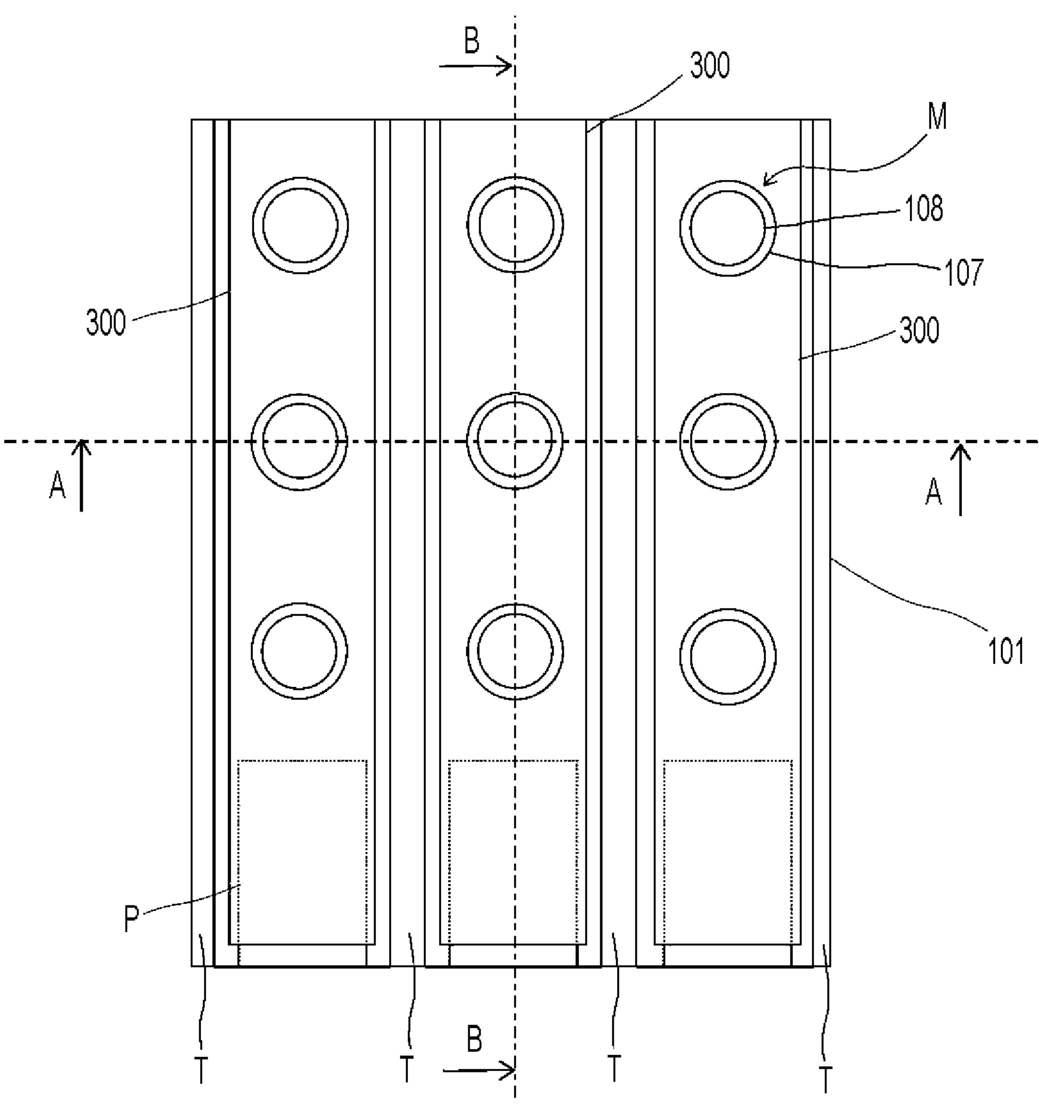
FIG. 18 is a sixth step view of the manufacturing method for the surface emitting laser device of FIG. 1.
Figure 19:
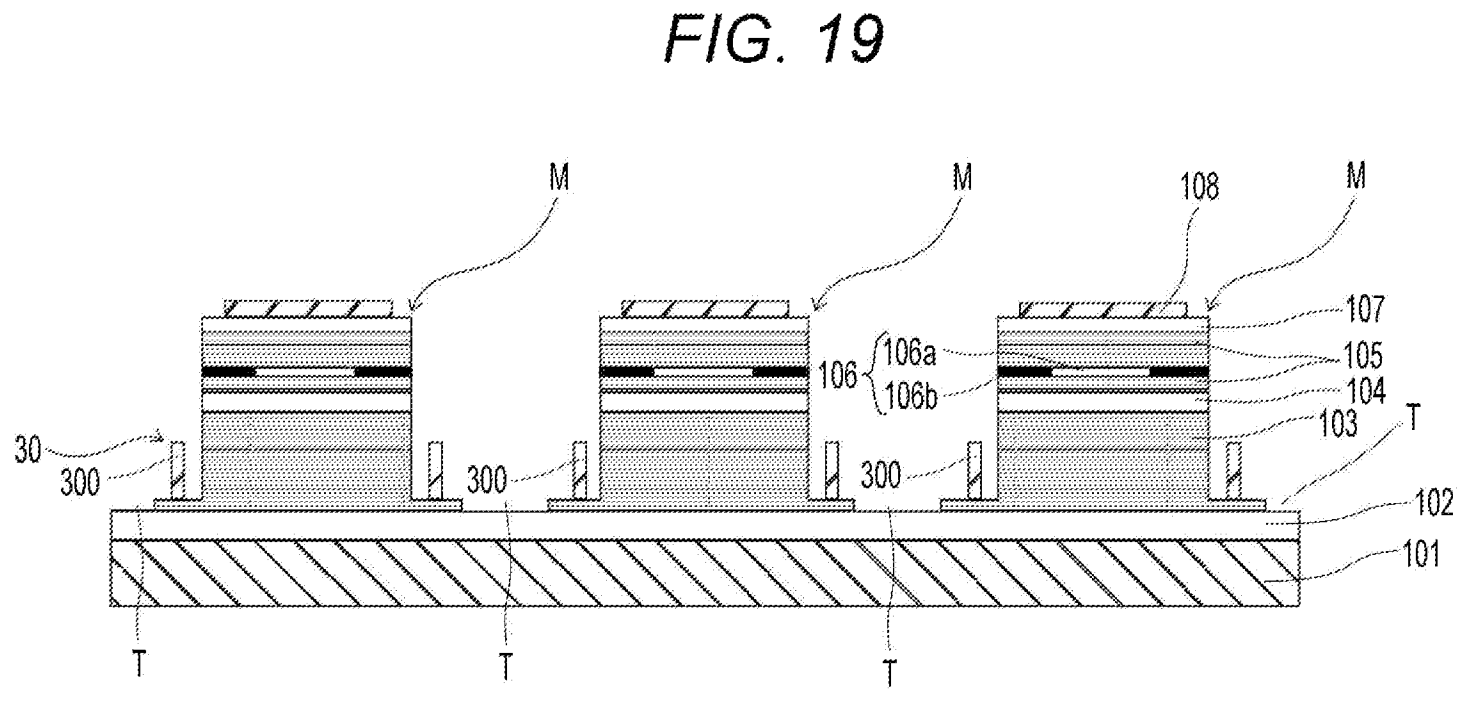
Figure 20:
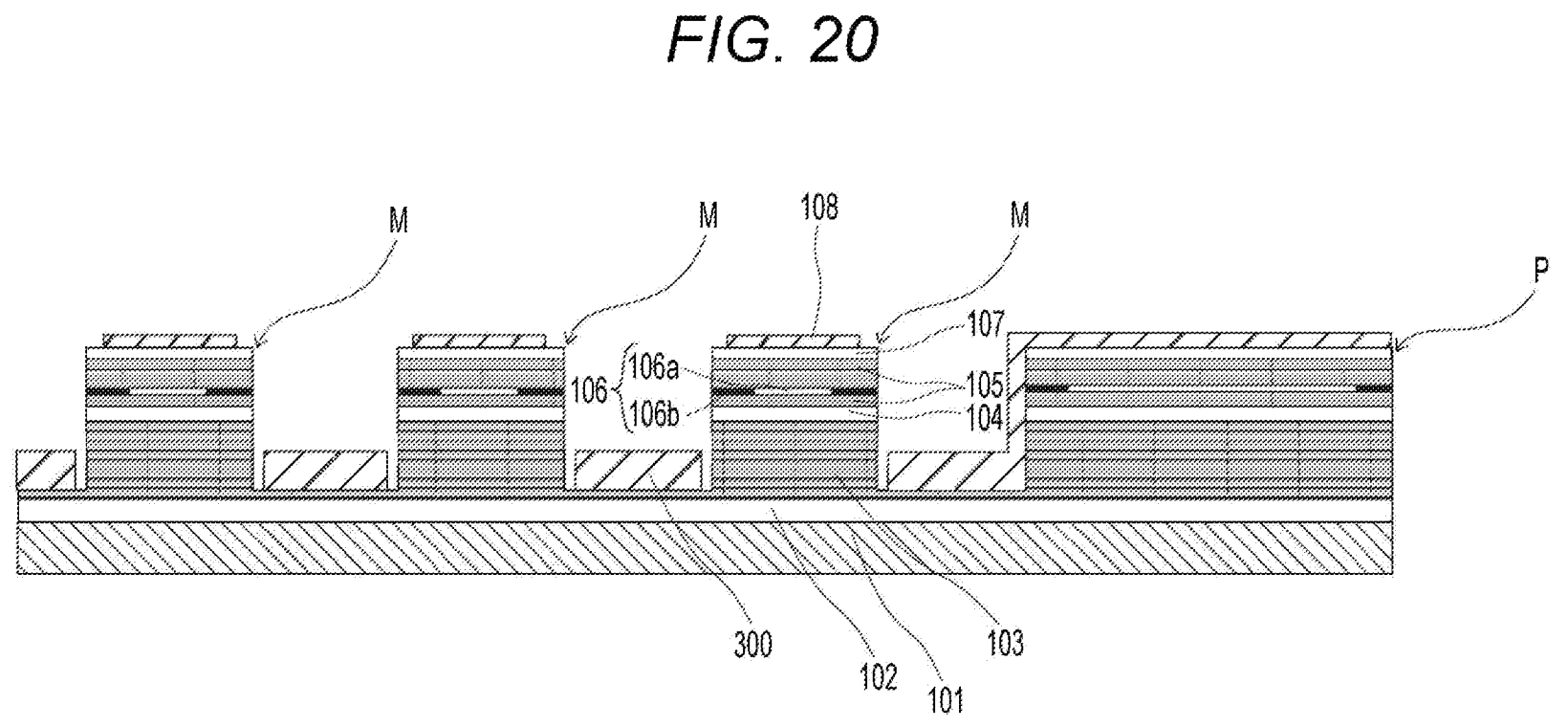
Figure 21:
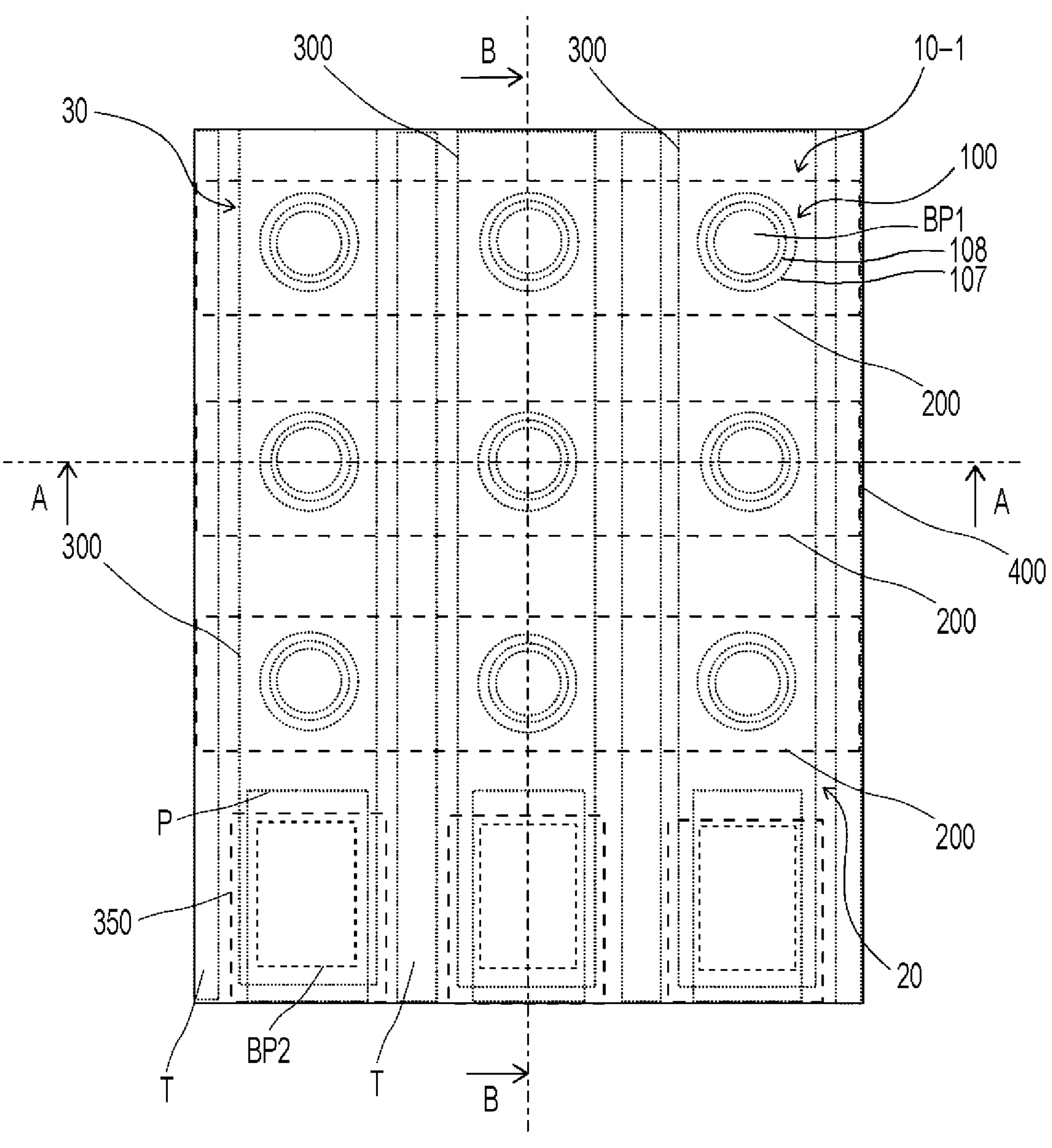
FIG. 21 is a seventh step view of the manufacturing method for the surface emitting laser device of FIG. 1.

Specifically, for example, an Au/Ti film to be a material of the first electrode 108 is formed on the contact layer 107 by, for example, an EB vapor deposition method (see FIGS. 18 to 20).

Thereafter, processing such as annealing, thinning by polishing a back surface of the wafer, and non-reflection coating on the back surface of the wafer is performed to form a plurality of surface emitting laser arrays 10-1 on one wafer. Thereafter, the plurality of surface emitting laser arrays 10-1 is separated into chips by dicing, and a plurality of surface emitting laser array chips is obtained.

In the next step S7, the surface emitting laser array chip including the surface emitting laser array 10-1 is joined by flip chip to a wiring board including the first wiring group 20 and the second board 400. Specifically, the first electrode 108 formed at the top portion of each mesa M of the surface emitting laser array 10-1 is joined to the corresponding first wiring line 200 formed on the second board 400 by junction down, and the second wiring line 300 (specifically, the second portion 300*b*) formed on each pedestal portion P is joined to the corresponding wiring line 350 formed on the second board 400 by junction down (see FIGS. 21 to 25).

Figure 22:
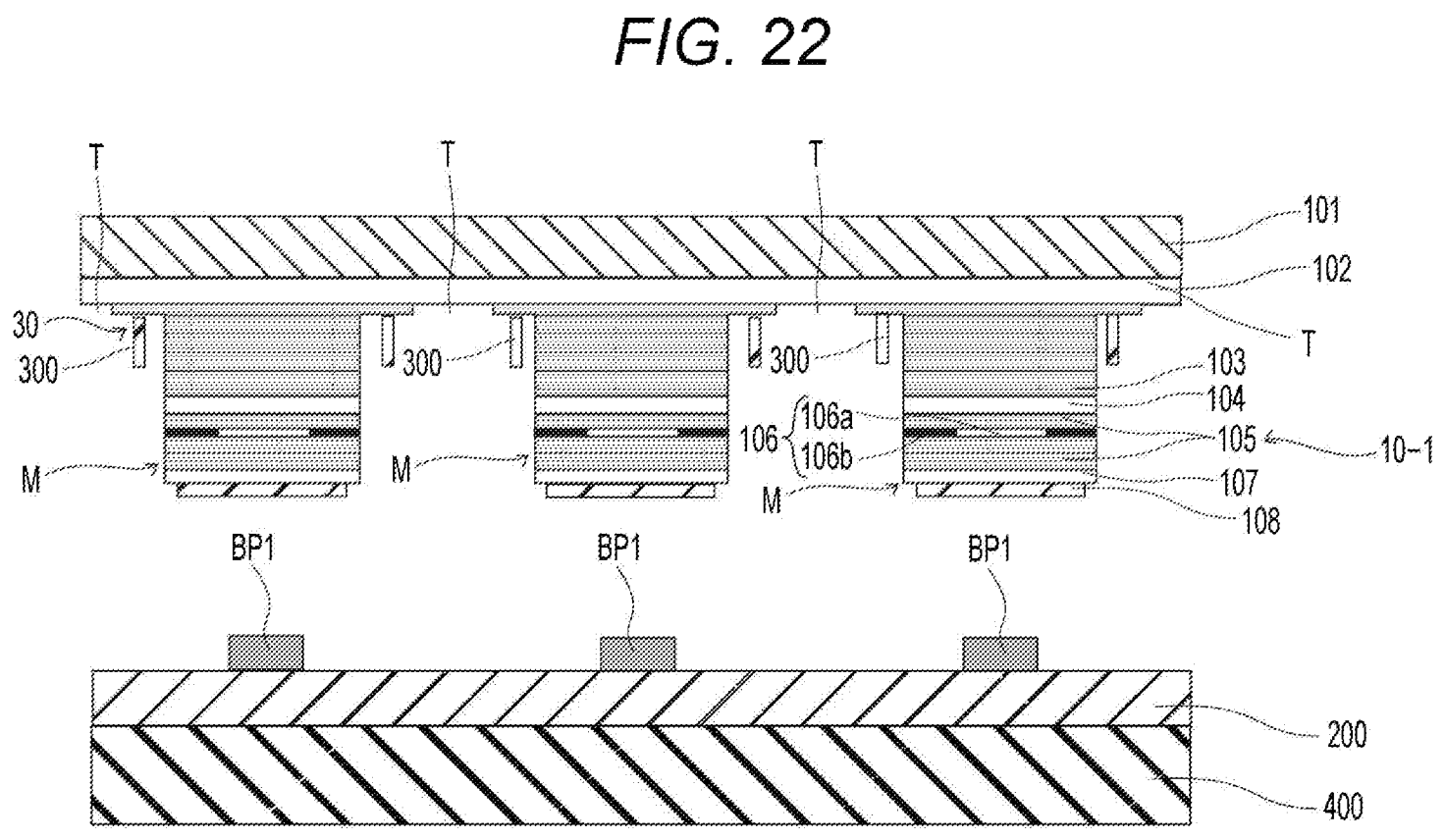
Figure 23:
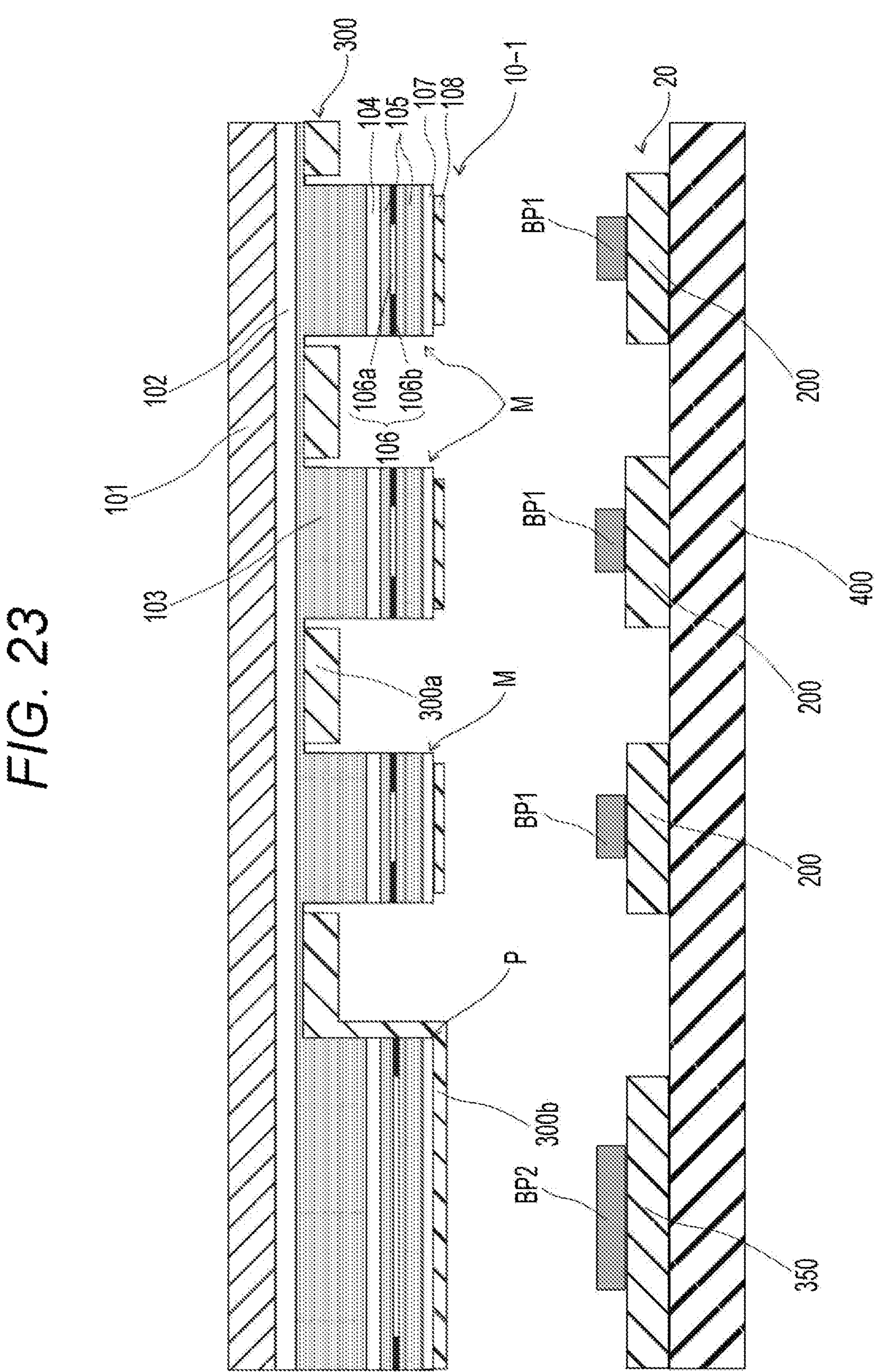
FIG. 23 is a cross-sectional view (before joining) taken along line B-B in FIG. 21.
Figure 24:
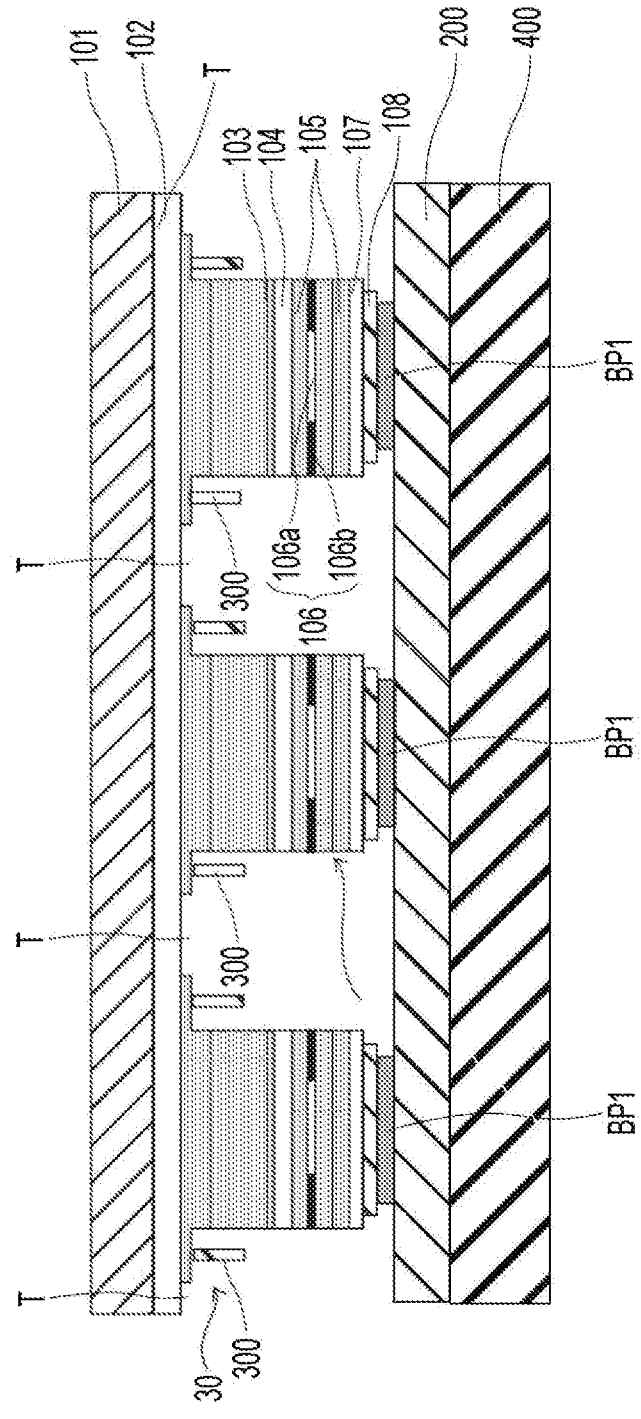
FIG. 24 is a cross-sectional view (after joining) taken along line A-A in FIG. 21.

More specifically, first, the first bump BP1 is attached to a region of each first wiring line 200 facing the first electrode 108 formed at a top portion of the corresponding mesa M (see FIGS. 22 and 23), and the bump BP2 is attached to a region of each wiring line 350 facing the second wiring line 300 (specifically, the second portion 300*b*) formed on the corresponding pedestal portion P (see FIG. 23). Note that, for example, in a case where the first bump BP1 and the second bump BP2 are solder paste, the solder paste is stirred in the cured state to be in the softened state in advance.

Next, the surface emitting laser array chip including the surface emitting laser array 10-1 and the wiring board including the first wiring group 20 and the second board 400 are positioned such that the mutually corresponding first electrode 108 and first bump BP1 face each other, and the mutually corresponding second wiring line 300 (specifically, the second portion 300*b*) and second bump BP2 face each other (see FIGS. 22 and 23). Thereafter, by pressing the surface emitting laser array chip against the wiring board under a predetermined temperature condition, the mutually corresponding first electrode 108 and first wiring line 200 are pressure-joined via the first bump BP1, and the mutually corresponding second wiring line 300 (specifically, the second portion 300*b*) and wiring line 350 are pressure-joined via the second bump BP2 (see FIGS. 24 and 25). Note that, for example, in a case where the plurality of first and second bumps BP1 and BP2 is solder paste, the solder paste is solidified by being left for a predetermined time from the end of stirring.

When step S7 is executed, the flow ends. As described above, the surface emitting laser device 1 is generated.

4. <Effect of Surface Emitting Laser Device and Manufacturing Method Thereof According to First Embodiment of Present Technology>

Hereinafter, effects of the surface emitting laser device 1 and a manufacturing method thereof according to the first embodiment of the present technology will be described.

The surface emitting laser device 1 according to the first embodiment of the present technology includes: the first wiring group 20 including the plurality of first wiring lines 200 insulated from each other; the second wiring group 30 including the plurality of second wiring lines 300 insulated from each other; the first board 101 formed with the plurality of light emitting units 100-1 electrically connected to any one of the plurality of first wiring lines 200 and electrically connected to any one of the plurality of second wiring lines 300; and the second board 400 facing the first board 101 and formed with the first wiring group 20.

In this case, the first wiring group 20 is formed on the second board 400 that is a board different from the first board 101 on which the plurality of light emitting units 100-1 is formed.

As a result, since the second board 400 has a sufficient installation space for the wiring lines, a cross-sectional area of each first wiring line 200 of the first wiring group 20 can be sufficiently increased.

As a result, according to the surface emitting laser device 1 of the first embodiment, it is possible to provide the surface emitting laser device capable of reducing resistance.

Figure 26:
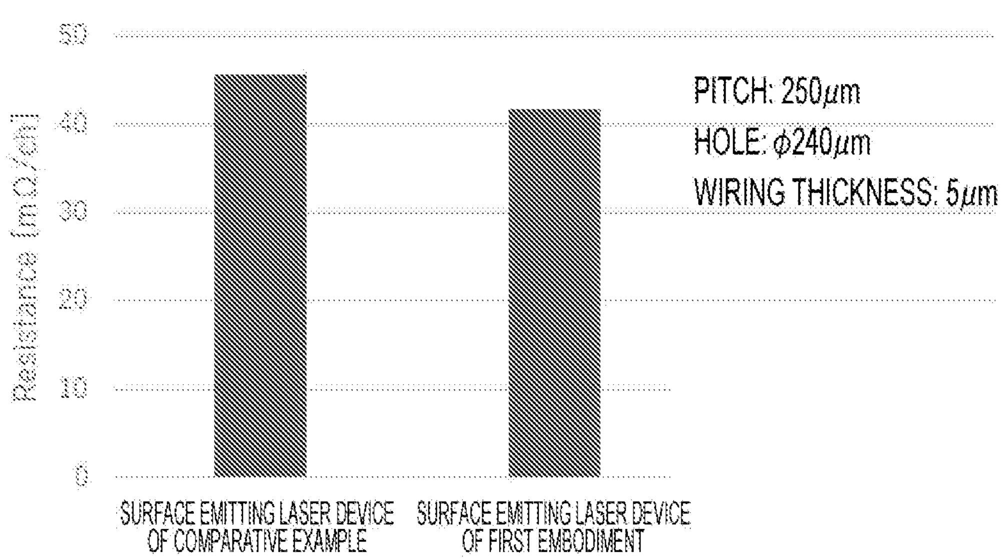
FIG. 26 is a graph illustrating wiring resistance between channels of a surface emitting laser device of a comparative example and the surface emitting laser device of FIG. 1.

For example, as illustrated in FIG. 26, in the surface emitting laser device 1 of the first embodiment in which the first wiring group 20 is formed on the second board 400 and the second wiring group 30 is formed on the first board 101, it has been found that wiring resistance between channels (between the light emitting units) is reduced by approximately 9% as compared with a surface emitting laser device of a comparative example in which both the first wiring group and the second wiring group are formed on the first board. A graph of FIG. 26 shows results obtained under conditions that a pitch between the channels is 250 μm, a hole is φ 240 μm, and a thickness of each first wiring line and each second wiring line is 5 μm. Note that, the term "hole" as used herein refers to an absent region of a wiring electrode provided at a location corresponding to a mesa portion of the surface emitting laser so as not to interfere with the mesa.

In the surface emitting laser device 1, the second wiring group 30 is formed on the first board 101, and the first wiring group 20 is not formed. Therefore, as compared with a case where the first wiring group 20 and the second wiring group 30 are formed on the first board 101, for example, a cross-sectional area of each of the second wiring lines 200 of the second wiring group 30 can be sufficiently increased, and eventually, the resistance can be reduced.

Each of the plurality of light emitting units 100-1 is joined to the corresponding first wiring line 200 of the first wiring group 20, which is one wiring group formed on the second board 400 among the first wiring group 20 and the second wiring group 30. As a result, as compared with a case where each of the plurality of light emitting units 100-1 and the corresponding first wiring line 200 are connected by wire bonding, for example, the self-inductance of the first wiring line 200 can be reduced by, for example, about 2 nH.

Each of the plurality of light emitting units 100-1 has the mesa M protruding on the second board 400 side, the first wiring group 20 is provided on the second board 400, the second wiring group 30 is provided on the first board 101, the first electrode 108 provided at the top portion of the mesa M of each of the plurality of light emitting units 100-1 is joined via the first bump BP to the first wiring line 200 corresponding to the light emitting unit 100-1, and each of the plurality of second wiring lines 300 is joined via the second bump BP2 to the wiring line 350 provided on the second board 400 and corresponding to the second wiring line 300. As a result, it is possible to stably conduct each light emitting unit 100-1 and the corresponding first wiring line 200 and wiring line 350 while reducing the resistance.

Each of the plurality of second wiring lines 300 has the first portion 300*a* provided along the first board 101 and the second portion 300*b* provided along the pedestal portion P provided on the first board 101, and the second portion 300*b* of each of the second wiring line 300 is joined to the corresponding wiring line 350 via the second bump BP2. As a result, for example, the first board 101 and the second board 400 can be joined in a state where parallelism is increased, and eventually, variation in voltage drop between the light emitting units 100-1 can be suppressed.

A total of the number of the plurality of first wiring lines 200 and the number of the plurality of second wiring lines 300 is less than twice the number of the light emitting units 100-1. As a result, since a large space can be secured for each wiring line, a cross-sectional area of the wiring line can be increased, and the resistance can be reduced.

The light emitting unit 100-1 has a layered structure in which the first multilayer film reflector 103, the active layer 104, and the second multilayer film reflector 105 are layered on the first board 101 in this order from the first board 101 side. As a result, the light emitting unit 100-1 can function as a laser resonator.

Both the first wiring group 20 and the second wiring group 30 are connected to an electronic circuit (for example, a laser driver). As a result, each light emitting unit 100-1 can be independently controlled (turned on/off).

A manufacturing method for the surface emitting laser device 1 includes: a step of forming a plurality of light emitting units 100-1 on the first board 101; and a step of joining each of the plurality of light emitting units 100-1 and the corresponding first wiring line 200 of the wiring group 20 that is formed on the second board 400 and includes the plurality of first wiring lines 200 insulated from each other. In this case, since the first wiring line 200 having a large cross-sectional area can be formed, it is possible to manufacture the surface emitting laser device 1 capable of reducing the resistance.

Hereinafter, a surface emitting laser device according to another embodiment of the present technology will be described. In another embodiment, differences from the surface emitting laser device 1 of the first embodiment described above will be mainly described, and members having a configuration similar to those of the members constituting the surface emitting laser 1 will be denoted by the same reference numerals, and a detailed description thereof will be omitted.

5. <Configuration of Surface Emitting Laser Device According to Second Embodiment of Present Technology>

Hereinafter, a surface emitting laser device 2 according to a second embodiment of the present technology will be described with reference to FIGS. 27 to 29.

Figure 27:
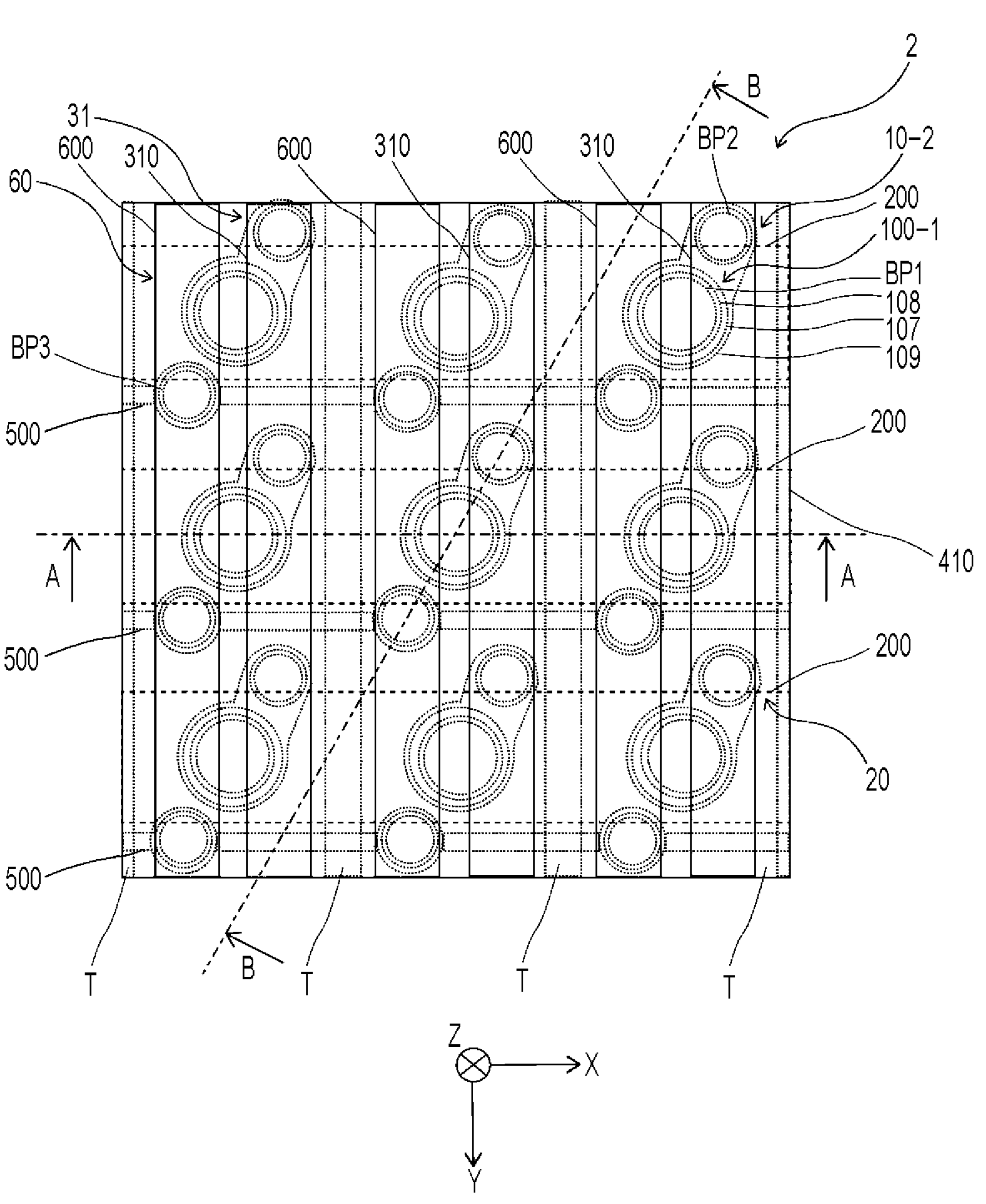
FIG. 27 is an extracted plan view illustrating a part of a surface emitting laser device according to a second embodiment of the present technology.

FIG. 27 is an extracted plan view illustrating a part of the surface emitting laser device 2 according to the second embodiment of the present technology. FIG. 28 is a cross-sectional view taken along line A-A in FIG. 27. FIG. 29 is a cross-sectional view taken along line B-B in FIG. 27.

Figure 28:
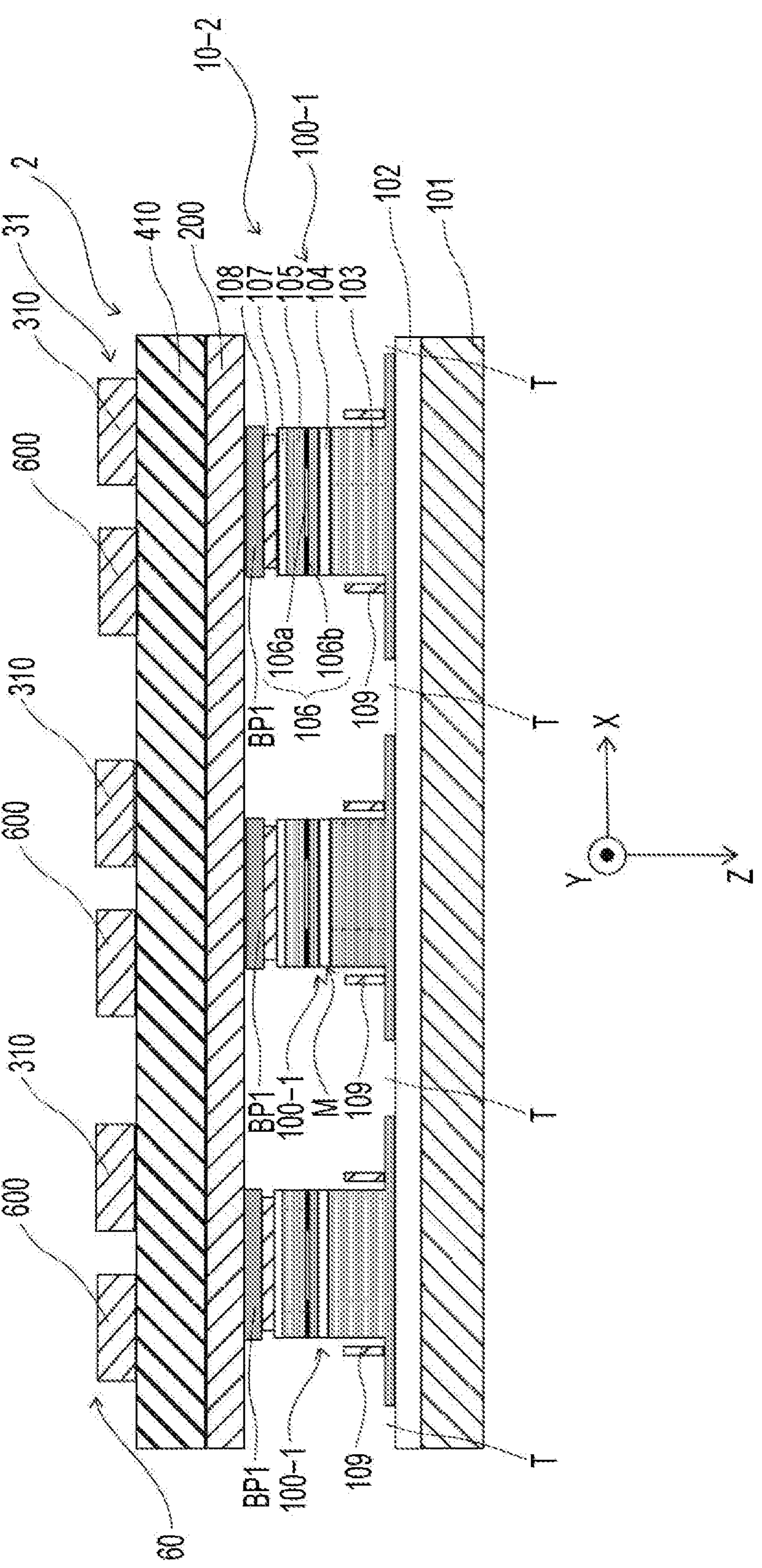
FIG. 28 is a cross-sectional view taken along line A-A of FIG. 27.
Figure 29:
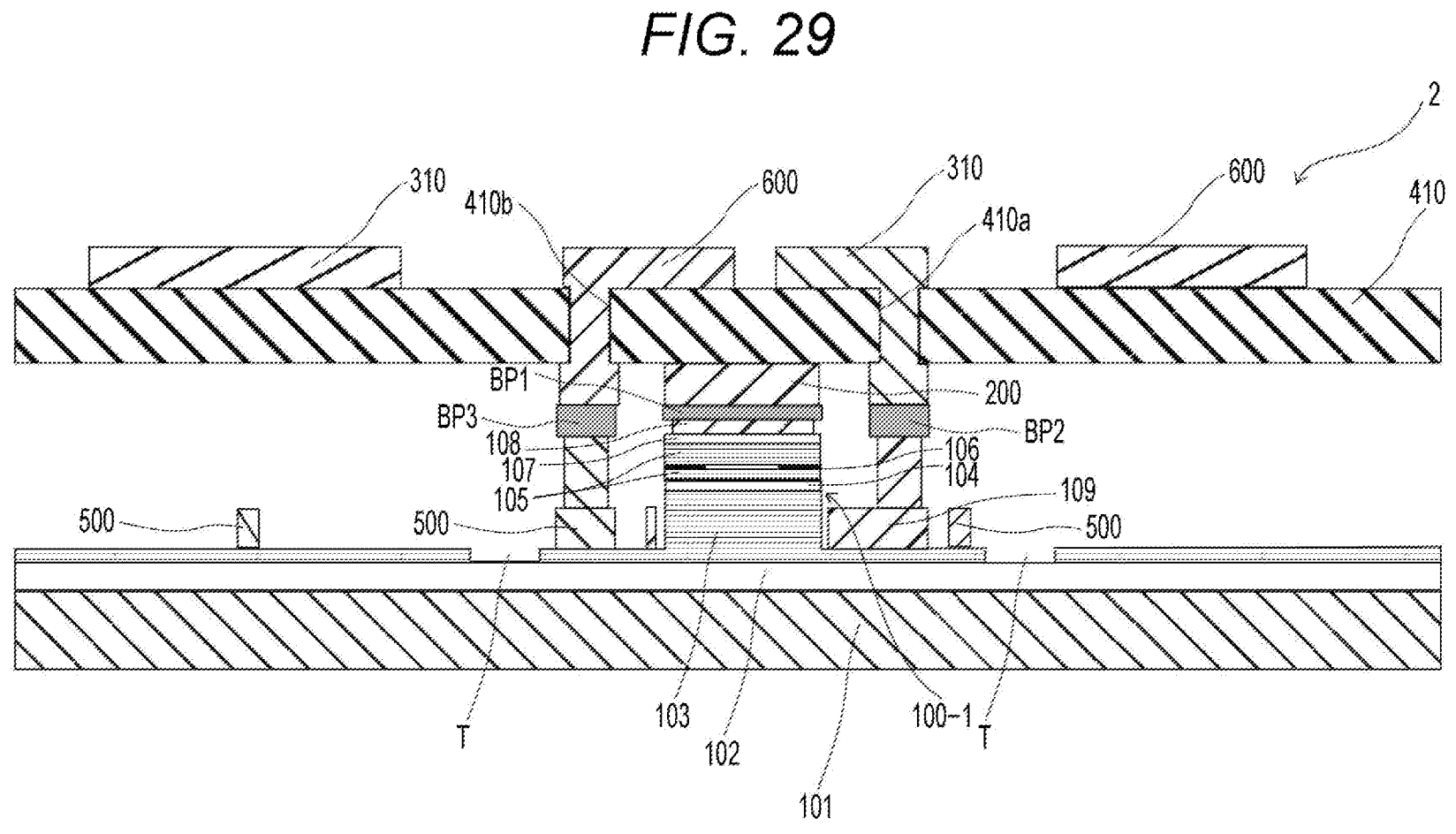

As illustrated in FIGS. 27 to 29, the surface emitting laser device 2 is different from the surface emitting laser device 1 in that a second wiring group 31 and a third wiring group 60 are formed on a second board 410, a plurality of second electrodes 109 and a plurality of conductors 500 are provided on a first board 101, and a pedestal portion P is not provided.

More specifically, in the surface emitting laser device 2, as an example, a first wiring group 20 is formed on a surface of the second board 410 on the first board 101 side, the second wiring group 31 including a plurality of second wiring lines 310 insulated from each other is formed on the second board 410.

The second board 410 is a board containing an insulating material (for example, AlN). AlN (aluminum nitride) has characteristics such as excellent thermal conductivity, high electrical insulation, and a thermal expansion coefficient close to that of silicon. A material of the second wiring line 310 is similar to a material of the second wiring line 300 of the surface emitting laser device 1.

In a surface emitting laser array 10-2 of the surface emitting laser device 2, as an example, a plurality of second electrodes 109 is provided individually corresponding to a plurality of light emitting units 100-1. As an example, each second electrode 109 is formed so as to surround the corresponding light emitting unit 100-1 on the first board 101. As an example, each second electrode 109 is a cathode electrode (an electrode that allows a current to flow out from the light emitting unit 100-1) electrically conducted to the corresponding light emitting unit 100-1.

More specifically, as an example, as illustrated in FIGS. 27 to 29, each second electrode 109 is erected on a first multilayer film reflector 103 around the corresponding light emitting unit 100-1.

As an example, the plurality of second wiring lines 310 is provided individually corresponding to a plurality of Y light emitting unit groups aligned in the X axis direction and each including a plurality of light emitting units 100-1 aligned in the Y direction. As illustrated in FIG. 29, each second wiring line 310 extends in the Y direction as an example, and is joined via a second bump BP2 to the second electrode 109 electrically conducted to each light emitting unit 100-1 of the corresponding Y light emitting unit group.

As an example, as illustrated in FIG. 29, each second wiring line 310 has a structure (a double-sided wiring structure) in which a wiring line formed on a surface of the second board 410 on the first board 101 side is connected to a wiring line formed on a surface of the second board 410 on a side opposite to the first board 101 side by a via wiring line passing through a through hole **410*a* formed in the second board 410**.

As an example, the plurality of conductors 500 is provided individually corresponding to a plurality of X light emitting unit groups aligned in the Y direction and each including plurality of light emitting units 100-1 aligned in the X direction.

Each conductor 500 may be a metal or an alloy. Specifically, each conductor 500 may contain, for example, at least one type of metal (including an alloy) selected from a group including Au, Ag, Pd, Pt, Ni, Ti, V, W, Cr, Al, Cu, Zn, Sn, and In.

Each conductor 500 may be a semiconductor containing impurities. Specifically, each conductor 500 may include a semiconductor in which impurities functioning as a donor or an acceptor, such as Si, Te, C, Zn, Sn, and Be, for example, are added to a compound semiconductor such as GaAs, AlGaAs, or InGaAs at a concentration of, for example, $10^{18}$ $cm^{-1}$ or more.

Each conductor 500 is insulated from both the first wiring group 20 and the second wiring group 31. That is, each conductor 500 is insulated from all first wiring lines 200 and all second wiring lines 310.

As an example, the plurality of conductors 500 each extends in the X direction, and is arranged at substantially equal intervals in the Y direction.

Each conductor 500 is formed so as to extend in the X direction along at least a part of a second electrode group including a plurality of second electrodes 109 electrically conducted individually to a plurality of light emitting units 100-1 of a corresponding X light emitting unit group and at least a part of the first wiring line 200 corresponding to the X light emitting unit group. As a result, a closed loop is formed between each conductor 500 and at least a part of the corresponding second electrode group and between each conductor 500 and at least a part of the corresponding first wiring line 200, so that reduction in resistance can be promoted.

More specifically, as an example, as illustrated in FIGS. 27 and 29, each conductor 500 is erected on the first multilayer film reflector 103 around each light emitting unit 100-1 of the corresponding X light emitting unit group. Each conductor 500 is disposed at a position facing the second electrode 109 electrically conducted to the corresponding light emitting unit 100-1 via the light emitting unit 100-1.

As an example, as illustrated in FIGS. 27 and 29, the plurality of third wiring lines 600 is provided corresponding to the plurality of conductors 500. Each third wiring line 600 extends in the Y direction as an example, and is joined to the corresponding conductor 500 via a third bump BP3.

As an example, each third wiring line 600 has a structure (a double-sided wiring structure) in which a wiring line formed on a surface of the second board 410 on the first board 101 side is connected to a wiring line formed on a surface of the second board 410 on a side opposite to the first board 101 side by a via wiring line passing through a through hole 410*b* formed in the second board 410.

Each third wiring line 600 is connected to a reference potential (for example, ground). As a result, each conductor 500 is connected to the reference potential (for example, ground).

6. <Manufacturing Method for Surface Emitting Laser Device According to Second Embodiment of Present Technology>

Hereinafter, with reference to the flowchart of FIG. 30, a manufacturing method for the surface emitting laser device 2 according to the second embodiment will be described.

As a rough flow of the manufacturing method for the surface emitting laser device 2, by a semiconductor manufacturing method using a semiconductor manufacturing device, a plurality of surface emitting laser arrays 10-2 is simultaneously generated on one wafer that is a base material of the board 101. Next, the plurality of continuous and integrated surface emitting laser arrays 10-2 is separated from each other by dicing, to obtain a plurality of chip-shaped surface emitting laser arrays 10-2 (hereinafter also referred to as "surface emitting laser array chips"). Thereafter, the surface emitting laser array chip is joined to the second board 400, and the surface emitting laser device 2 is obtained.

In the first step S11, a multilayer body L is generated. Specifically, the multilayer body L is generated by layering a buffer layer 102, the first multilayer film reflector 103, an active layer 104, a second multilayer film reflector 105 including a selectively oxidized layer 106S therein, and a contact layer 107 in this order on the board 101 by using a chemical vapor deposition (CVD) method, for example, a metal organic chemical vapor deposition (MOCVD) method (see FIG. 5).

In the next step S12, a mesa M is formed.

Figure 31:
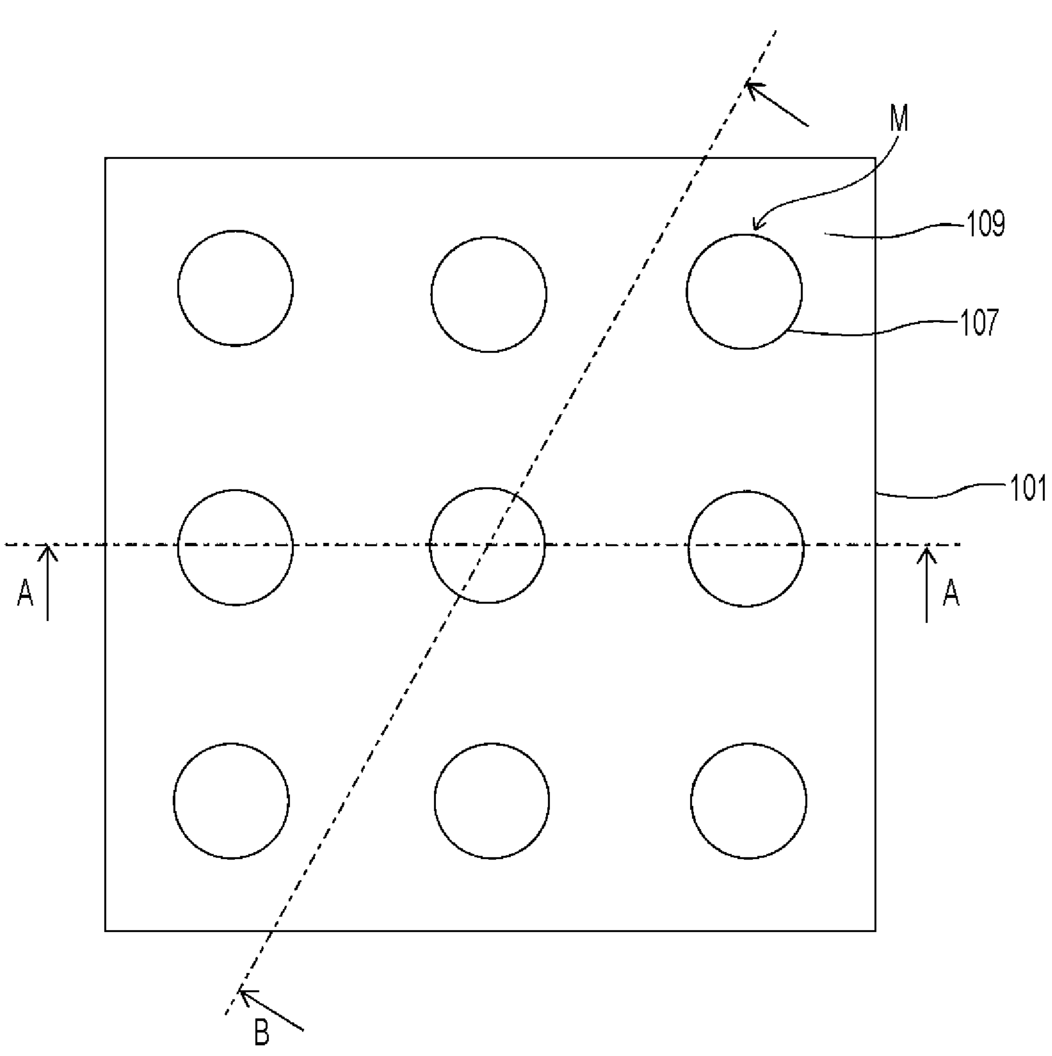
FIG. 31 is a second step view of the manufacturing method for the surface emitting laser device of FIG. 27.
Figure 32:
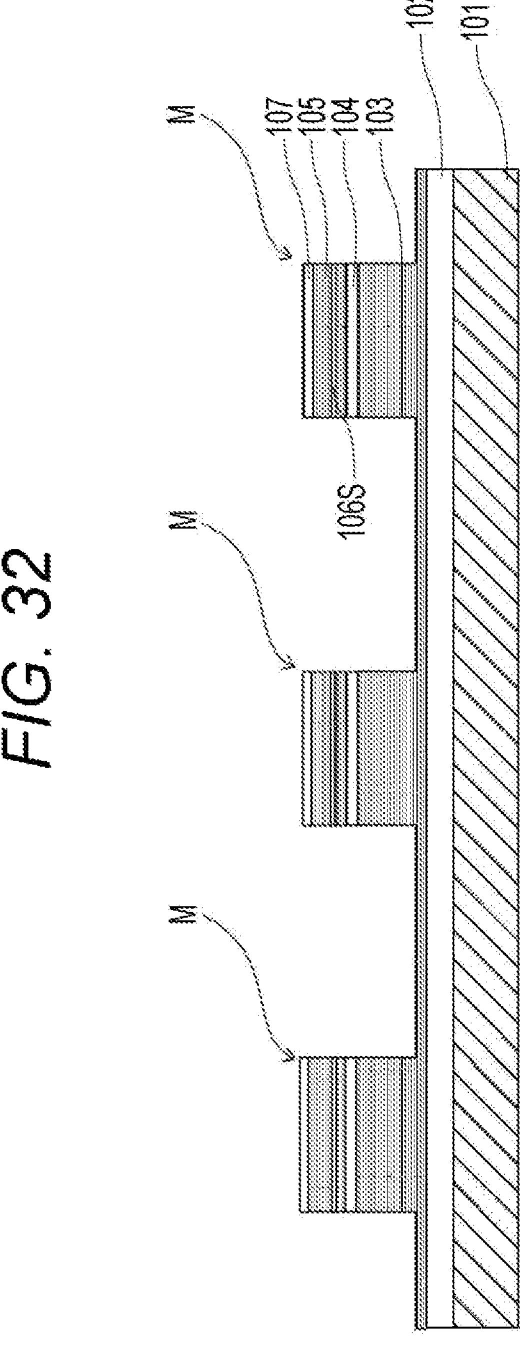
FIG. 32 is a cross-sectional view taken along line A-A of FIG. 31.
Figure 33:
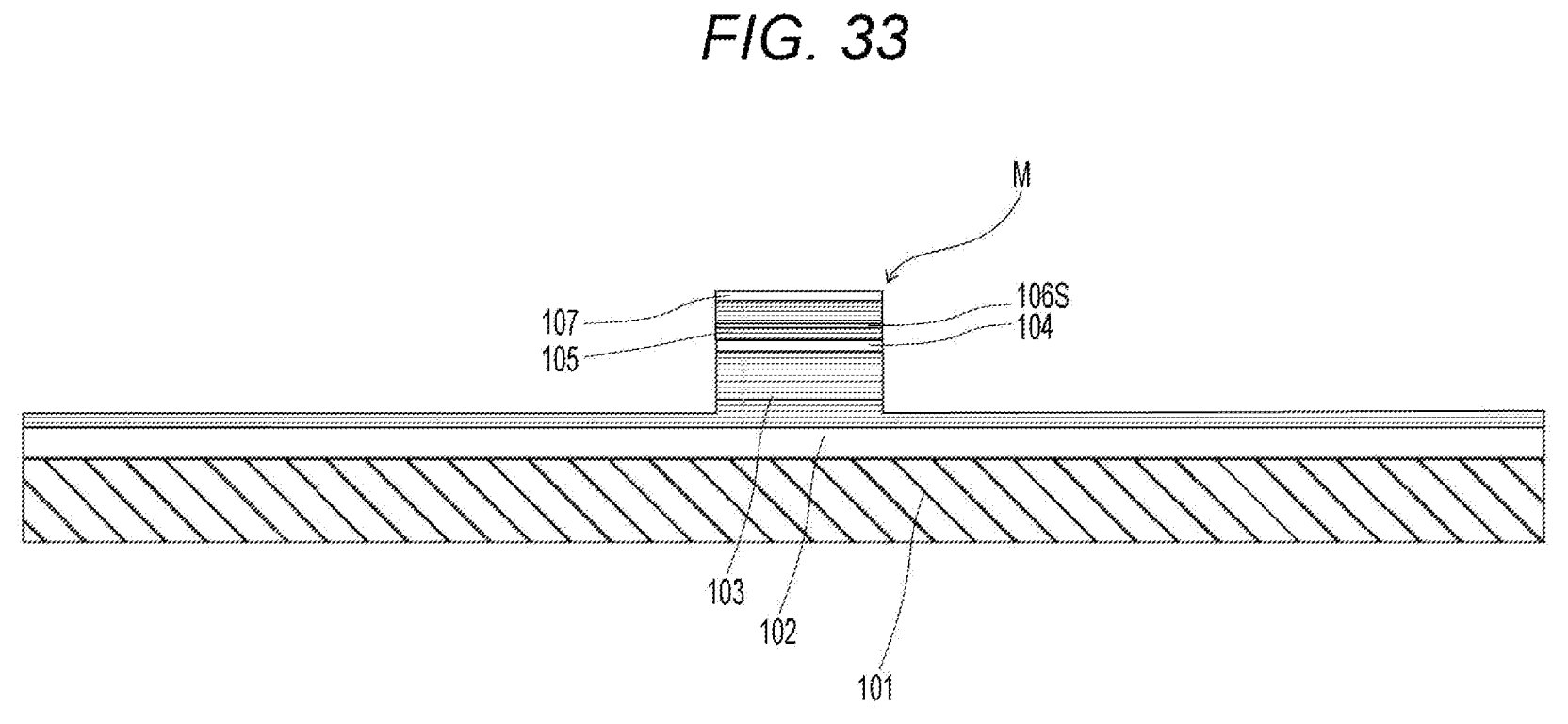

Specifically, the multilayer body L is etched to form a plurality of mesas M to be at least a part of the light emitting unit 100-1 (see FIGS. 31 to 33).

More specifically, first, a resist pattern is generated, which is for forming the plurality of mesas M arranged in an XY matrix on the contact layer 107 of the multilayer body L. Next, a plurality of mesas M is formed by etching (for example, wet etching using a sulfuric acid-based etchant) the multilayer body L by using the resist pattern as a mask. Here, etching is performed until a part (for example, more than half) of a side surface of the first multilayer film reflector 103 is exposed (so that an etching bottom surface is located in the first multilayer film reflector 103). Thereafter, the resist pattern is removed.

In the next step S13, a current constriction layer 106 is formed.

Figure 34:
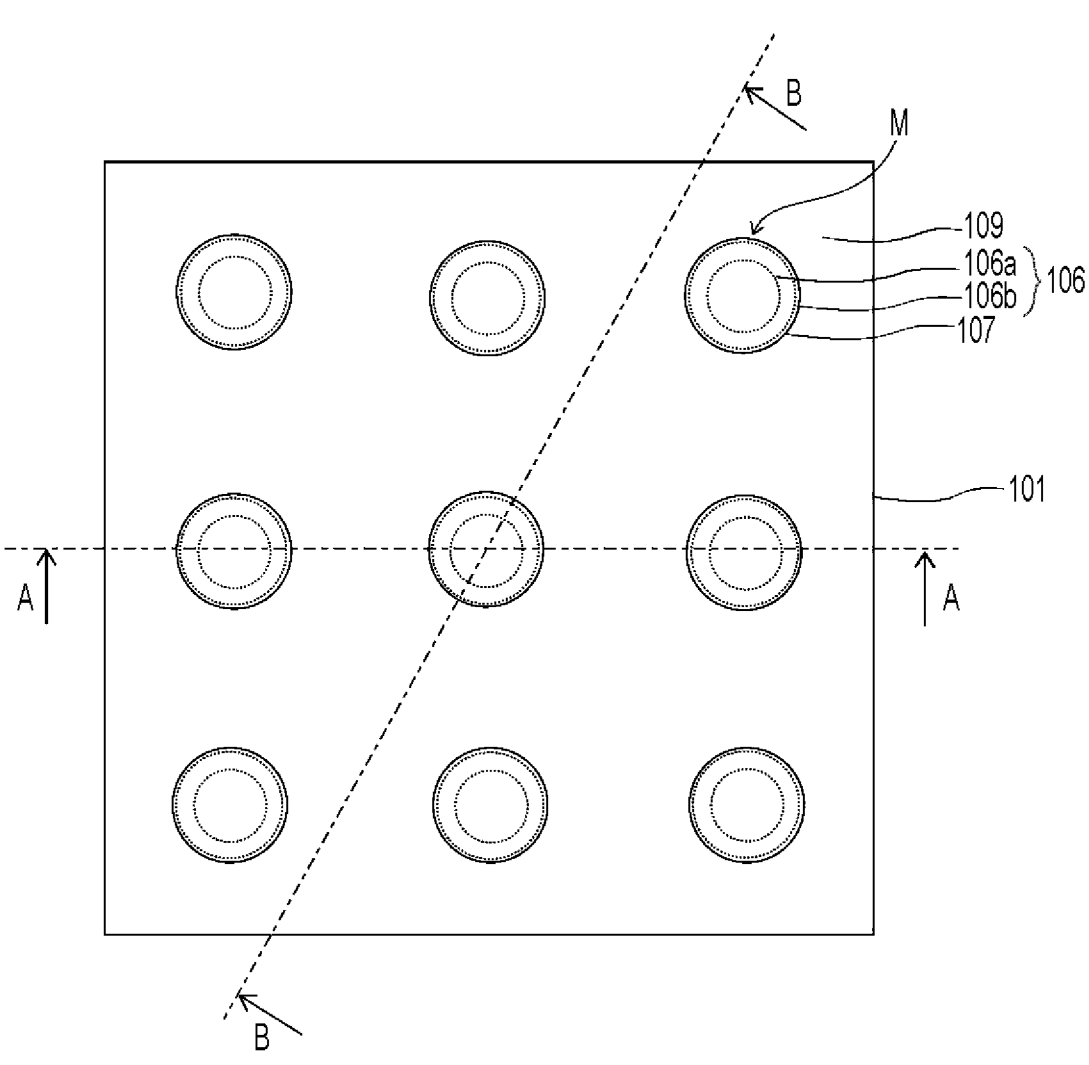
FIG. 34 is a third step view of the manufacturing method for the surface emitting laser device of FIG. 27.
Figure 35:
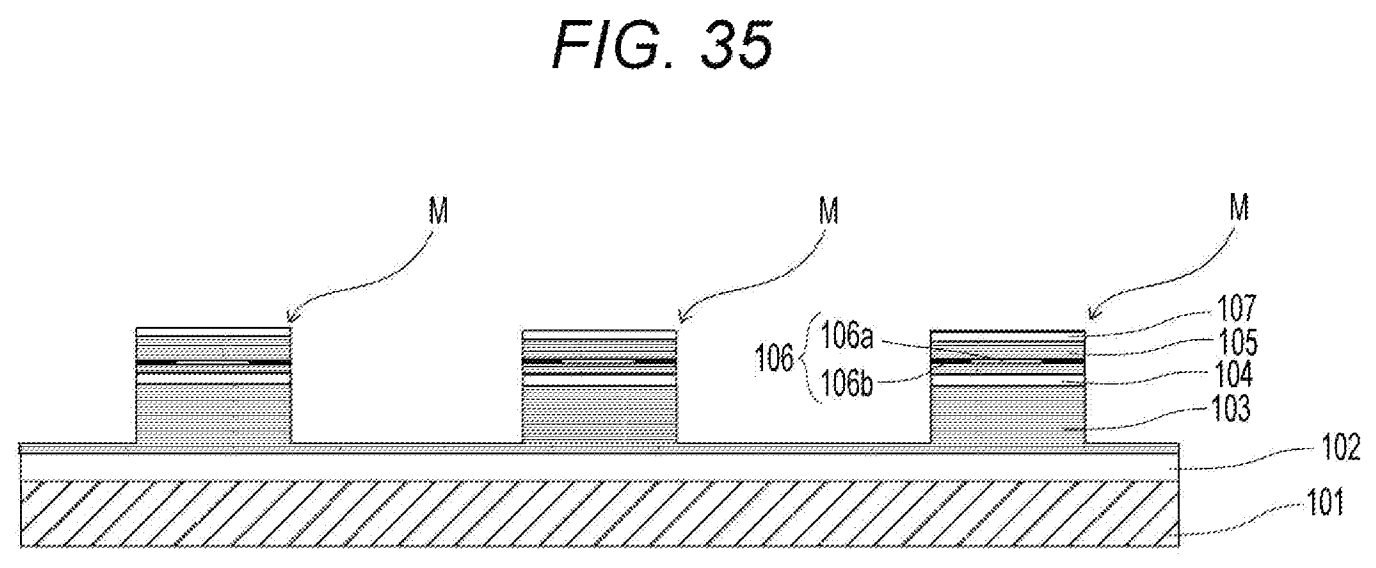
Figure 36:
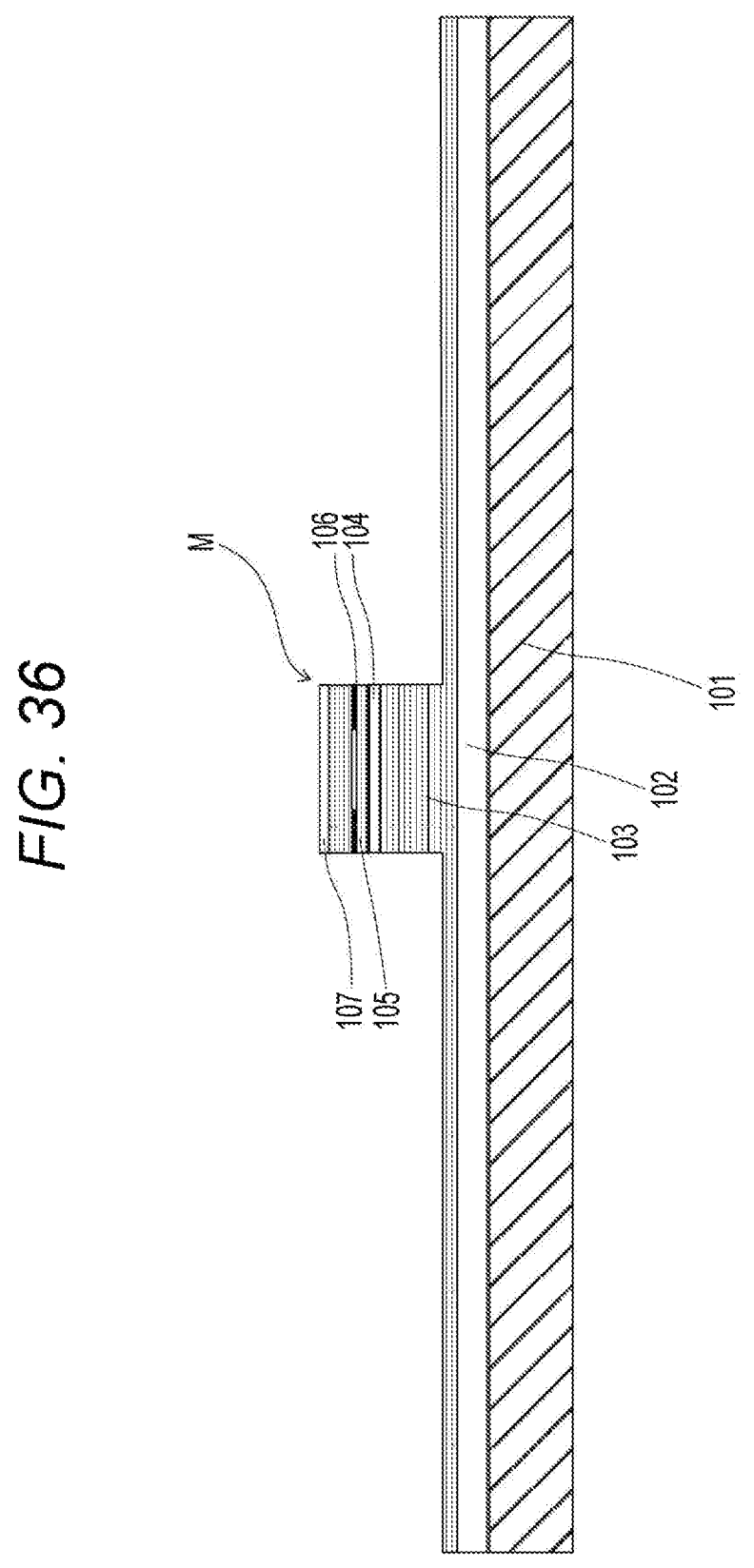

Specifically, a peripheral portion of the selectively oxidized layer 106S of the mesa M is oxidized to form the current constriction layer 106 (an oxide constriction layer) (see FIGS. 34 to 36).

Specifically, by exposing the mesa M to a water vapor atmosphere and oxidizing (selectively oxidizing) the selectively oxidized layer 106S from a side surface, the current constriction layer 106 is formed in which the non-oxidized area 106*a* is surrounded by the oxidized area 106*b*.

Figure 37:
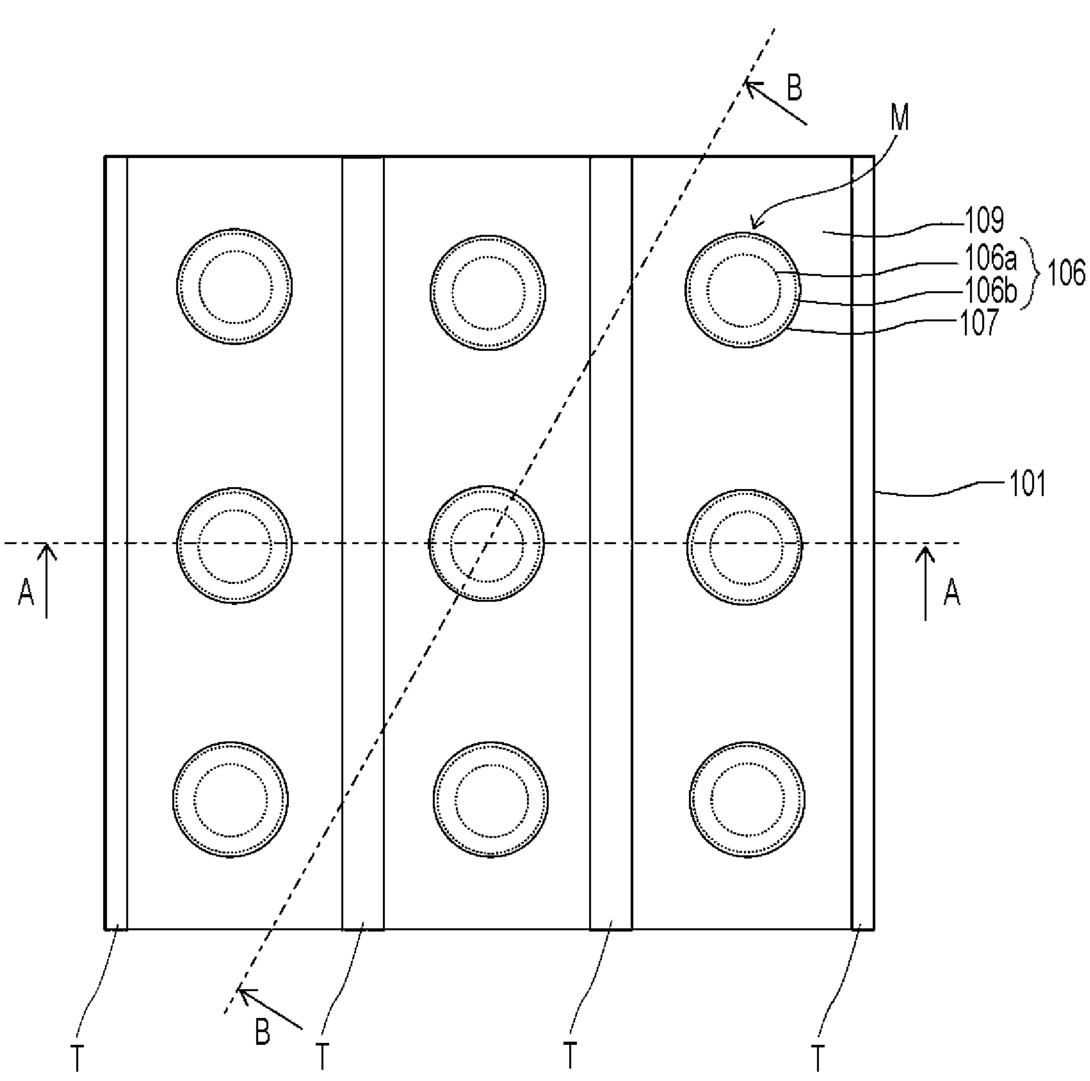
FIG. 37 is a fourth step view of the manufacturing method for the surface emitting laser device of FIG. 27.
Figure 38:
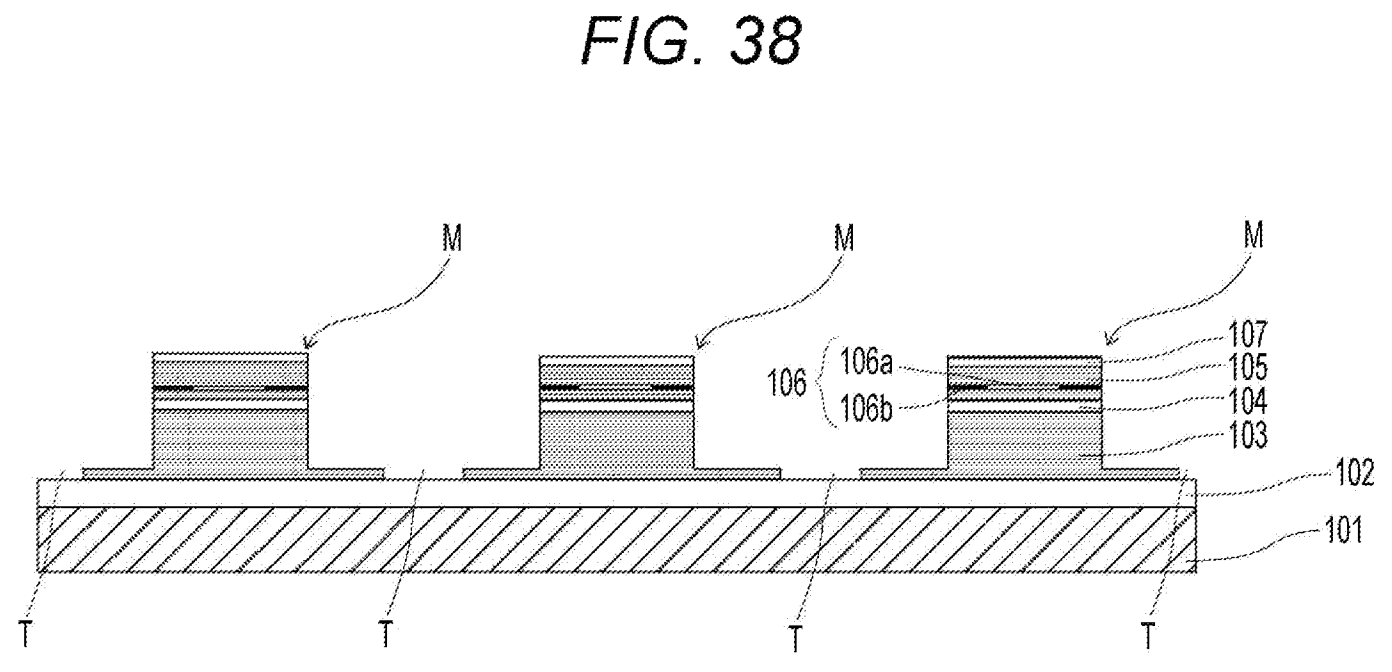
Figure 39:
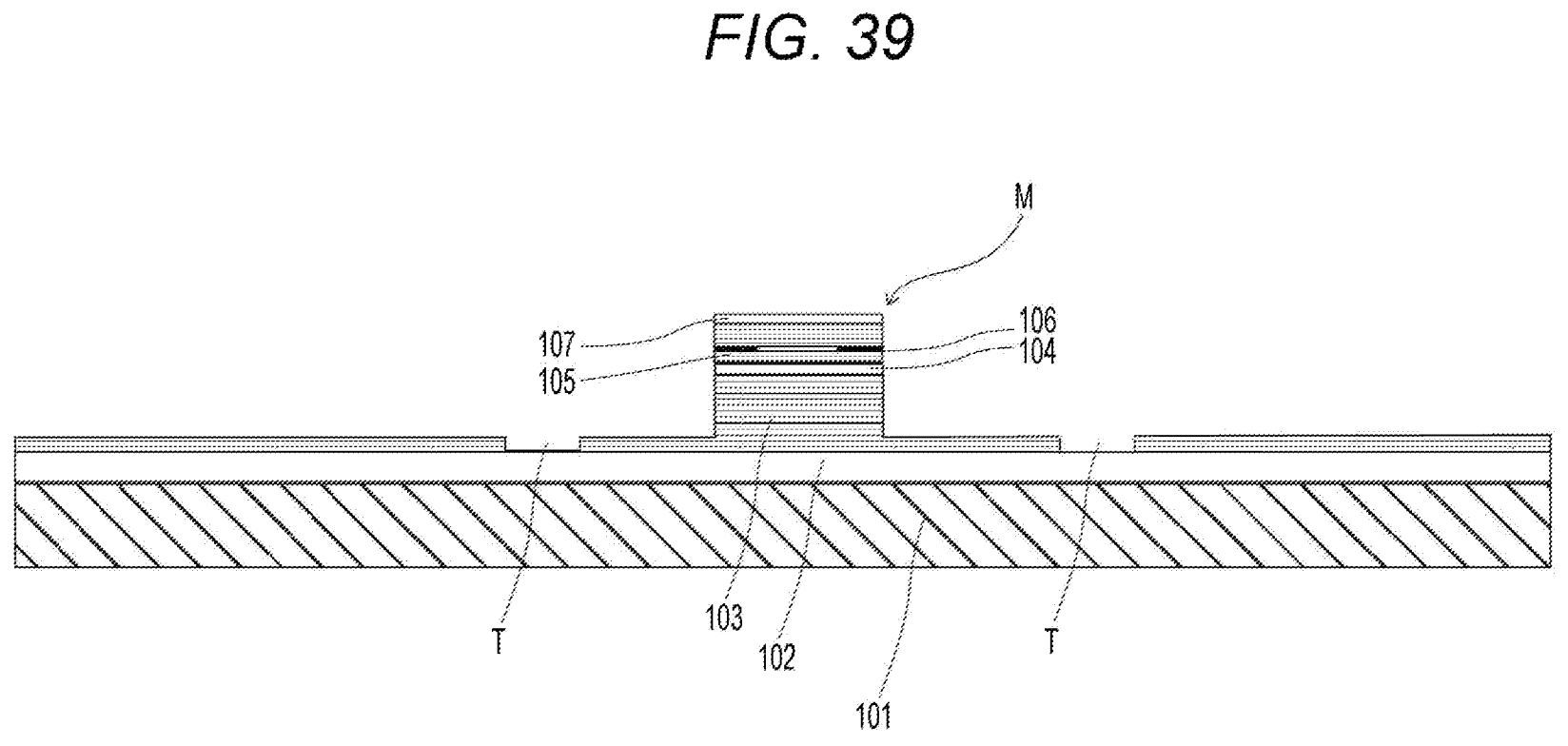

In the next step S14, a trench T (a groove) for separation of an element array (a mesa array) is formed. Specifically, by etching (for example, wet etching using a sulfuric acid-based etchant) and removing the first multilayer film reflector 103 remaining between two adjacent mesa rows among a plurality of mesa rows aligned in the X direction and each including a plurality of mesas M aligned in the Y direction (the row direction), the trench T is formed between the two adjacent mesa rows (see FIGS. 37 to 39).

Figure 40:
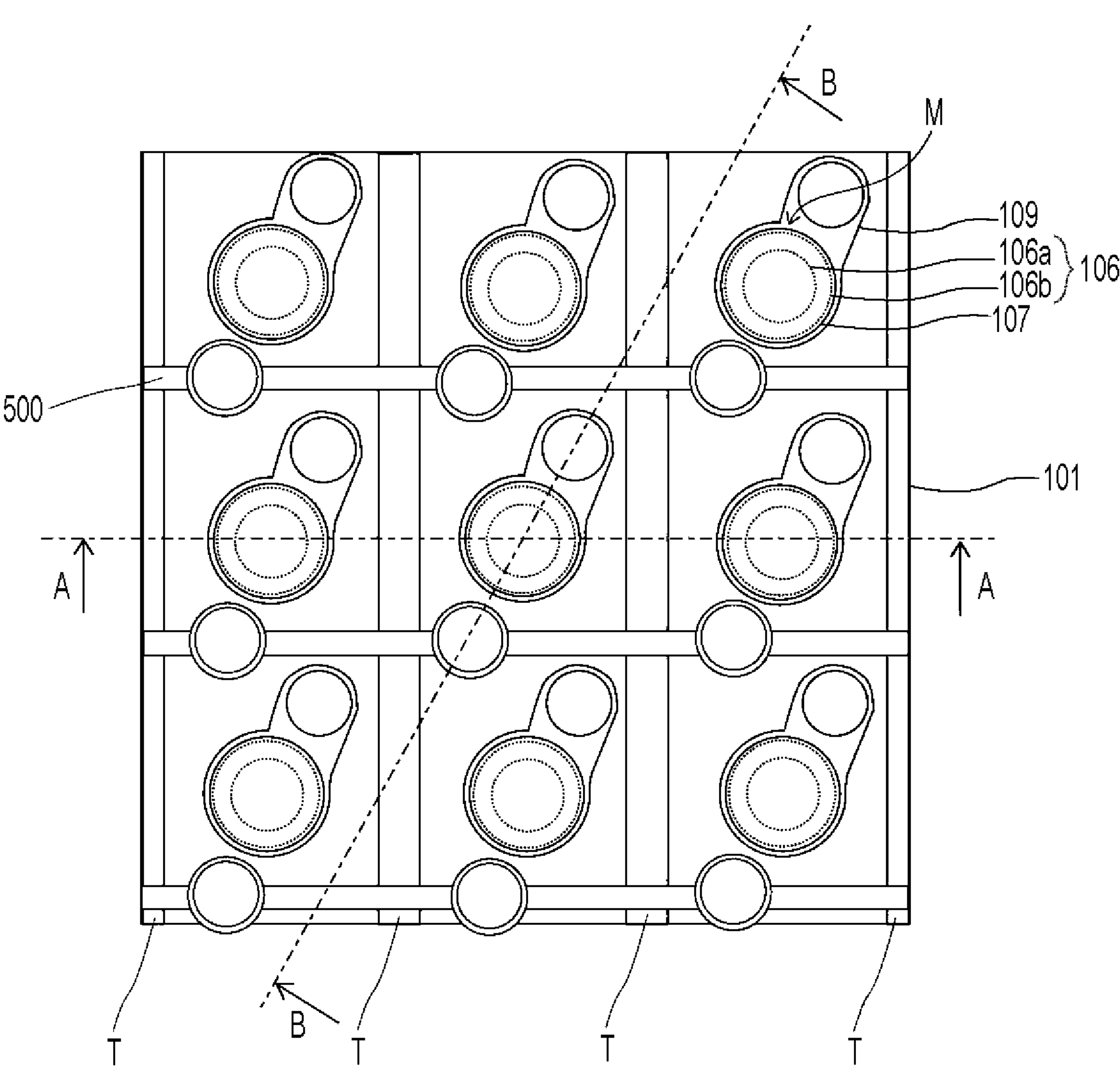
FIG. 40 is a fifth step view of the manufacturing method for the surface emitting laser device of FIG. 27.
Figure 41:
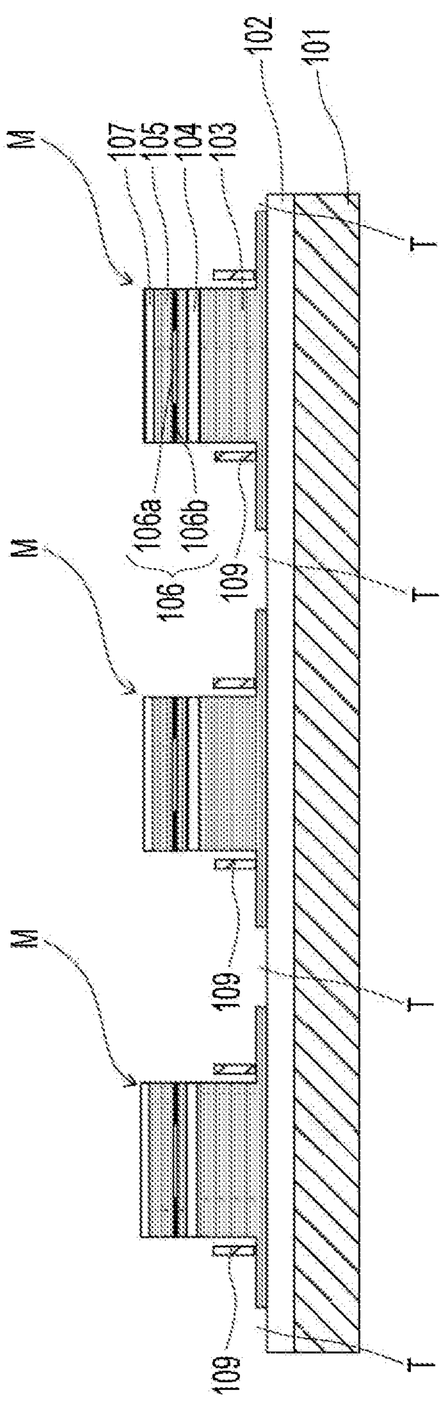
FIG. 41 is a cross-sectional view taken along line A-A of FIG. 40.
Figure 42:
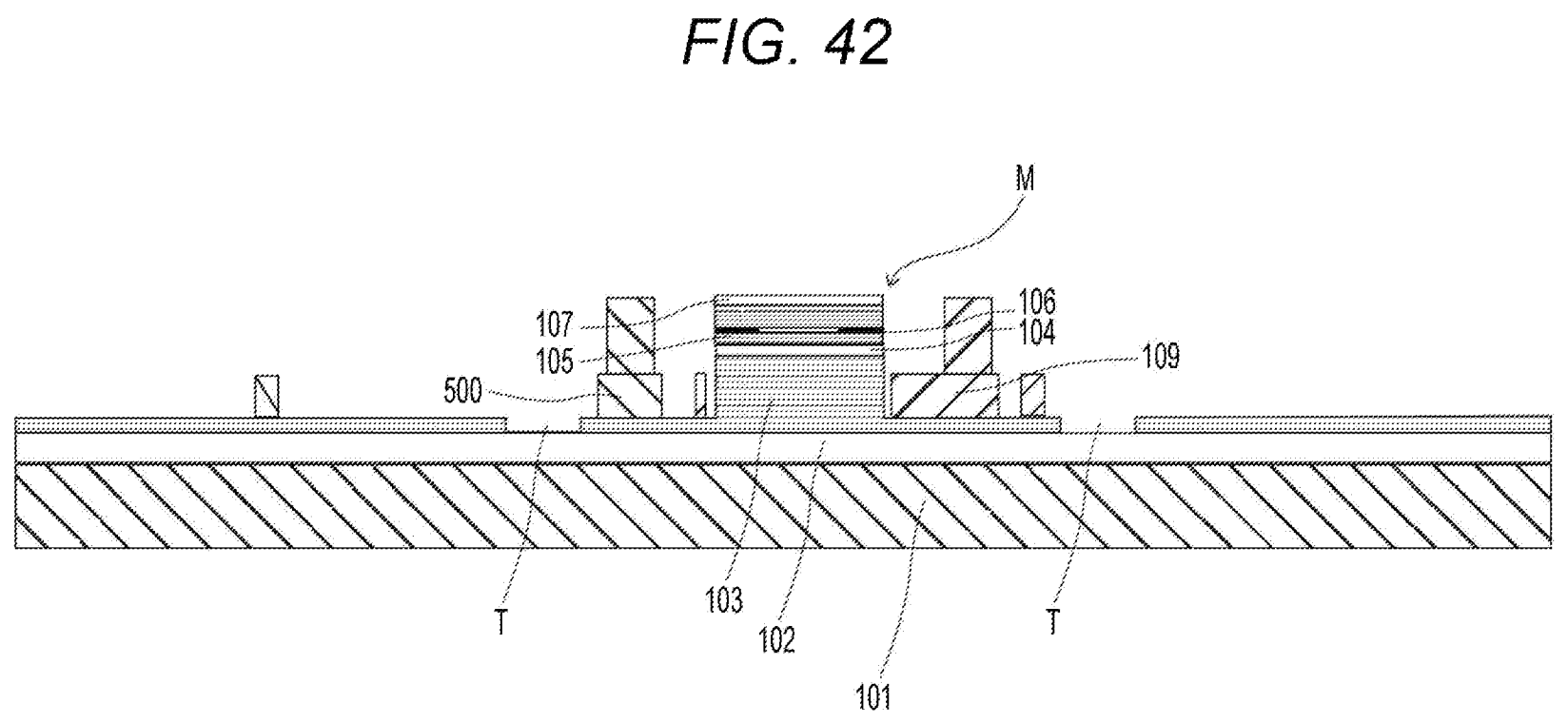

In the next step S15, the second electrode 109 and the conductor 500 are formed. Specifically, the second electrode 109 surrounding each mesa M is formed on the first board 101 by a plating method, and a plurality of conductors 500 aligned in the Y direction and each extending in the X direction (column direction) is formed (see FIGS. 40 to 42). Note that, before the plating method is used, it is preferable to form an underlayer to be a plating seed at a portion of the first multilayer film reflector 103 where the second electrode 109 and the conductor 500 are to be formed by using, for example, vapor deposition, sputtering, or the like. A thickness of the second electrode 109 and the conductor 500 is a thickness that allows a voltage drop to be sufficiently prevented (for example, about 2 μm).

In the next step S16, a first electrode 108 is formed.

Figure 43:
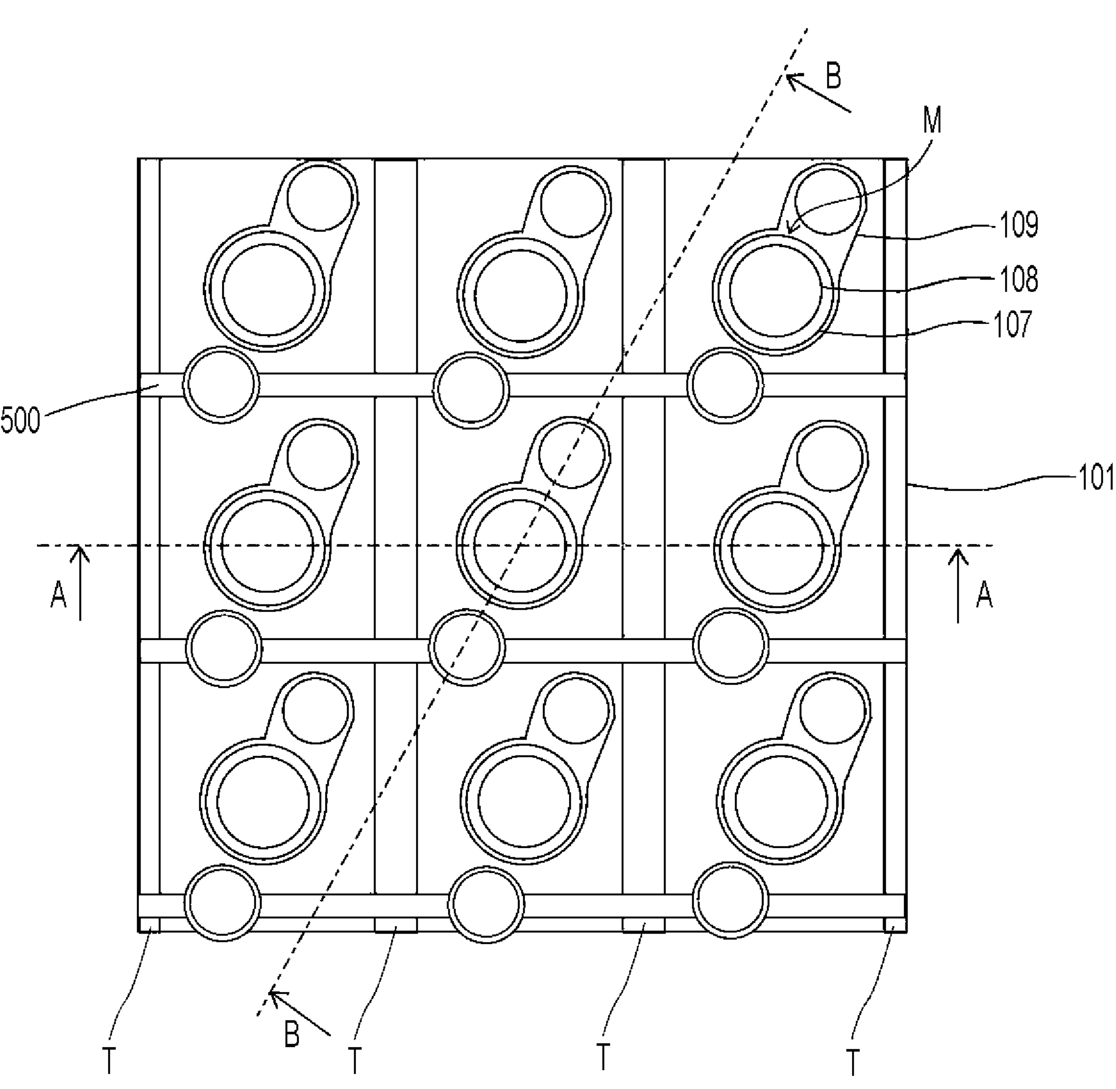
FIG. 43 is a sixth step view of the manufacturing method for the surface emitting laser device of FIG. 27.
Figure 44:
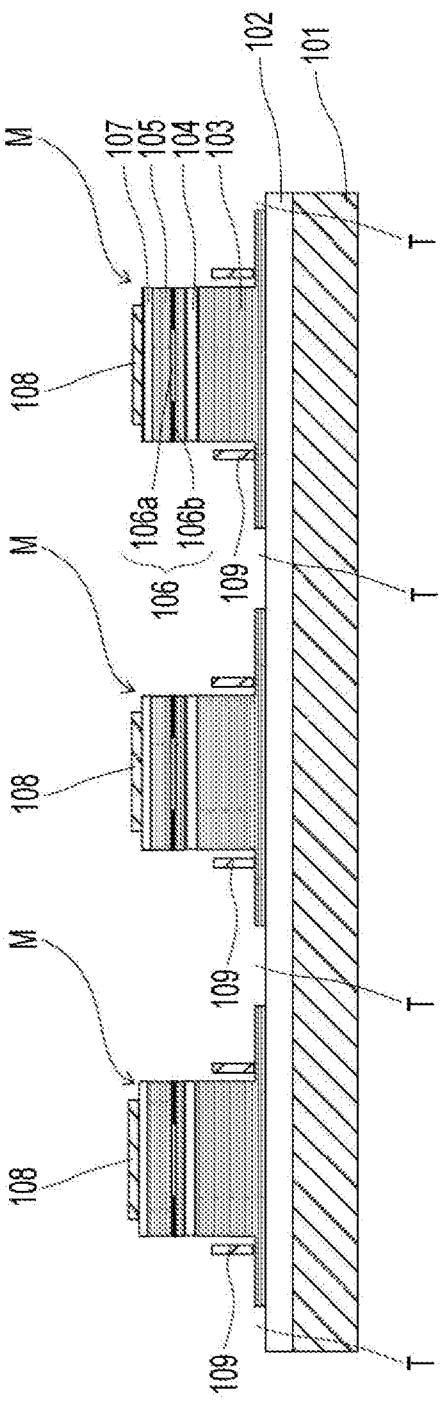
FIG. 44 is a cross-sectional view taken along line A-A of FIG. 43.
Figure 45:
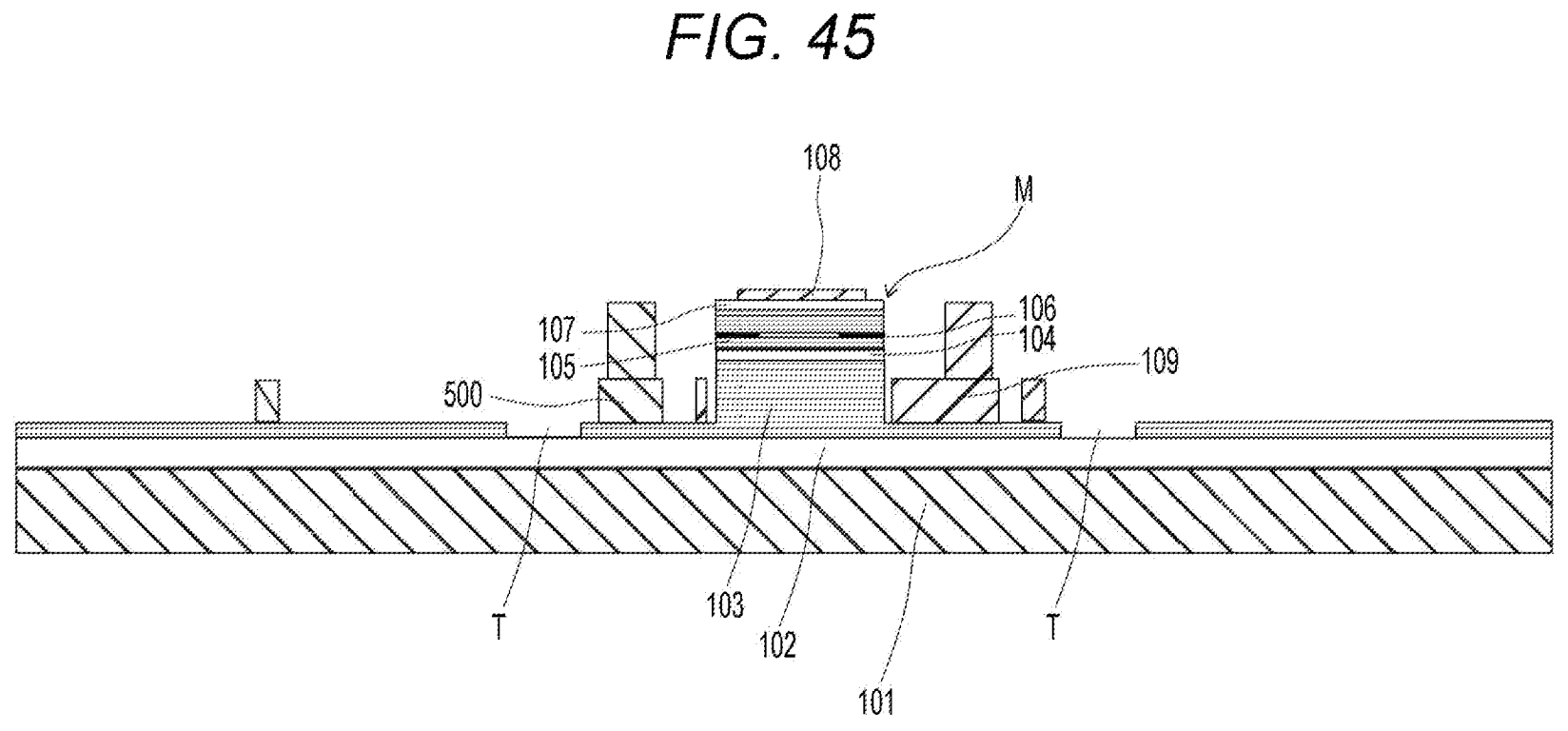
Figure 46:
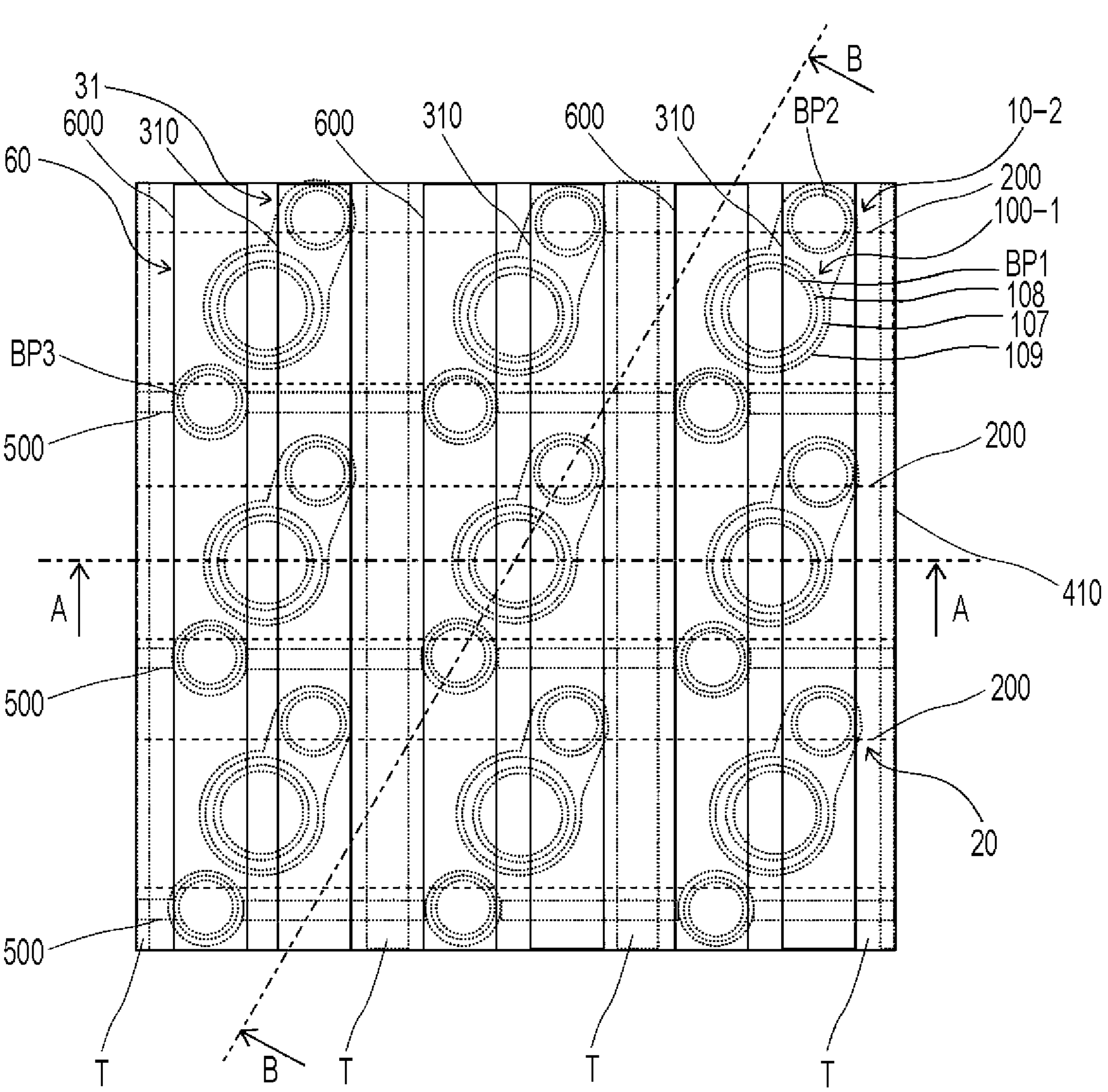
FIG. 46 is a seventh step view of the manufacturing method for the surface emitting laser device of FIG. 27.
Figure 47:
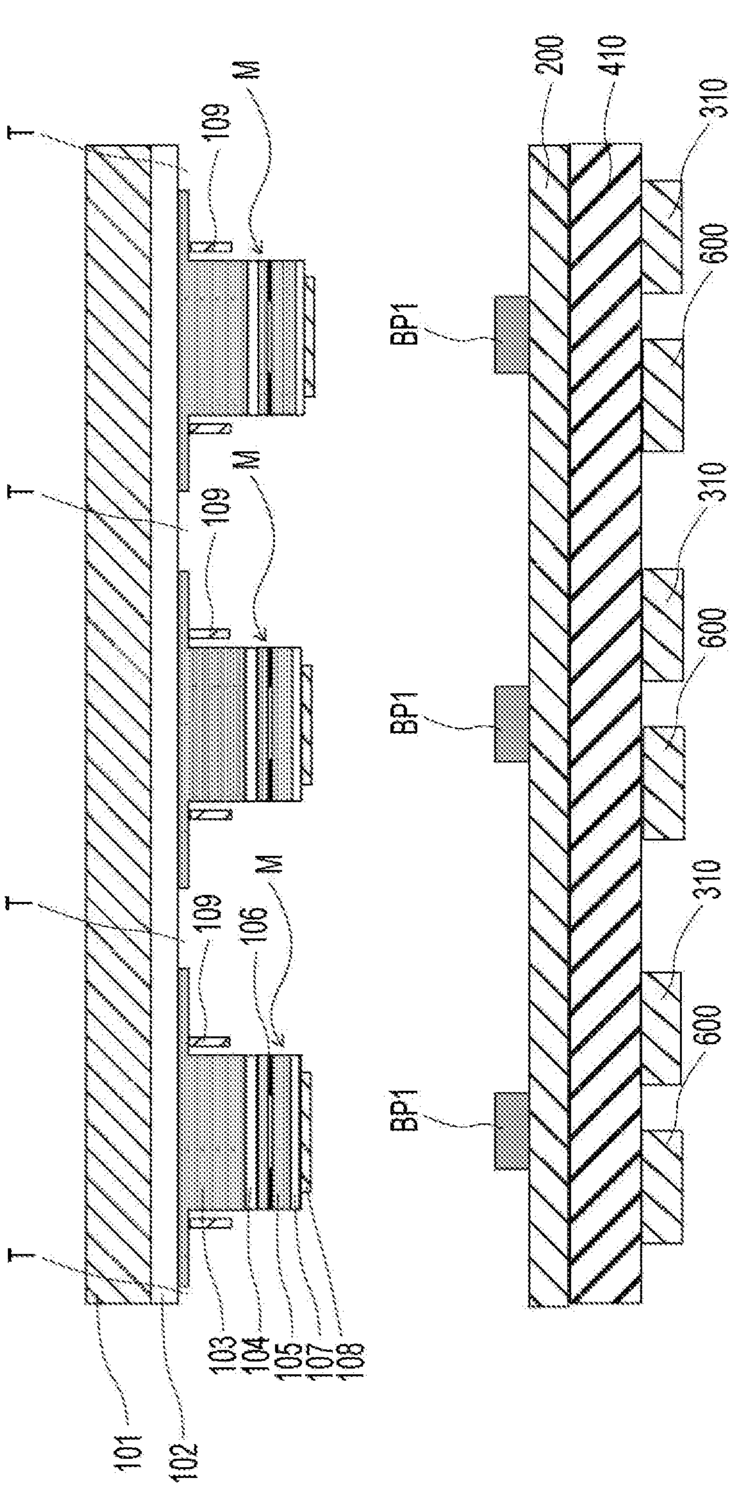
FIG. 47 is a cross-sectional view (before joining) taken along line A-A in FIG. 46.

Specifically, for example, an Au/Ti film to be a material of the first electrode 108 is formed on the contact layer 107 by, for example, an EB vapor deposition method (see FIGS. 43 to 45).

Thereafter, processing such as annealing, thinning by polishing a back surface of the wafer, and non-reflection coating on the back surface of the wafer is performed to form the plurality of surface emitting laser arrays 10-2 on one wafer. Thereafter, the plurality of surface emitting laser arrays 10-2 is separated into chips by dicing, and a plurality of surface emitting laser array chips is obtained.

In the next step S17, the surface emitting laser array chip including the surface emitting laser array 10-2 is joined by flip chip to a wiring board including the first wiring group 20, the second wiring group 31, and the second board 410. Specifically, the first electrode 108 formed at a top portion of each mesa M of the surface emitting laser array 10-2 is joined to the corresponding first wiring line 200 formed on the second board 400 by junction down, each second electrode 109 is joined to the corresponding second wiring line 310 by junction down, and each conductor 500 is joined to the corresponding third wiring line 600 by junction down. (See FIGS. 46 to 50).

Figure 48:
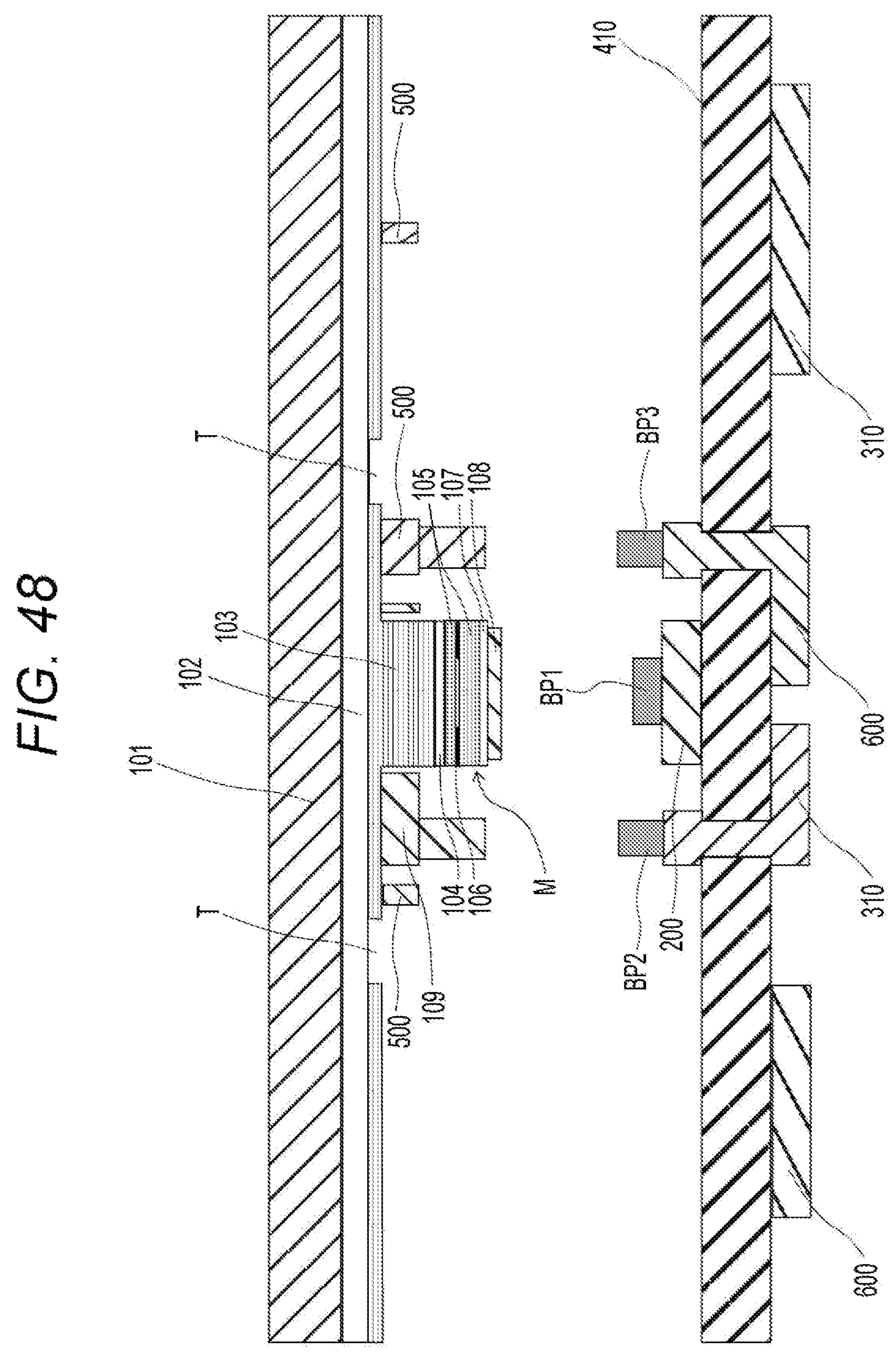
FIG. 48 is a cross-sectional view (before joining) taken along line B-B in FIG. 46.
Figure 49:
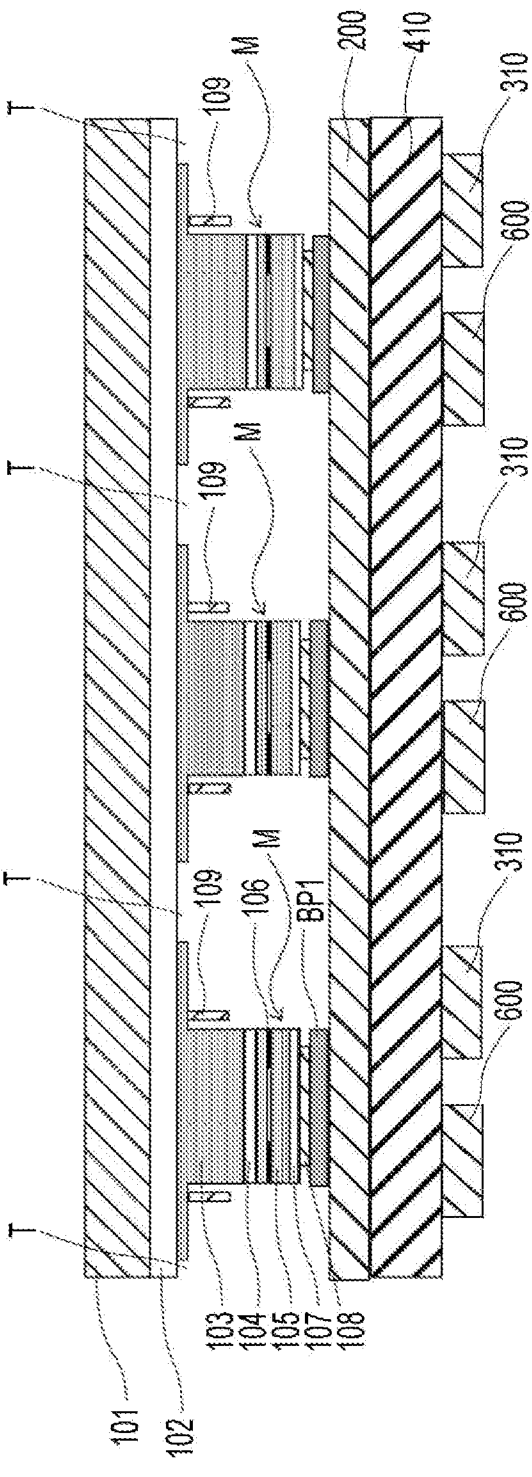
FIG. 49 is a cross-sectional view (after joining) taken along line A-A in FIG. 46.

More specifically, first, a plurality of first bumps BP1 is attached to a region of each first wiring line 200 facing the corresponding first electrode 108 (see FIGS. 47 and 48), the bump BP2 is attached to a region of each second wiring line 310 facing the corresponding second electrode 109 (see FIG. 48), and the bump BP3 is attached to a region of each third wiring line 600 facing the corresponding conductor 500 (see FIG. 48). Here, for example, Au is used as the first to third bumps BP1 to BP3.

Next, after positioning a surface emitting laser array chip including the surface emitting laser array 10-2 and the wiring board including the first wiring group 20, the second wiring group 31, and the second board 410 such that the mutually corresponding first electrode 108 and first bump BP1 face each other, the mutually corresponding second electrode 109 and second bump BP2 face each other, and the mutually corresponding conductor 500 and third bump BP3 (see FIGS. 47 and 48) face each other, the mutually corresponding first electrode 108 and first wiring line 200 are ultrasonically welded via the first bump BP1 (see FIGS. 49 and 50), the mutually corresponding second electrode 109 and second wiring line 310 are ultrasonically welded via the second bump BP2 (see FIG. 50), and the mutually corresponding conductor 500 and third wiring line 600 are ultrasonically welded via the third bump BP2 (see FIG. 50) by pressing the surface emitting laser array chip against the wiring board under predetermined temperature and pressure conditions. When step S17 is executed, the flow ends.

As described above, the surface emitting laser device 2 is generated.

7. <Effect of Surface Emitting Laser Device According to Second Embodiment of Present Technology>

In the surface emitting laser device 2 according to the second embodiment of the present technology, both the first wiring group 20 and the second wiring group 31 are provided on the second board 410 different from the first board 101 on which the surface emitting laser array 10-2 is provided. As a result, a sufficient installation space for each first wiring line 200 and each second wiring line 310 can be secured, so that a cross-sectional area of each first wiring line 200 and each second wiring line 310 can be sufficiently increased, and the resistance of each of the wiring lines can be reduced.

Figure 51:
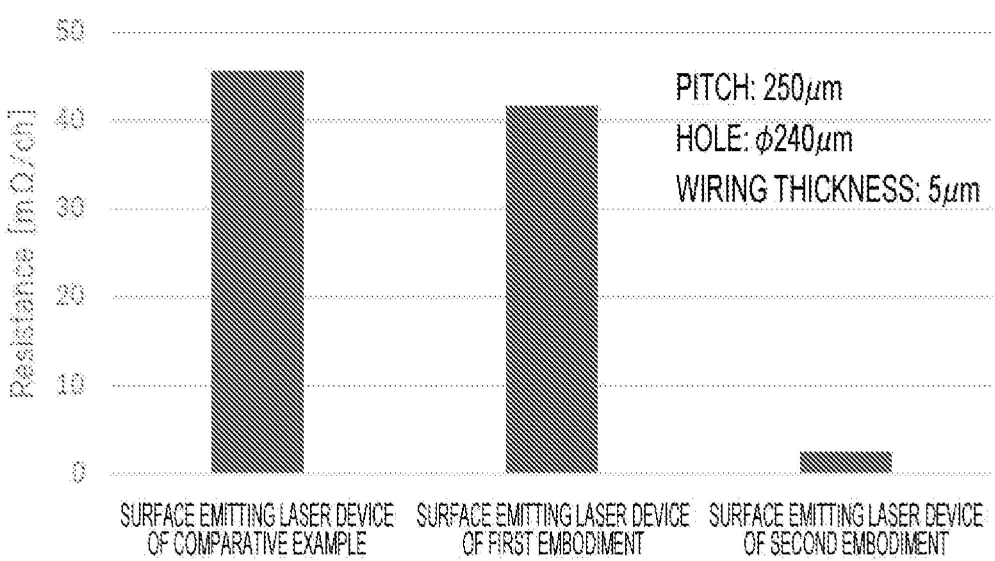
FIG. 51 is a graph illustrating wiring resistance between channels of a surface emitting laser device of a comparative example, the surface emitting laser device of FIG. 1, and the surface emitting laser device of FIG. 27.

For example, as illustrated in FIG. 51, in the surface emitting laser device 2 of the second embodiment, it has been found that wiring resistance between channels (between the light emitting units) is reduced by approximately 95% as compared with a surface emitting laser device of a comparative example in which both the first wiring group and the second wiring group are formed on the first board. A graph of FIG. 51 shows results obtained under conditions that a pitch between the channels (between the light emitting units) is 250 μm, a hole is φ 240 μm, and a thickness of each first wiring line and each second wiring line is 5 μm. Note that, the term "hole" as used herein refers to an absent region of a wiring electrode provided at a location corresponding to a mesa portion of the surface emitting laser so as not to interfere with the mesa.

In the surface emitting laser device 2, since the conductor 500 connected to the ground is arranged along the corresponding first wiring line 200, a closed loop is formed between the conductor 500 and the first wiring line 200, and accordingly the resistance of the first wiring line 200 can be further reduced.

Each of the plurality of light emitting units 100-1 has the mesa M protruding on the second board 410 side, the first electrode 108 provided at the top portion of the mesa M of each of the plurality of light emitting units 100-1 is joined via the first bump BP1 to the first wiring line 200 corresponding to the light emitting unit 100-1, and the second electrode 109 provided in a peripheral portion of each of the plurality of light emitting units 100-1 on the first board 101 is joined via the second bump BP2 to the second wiring line 310 corresponding to the light emitting unit 100-1. As a result, it is possible to stably conduct each light emitting unit 100-1 and the corresponding first wiring line 200 and second wiring line 310 while reducing the resistance. Moreover, the second electrode 109 also functions as a spacer for keeping a space between the one board 101 and the second board 410 constant.

The surface emitting laser device 2 further includes the third wiring line 600 provided on the second board 410 and insulated from both the first wiring group 20 and the second wiring group 31. The conductor 500 is provided on the first board 101, and the conductor 500 and the third wiring line 600 are joined via the third bump BP3. As a result, the conductor 500 functions as a spacer for keeping a space between the first board 101 and the second board 410 constant, and can also be connected to a reference potential (for example, ground) via the third wiring line 600.

The third wiring line 600 is provided along at least a part of the first wiring group 20 and/or the second wiring group 31. As a result, similarly to the conductor 500, the third wiring line 600 can also have a function of reducing resistance of the corresponding first wiring line 200 and second wiring line 310.

8. <Surface Emitting Laser Device According to Third Embodiment of Present Technology>

Figure 52:
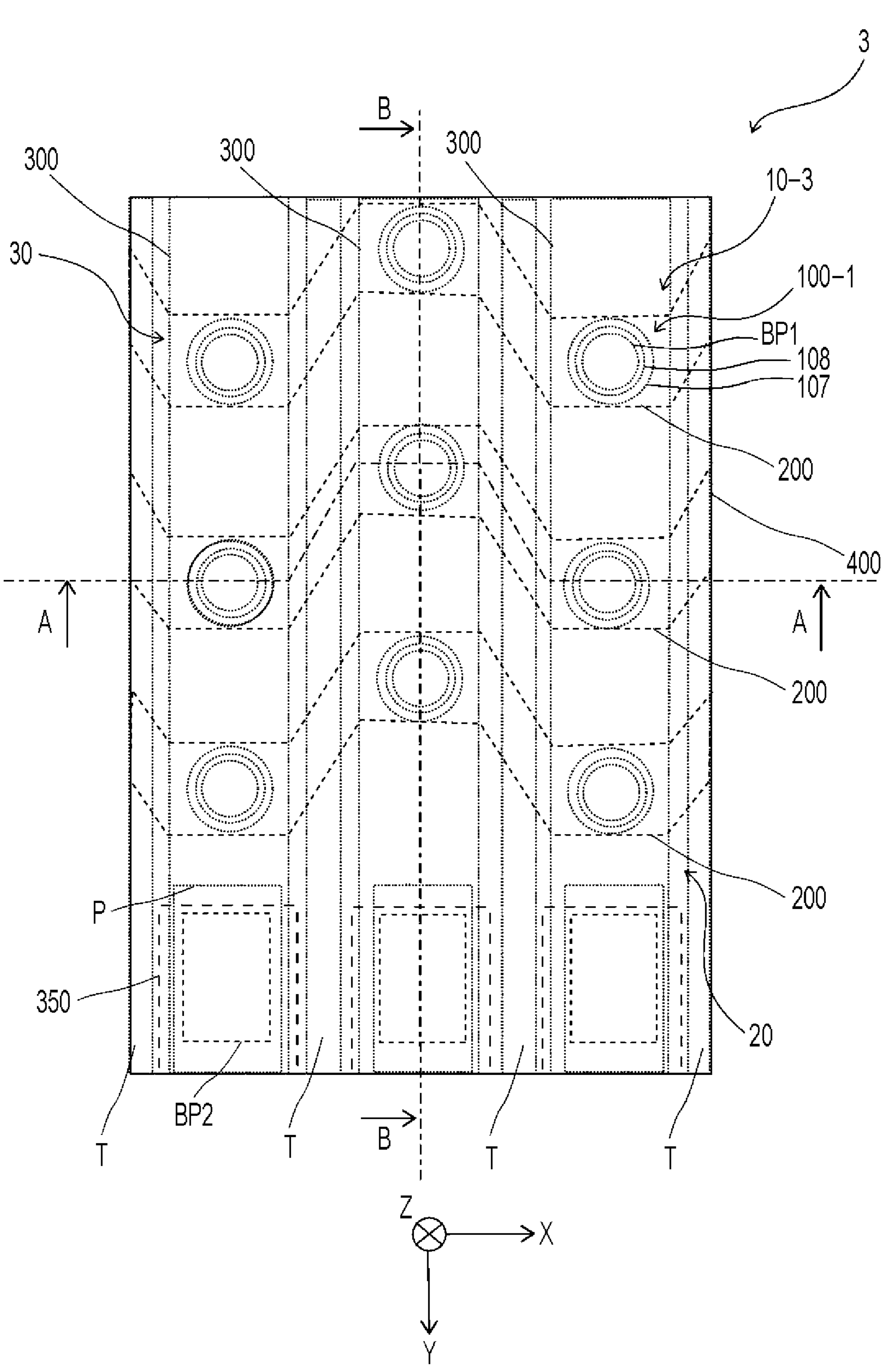
FIG. 52 is an extracted plan view illustrating a part of a surface emitting laser device according to a third embodiment of the present technology.
Figure 53:
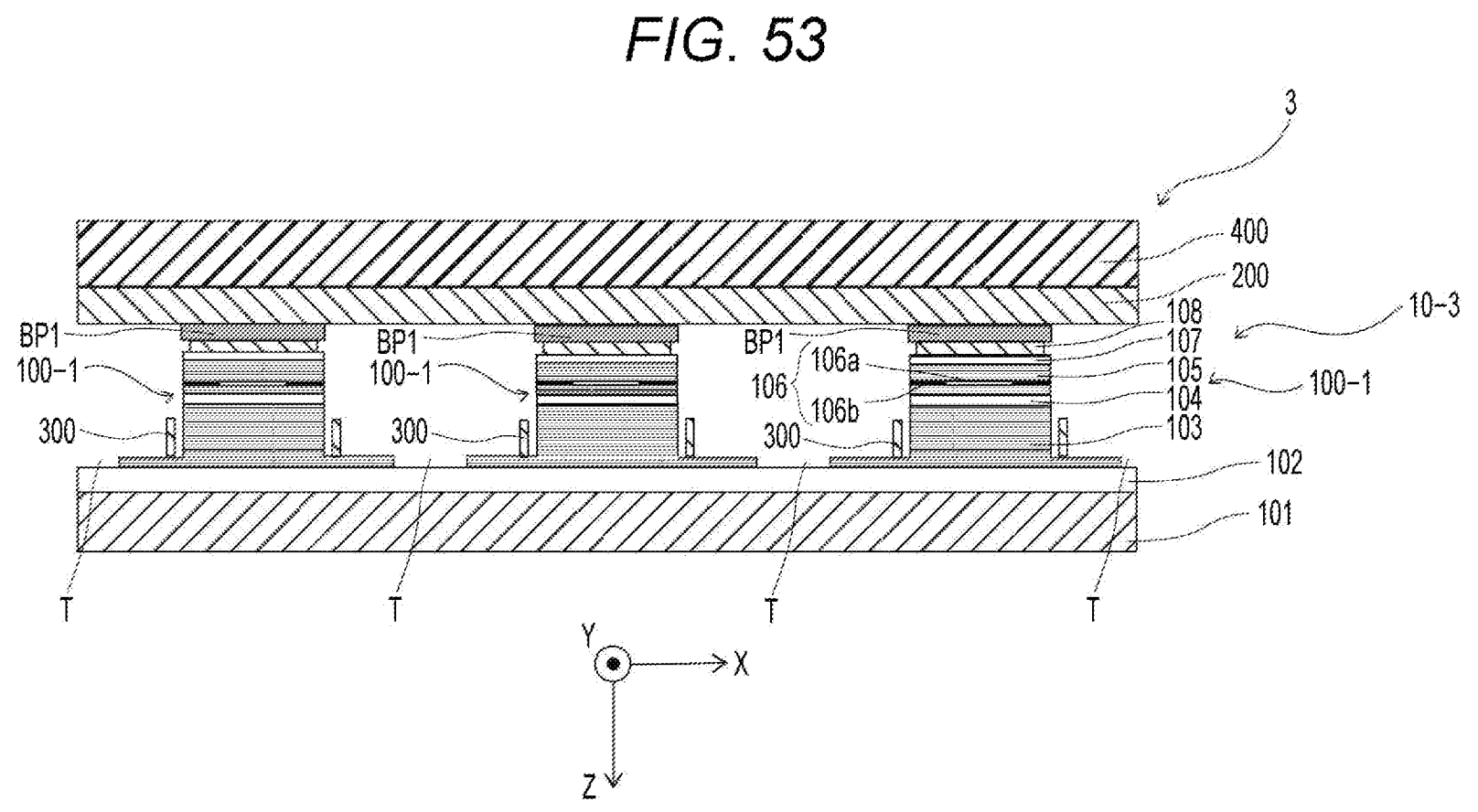
Figure 54:
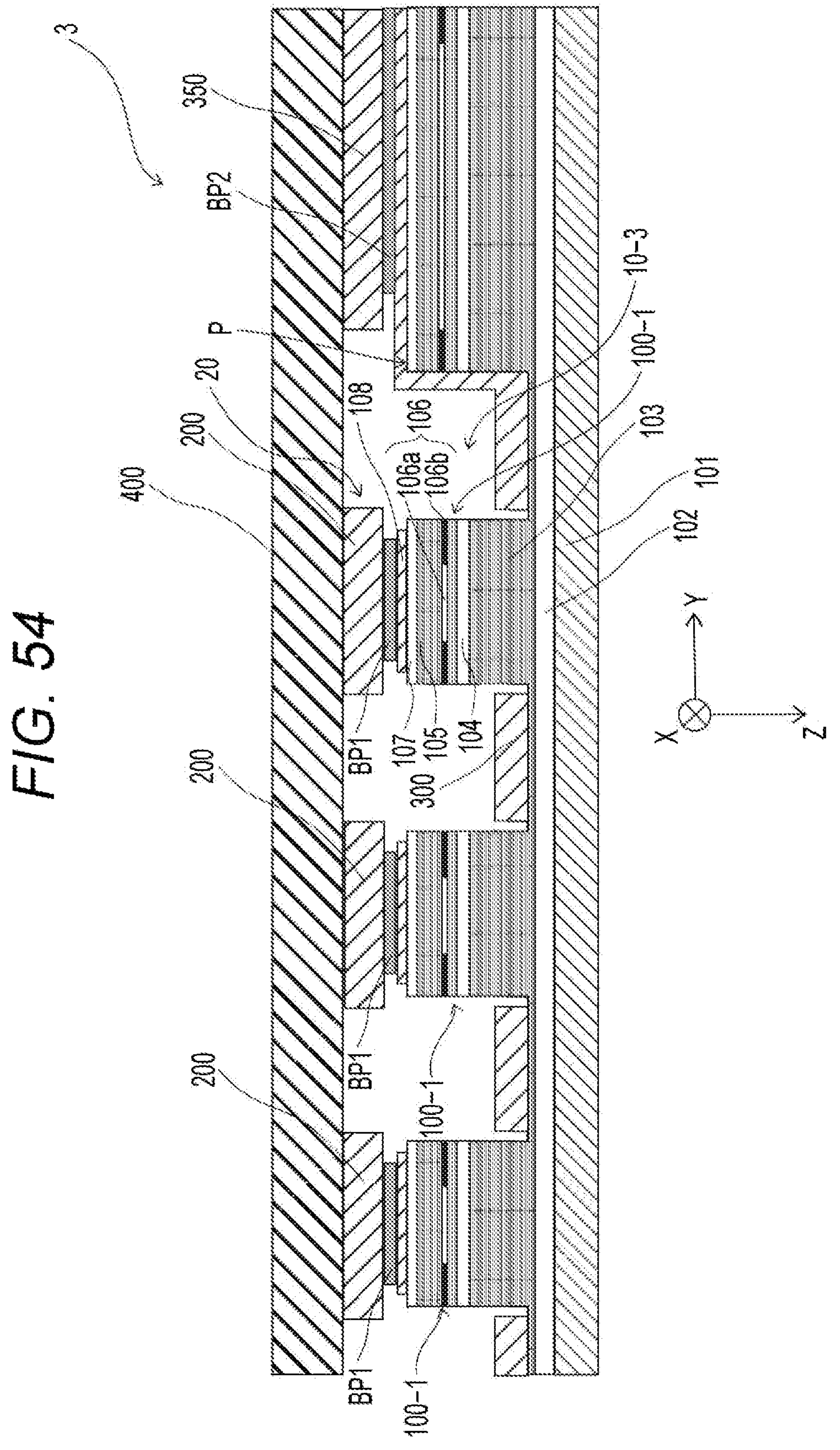
FIG. 54 is a cross-sectional view taken along line B-B in FIG. 52.

FIG. 52 is an extracted plan view illustrating a part of a surface emitting laser device 3 according to a third embodiment of the present technology. FIG. 53 is a cross-sectional view taken along line A-A in FIG. 52. FIG. 54 is a cross-sectional view taken along line B-B in FIG. 52.

The surface emitting laser device 3 is a modification of the surface emitting laser device 1 of the first embodiment.

In a surface emitting laser array 10-3 of the surface emitting laser device 3, as illustrated in FIG. 52, a plurality of light emitting units 100-1 is arranged in a zigzag manner.

As illustrated in FIGS. 53 and 54, the surface emitting laser device 3 has a layer configuration similar to the layer configuration of the surface emitting laser device 1 of the first embodiment.

The surface emitting laser device 3 has a function and an effect similar to those of the surface emitting laser device 1.

The surface emitting laser device 3 can be manufactured by a manufacturing method according to the manufacturing method for the surface emitting laser device 1.

9. <Surface Emitting Laser Device According to Fourth Embodiment of Present Technology>

Figure 55:
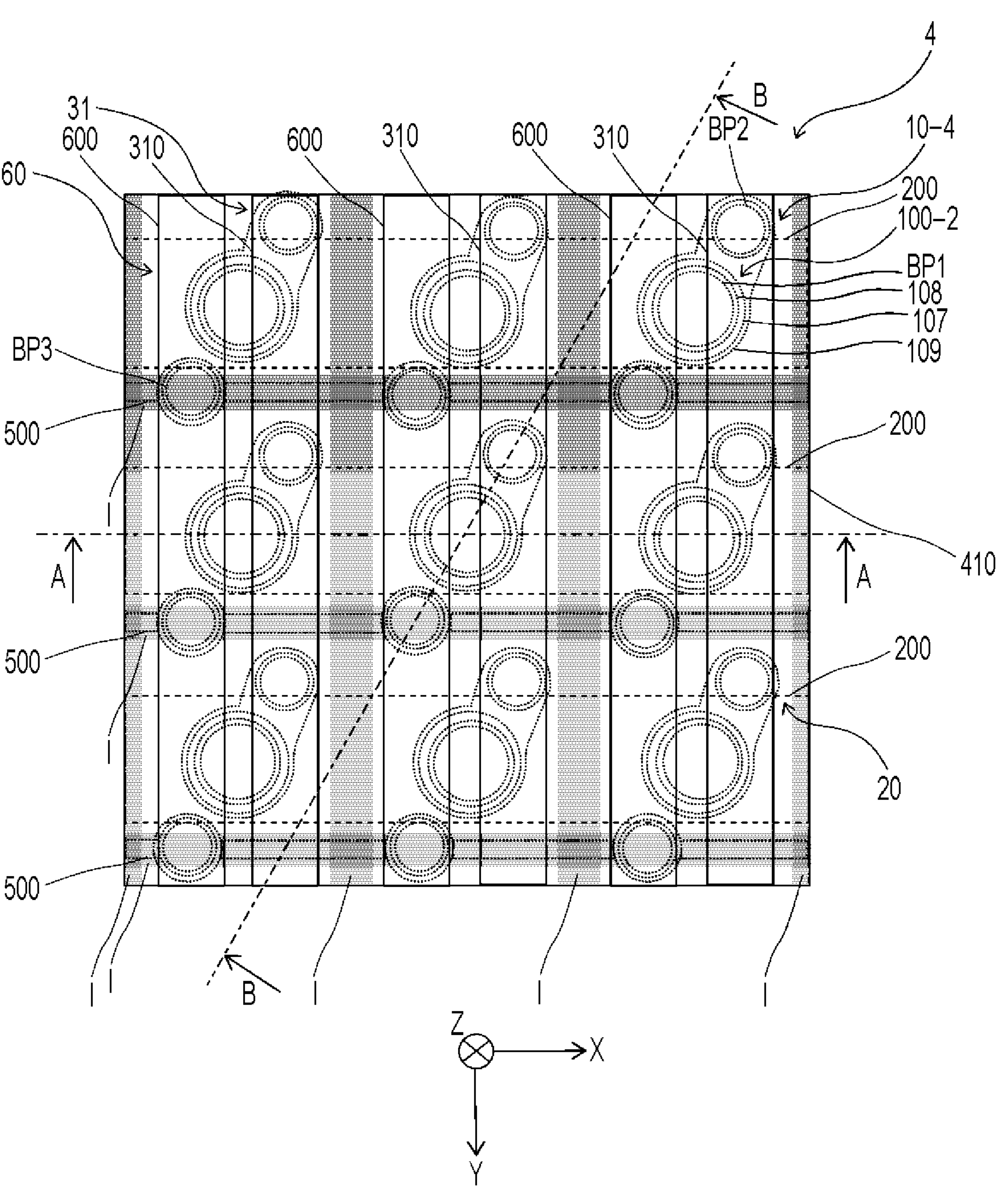
FIG. 55 is an extracted plan view illustrating a part of a surface emitting laser device according to a fourth embodiment of the present technology.
Figure 56:
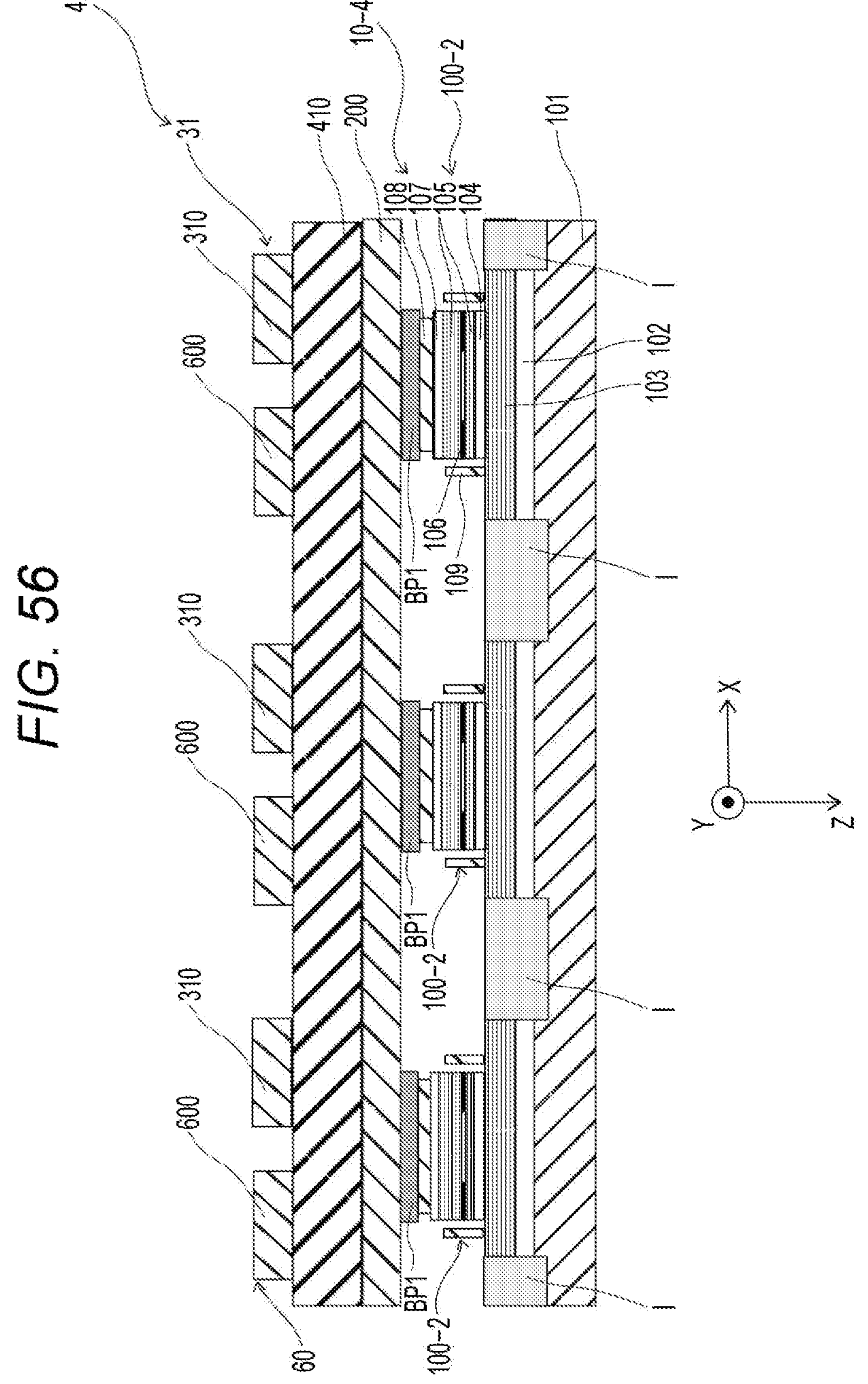
FIG. 56 is a cross-sectional view taken along line A-A of FIG. 55.
Figure 57:
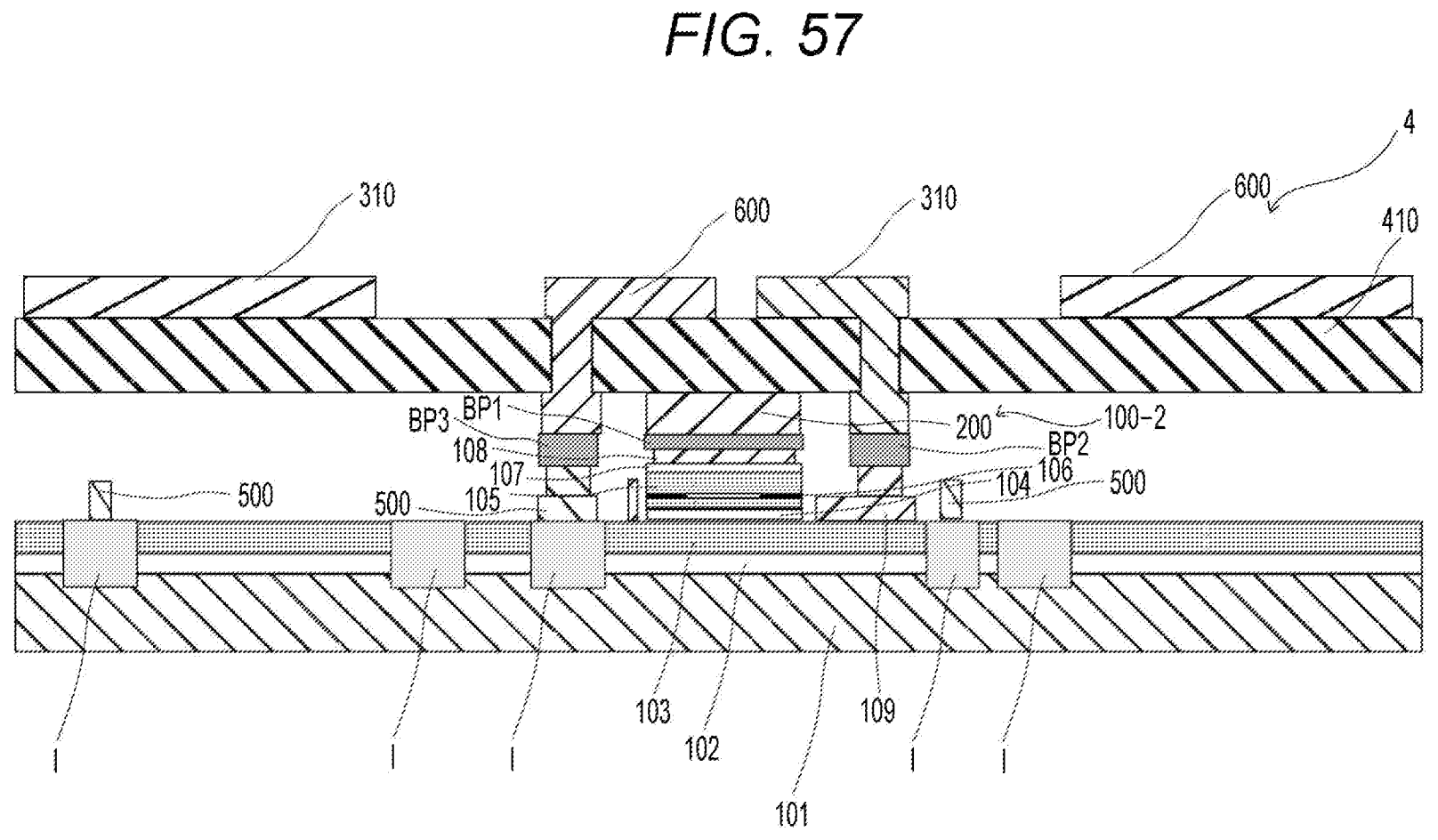

FIG. 55 is an extracted plan view illustrating a part of a surface emitting laser device 4 according to a fourth embodiment of the present technology. FIG. 56 is a cross-sectional view taken along line A-A in FIG. 55. FIG. 57 is a cross-sectional view taken along line B-B in FIG. 5.

The surface emitting laser device 4 is a modification of the surface emitting laser device 2 of the second embodiment.

In a surface emitting laser array 10-4 of the surface emitting laser device 4, an active layer 104, a second multilayer film reflector 105, a current constriction layer 106, and a contact layer 107 constitute a mesa in each light emitting unit 100-2. That is, in each light emitting unit 100-2, a first multilayer film reflector 103 is not a component of the mesa.

In the surface emitting laser device 4, two adjacent light emitting units 100-2 are insulated by an implantation I (a gray portion in FIG. 55). A plurality of implantations I is formed in a lattice shape that sections a region where each light emitting unit 100-2 is formed as a whole in plan view.

As an example, as illustrated in FIGS. 56 and 57, in each implantation I, an insulating region is formed from an upper surface (a surface on the −Z side) of the first multilayer film reflector 103 to a depth reaching the inside of the board 101 in cross-sectional view.

As ion species used for each implantation I, for example, H+, B, or the like can be used.

Figure 30:
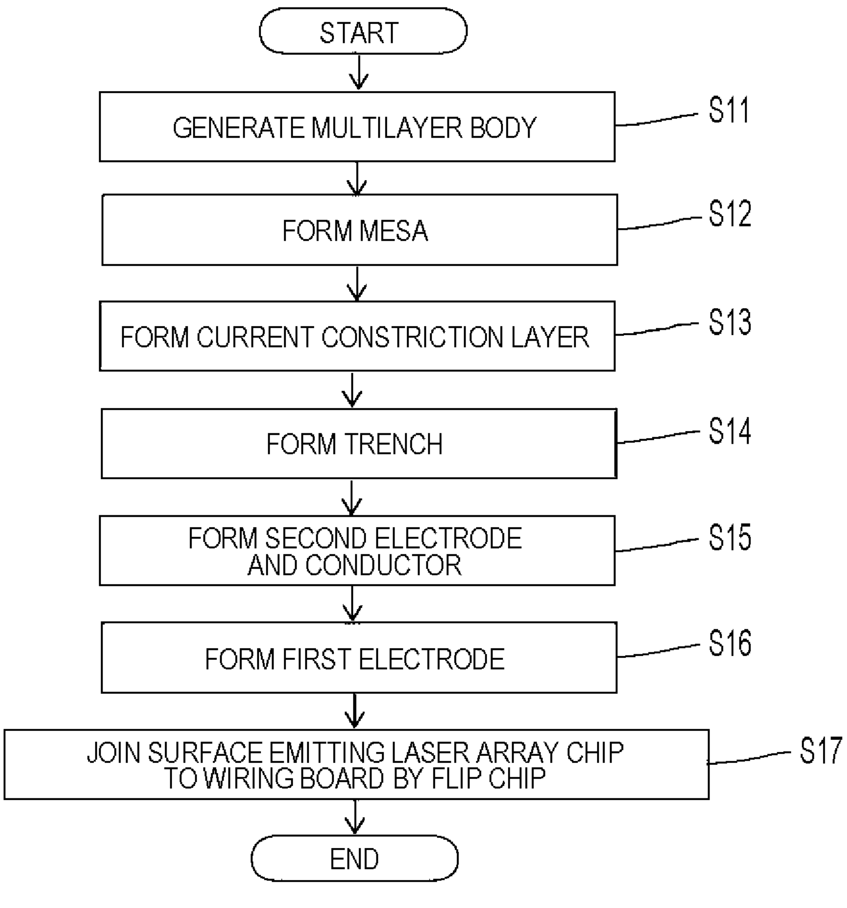
FIG. 30 is a flowchart for explaining a manufacturing method for the surface emitting laser device in FIG. 27.

The surface emitting laser device 4 can be manufactured by a manufacturing method according to the manufacturing method for the surface emitting laser device 2 of the second embodiment (see FIG. 30).

However, when the surface emitting laser device 4 is manufactured, after a multilayer body L is generated, etching is performed up to the active layer 104 (without etching the first multilayer film reflector 103) to form a mesa, and the current constriction layer 106 is formed. Thereafter, the implantation I is formed by performing an implantation step (ion implantation) in a region between two adjacent mesas under a condition that ions reach the inside of the board 101, to insulate the region. Thereafter, steps similar to steps S15 to S17 in FIG. 30 are performed.

The surface emitting laser device 4 also has an effect similar to that the surface emitting laser device 2 of the second embodiment.

10. <Surface Emitting Laser Device According to Fifth Embodiment of Present Technology>

Figure 58:
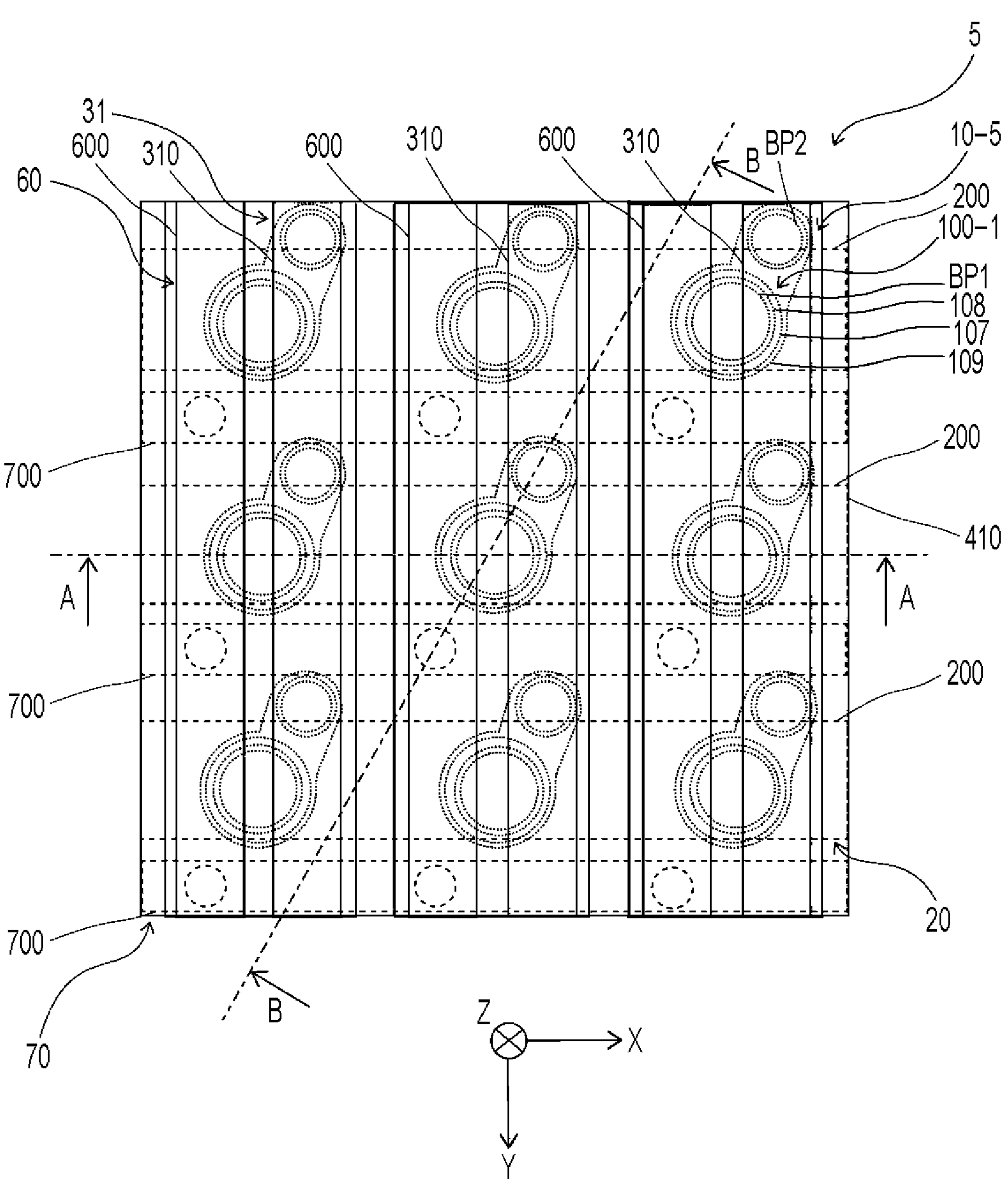
FIG. 58 is an extracted plan view illustrating a part of a surface emitting laser device according to a fifth embodiment of the present technology.
Figure 59:
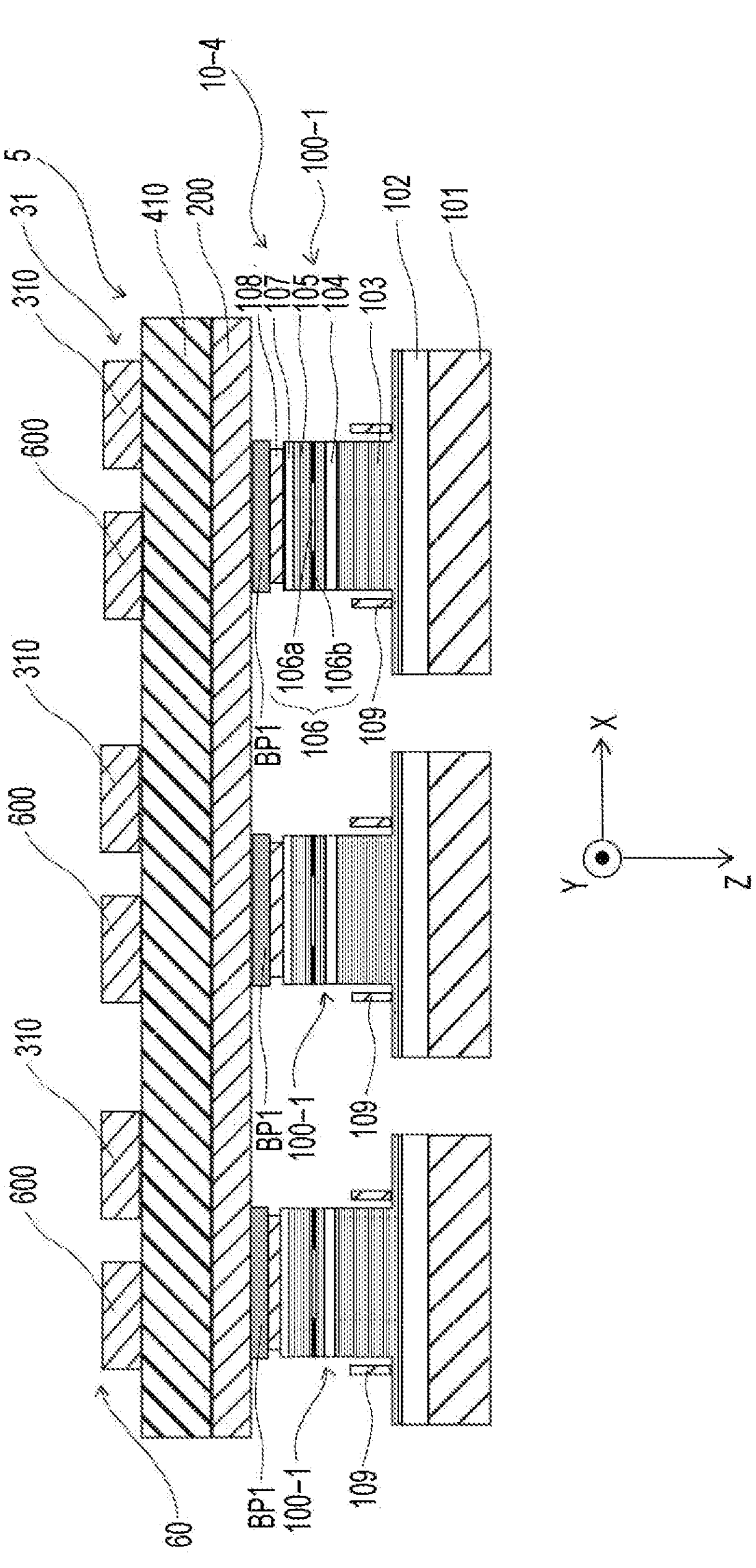
FIG. 59 is a cross-sectional view taken along line A-A of FIG. 58.
Figure 60:
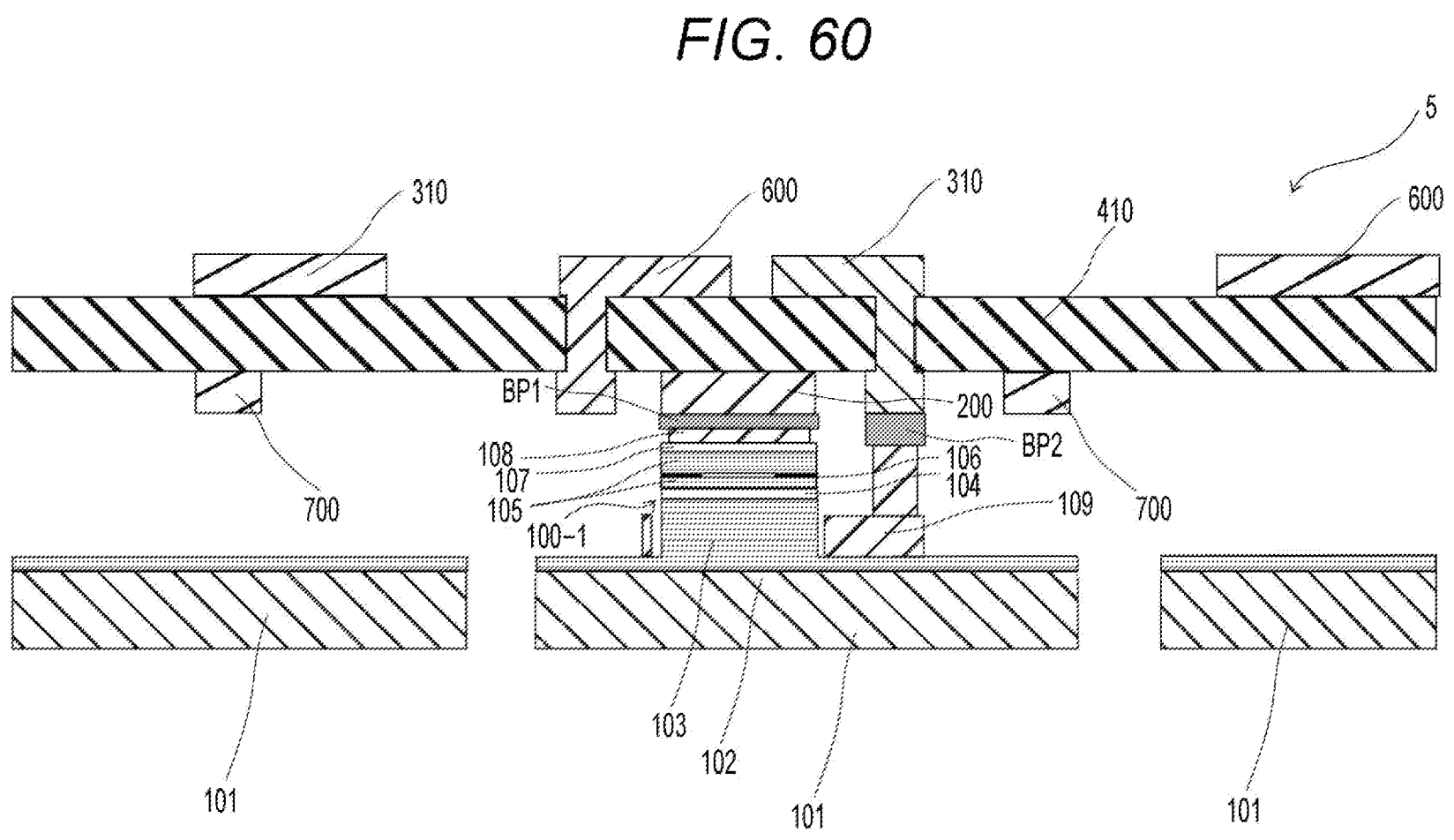

FIG. 58 is an extracted plan view illustrating a part of a surface emitting laser device 5 including a surface emitting laser array 10-5 according to a fifth embodiment of the present technology. FIG. 59 is a cross-sectional view taken along line A-A in FIG. 58. FIG. 60 is a cross-sectional view taken along line B-B in FIG. 58.

The surface emitting laser device 5 is a modification of the surface emitting laser device 2 of the second embodiment.

As illustrated in FIGS. 58 to 60, the surface emitting laser device 5 does not include a conductor 500, but includes a plurality of third wiring lines 600 and a plurality of third wiring lines 700 connected to a reference potential (for example, ground), and a board 101 is divided for each light emitting unit row (a Y light emitting unit group).

As illustrated in FIG. 60, each third wiring line 600 substantially functions as a conductor connected to a reference potential (for example, ground) and formed on a second board 410 along at least a part of a first wiring line 200 and at least a part of a second wiring line 310.

As illustrated in FIG. 60, a plurality of third wiring lines 700 is provided on the second board 410 and is insulated from both a first wiring group 20 and a second wiring group 31.

As an example, as illustrated in FIG. 58, the third wiring line 700 is provided for each of a plurality of X light emitting unit groups aligned in the Y direction and each including a plurality of light emitting units 100-1 aligned in the X direction. As illustrated in FIG. 60, each third wiring line 700 is provided along at least a part of the second wiring line 310 and at least a part of a second electrode group including a plurality of second electrodes 109 aligned in the X direction, on a surface of the second board 410 on the first board 101 side, and substantially functions as a conductor connected to a reference potential (for example, ground).

The surface emitting laser device 5 can be manufactured by a manufacturing method according to the manufacturing method for the surface emitting laser device 2 of the second embodiment. The surface emitting laser device 5 also has an effect similar to that the surface emitting laser device 2 of the second embodiment.

11. <Surface Emitting Laser Device According to Sixth Embodiment of Present Technology>

Figure 61:
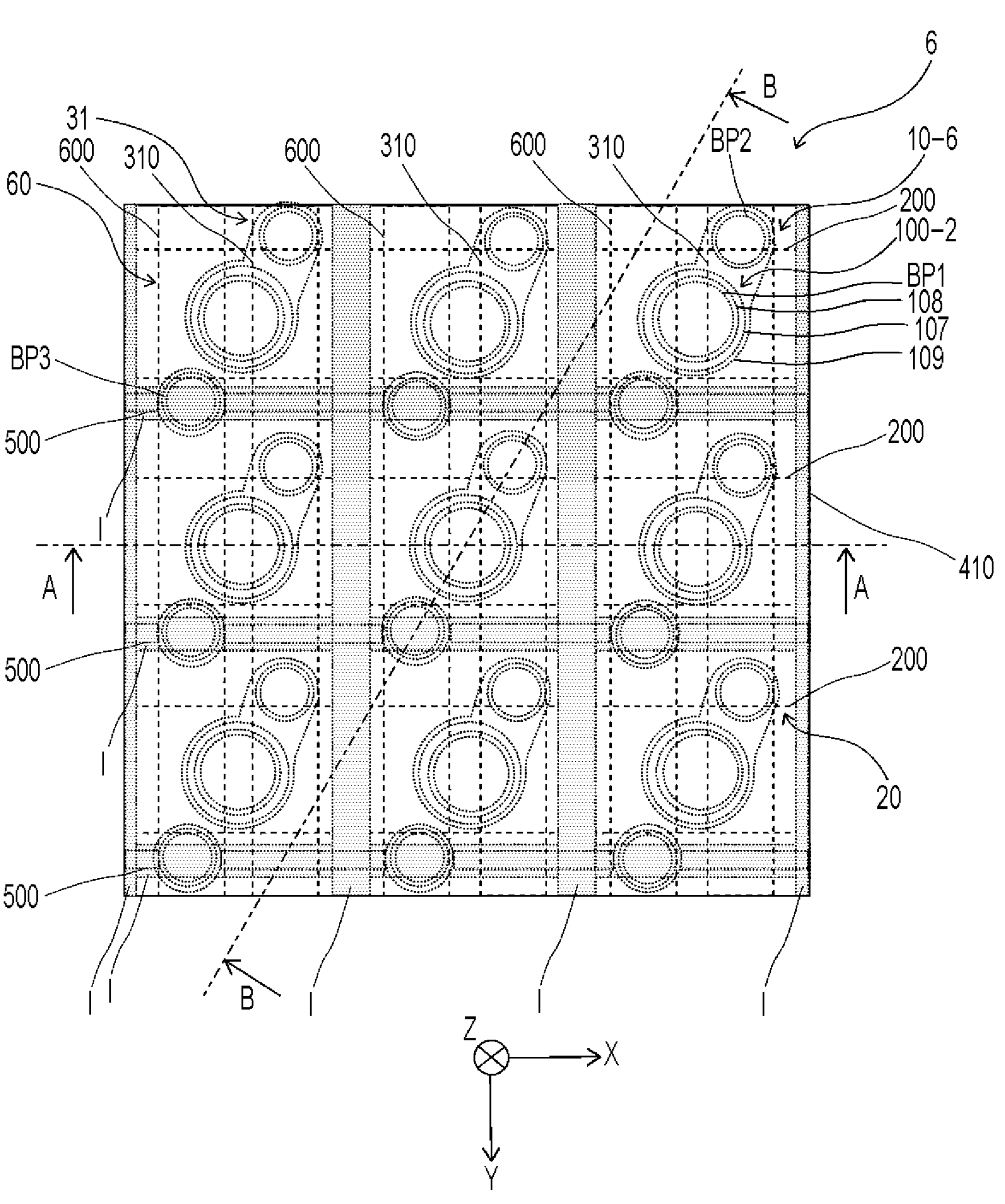
FIG. 61 is an extracted plan view illustrating a part of a surface emitting laser device according to a sixth embodiment of the present technology.
Figure 62:
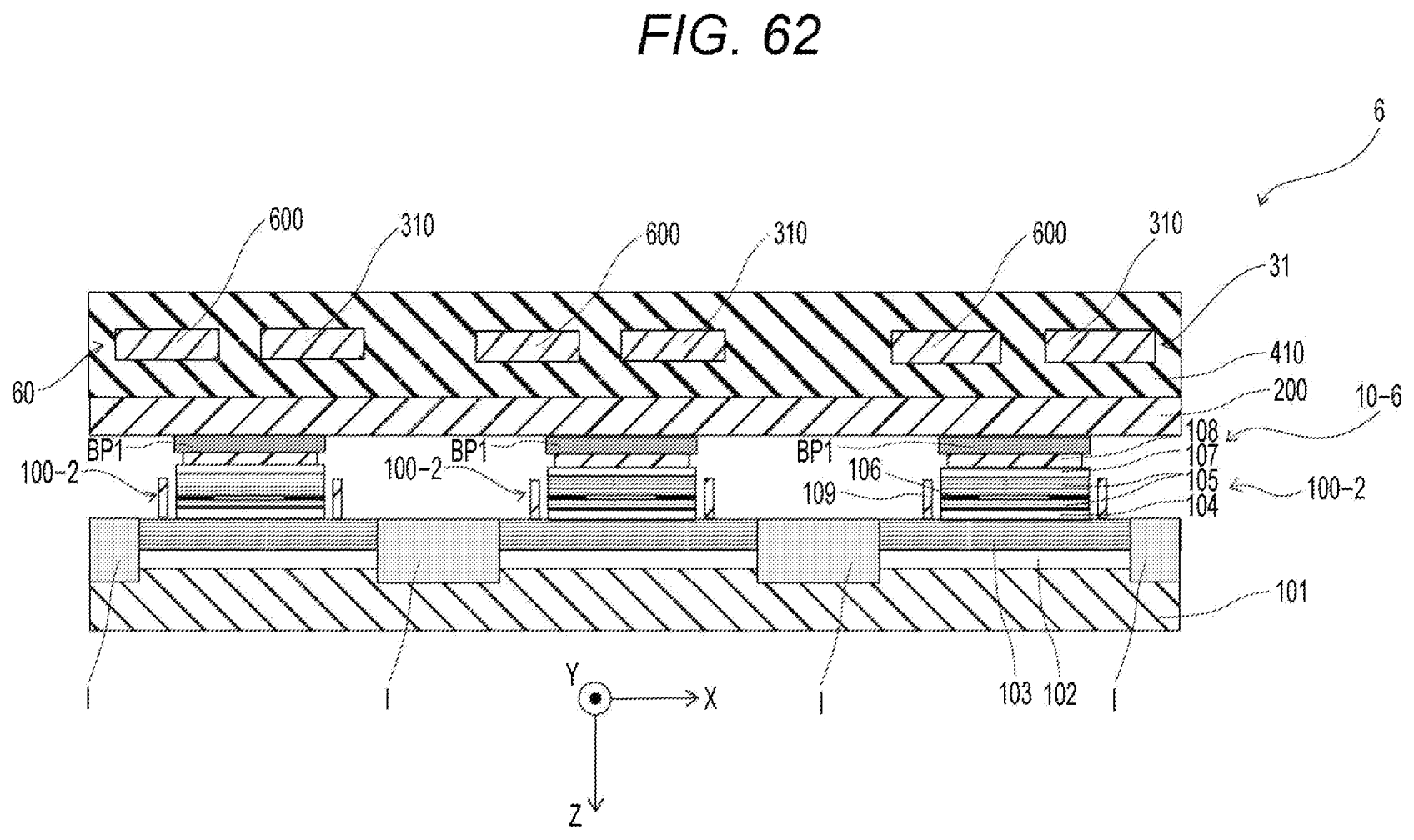
Figure 63:
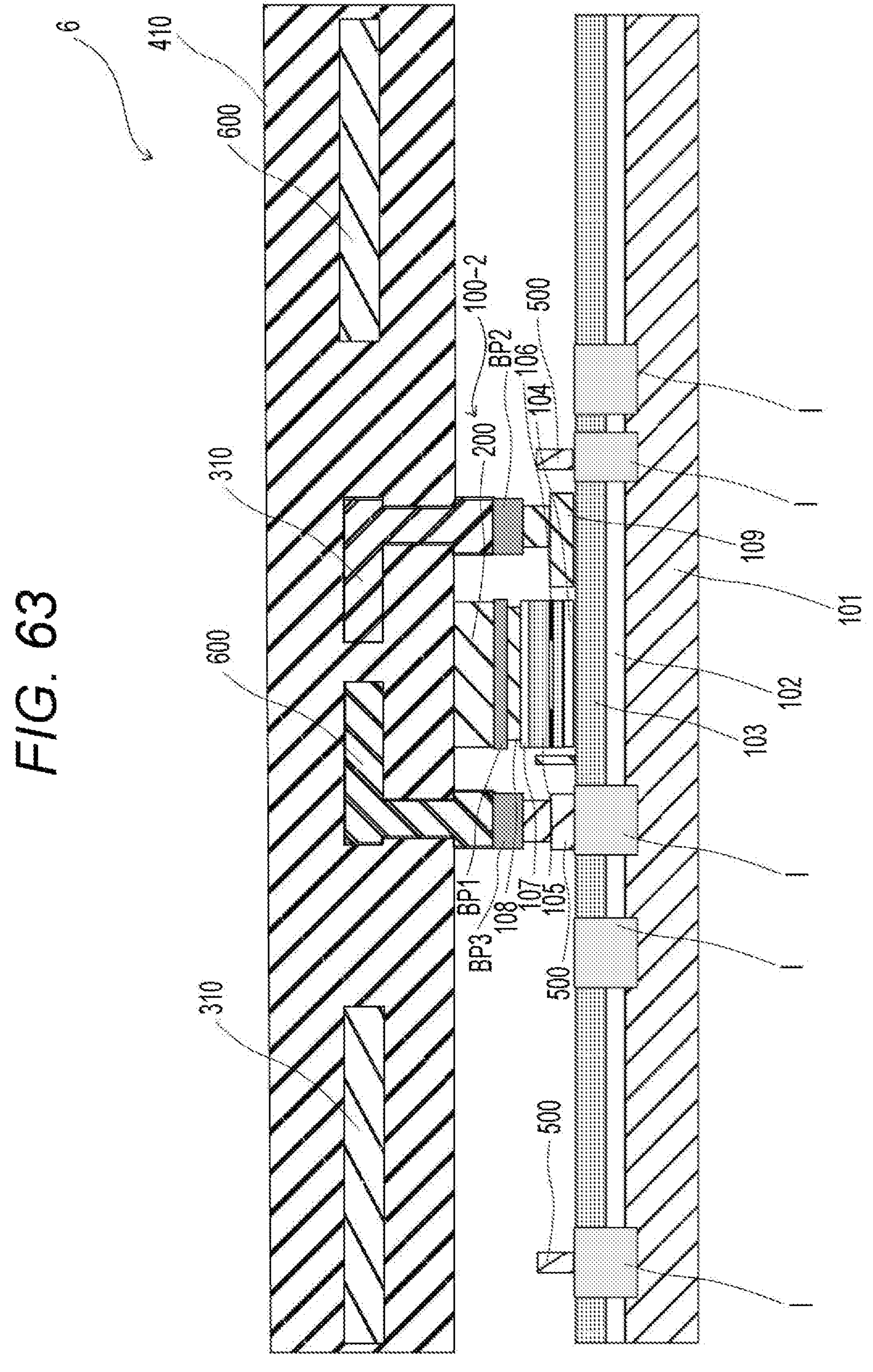
FIG. 63 is a cross-sectional view taken along line B-B in FIG. 61.

FIG. 61 is an extracted plan view illustrating a part of a surface emitting laser device 6 including a surface emitting laser array 10-6 according to a sixth embodiment of the present technology. FIG. 62 is a cross-sectional view taken along line A-A in FIG. 61. FIG. 63 is a cross-sectional view taken along line B-B in FIG. 61.

The surface emitting laser device 6 is a modification of the surface emitting laser device 4 of the fourth embodiment.

In the surface emitting laser device 6, as illustrated in FIGS. 61 to 63, each second wiring line 310 of a second wiring group 31 and each third wiring line 600 of a third wiring group 60 are embedded in a second board 410. As a result, the second wiring group 31 and the third wiring group 60 are protected.

The surface emitting laser device 6 can be manufactured by a manufacturing method according to the manufacturing method for the surface emitting laser device 4 of the fourth embodiment. However, when a wiring board including the second board 410, the second wiring group 31, and the third wiring group 60 is generated, for example, it is necessary to perform, at least once, a step of layering and etching a board material, forming an opening, and embedding a wiring material into the opening. The surface emitting laser device 6 also has an effect similar to that the surface emitting laser device 4 of the fourth embodiment.

12. <Surface Emitting Laser Device According to Seventh Embodiment of Present Technology>

Figure 64:
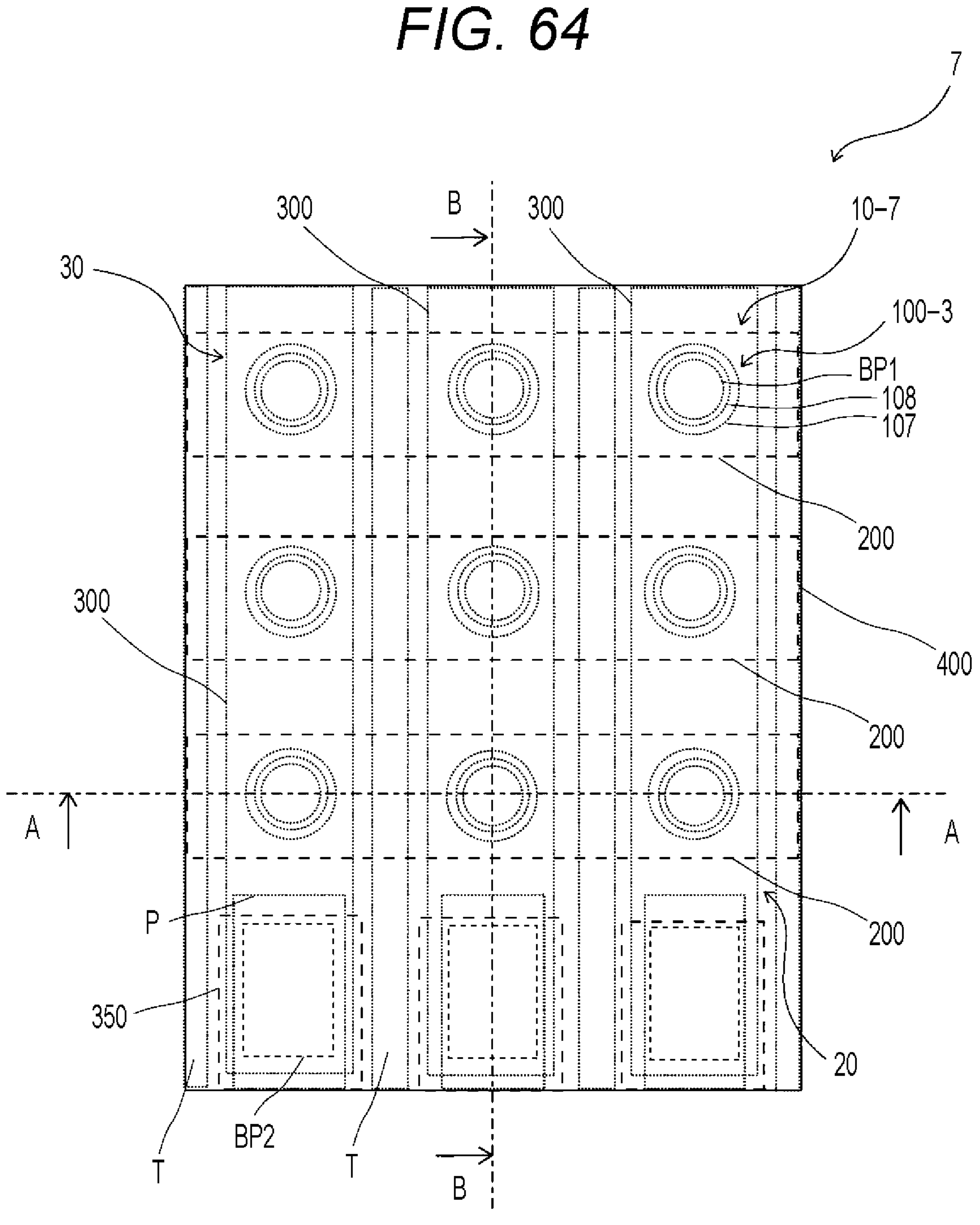
FIG. 64 is an extracted plan view illustrating a part of a surface emitting laser device according to a seventh embodiment of the present technology.
Figure 65:
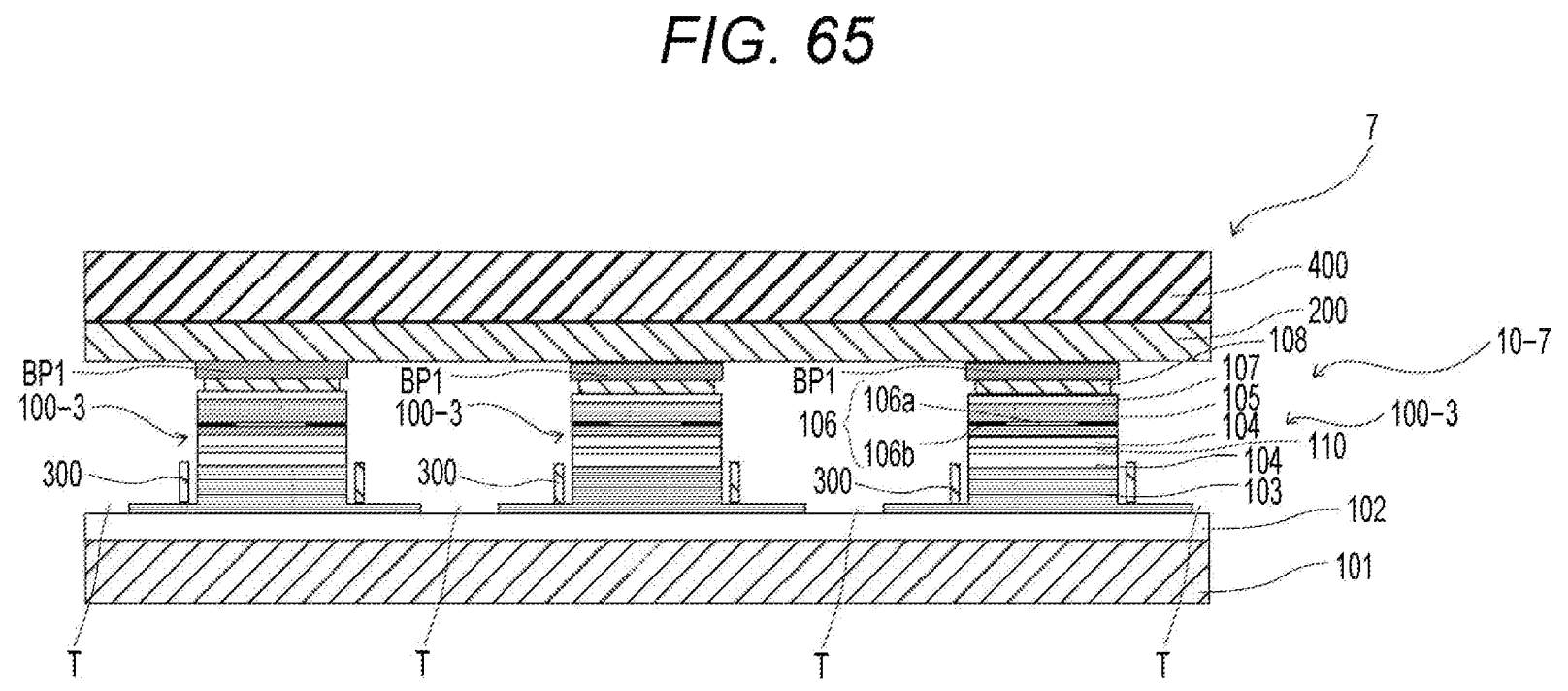
Figure 66:
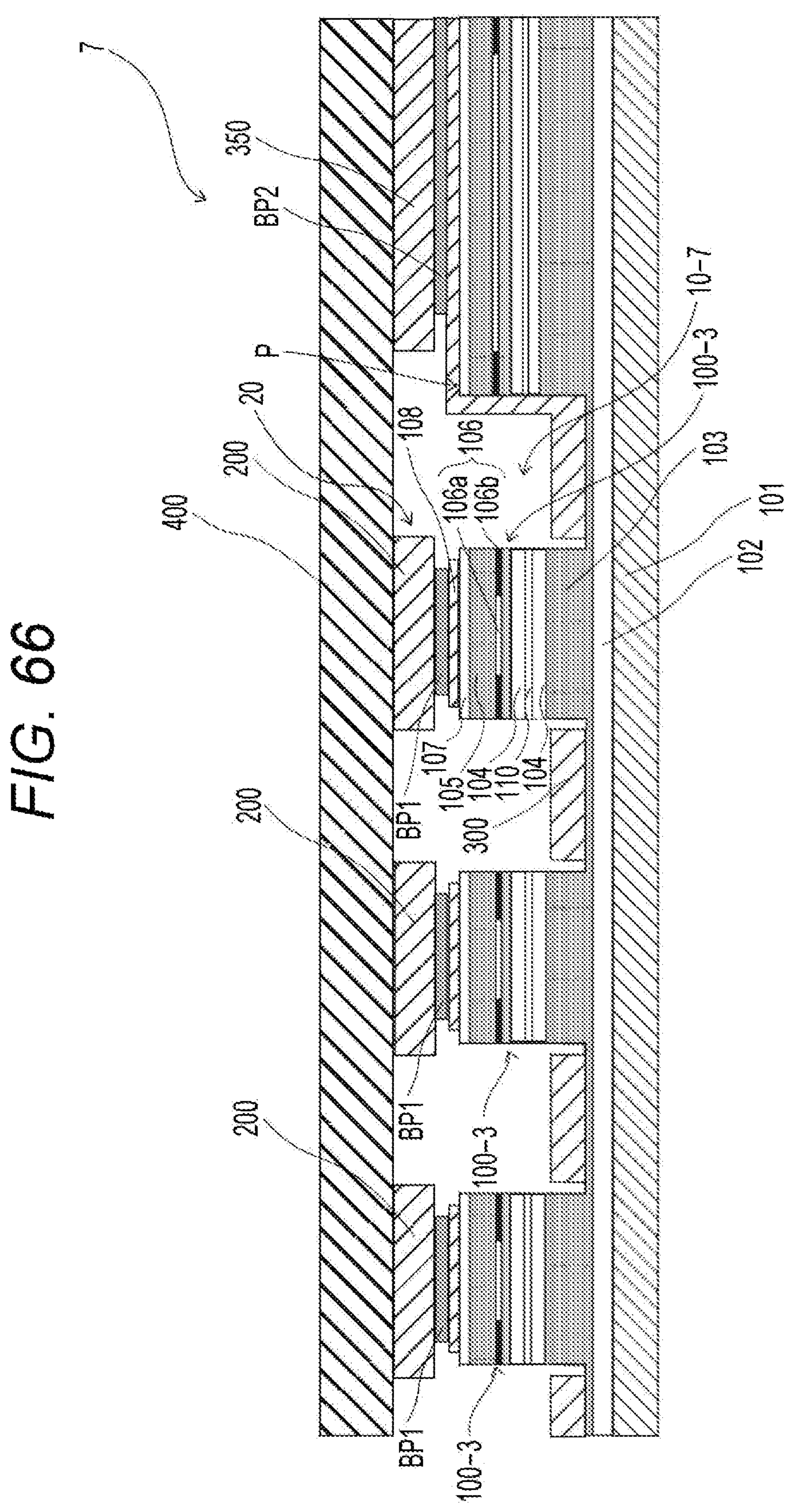
FIG. 66 is a cross-sectional view taken along line B-B in FIG. 64.

FIG. 64 is an extracted plan view illustrating a part of a surface emitting laser device 7 according to a seventh embodiment of the present technology. FIG. 65 is a cross-sectional view taken along line A-A in FIG. 64. FIG. 66 is a cross-sectional view taken along line B-B in FIG. 64.

The surface emitting laser device 7 is a modification of the surface emitting laser device 1 of the first embodiment.

In a surface emitting laser array 10-7 of the surface emitting laser device 7, as illustrated in FIGS. 64 to 66, each light emitting unit 100-3 has a layered structure including a plurality of (for example, two) active layers 104 layered on one another and a tunnel junction 110 disposed between two active layers adjacent in a layering direction among the plurality of active layers 104. The tunnel junction 110 includes a p-type semiconductor layer and an n-type semiconductor layer layered on one another.

The surface emitting laser device 7 has the layered structure described above, and resistance of a first wiring group 20 and a second wiring group 30 is reduced. Therefore, a surface emitting laser having excellent luminous efficiency and a small output loss can be achieved, and it is possible to obtain a high laser light output while suppressing deterioration depending on a current amount, such as electromigration. Moreover, a surface emitting laser and a surface emitting laser array having a smaller size can be achieved.

The surface emitting laser device 7 can be manufactured by a manufacturing method according to the manufacturing method for the surface emitting laser device 1 of the first embodiment. However, at the time of manufacturing, after a buffer layer 102 and a first multilayer film reflector 103 are layered on a first board 101, the active layer 104, the tunnel junction 110, and the active layer 104 need to be sequentially layered.

13. <Surface Emitting Laser Device According to Eighth Embodiment of Present Technology>

Figure 67:
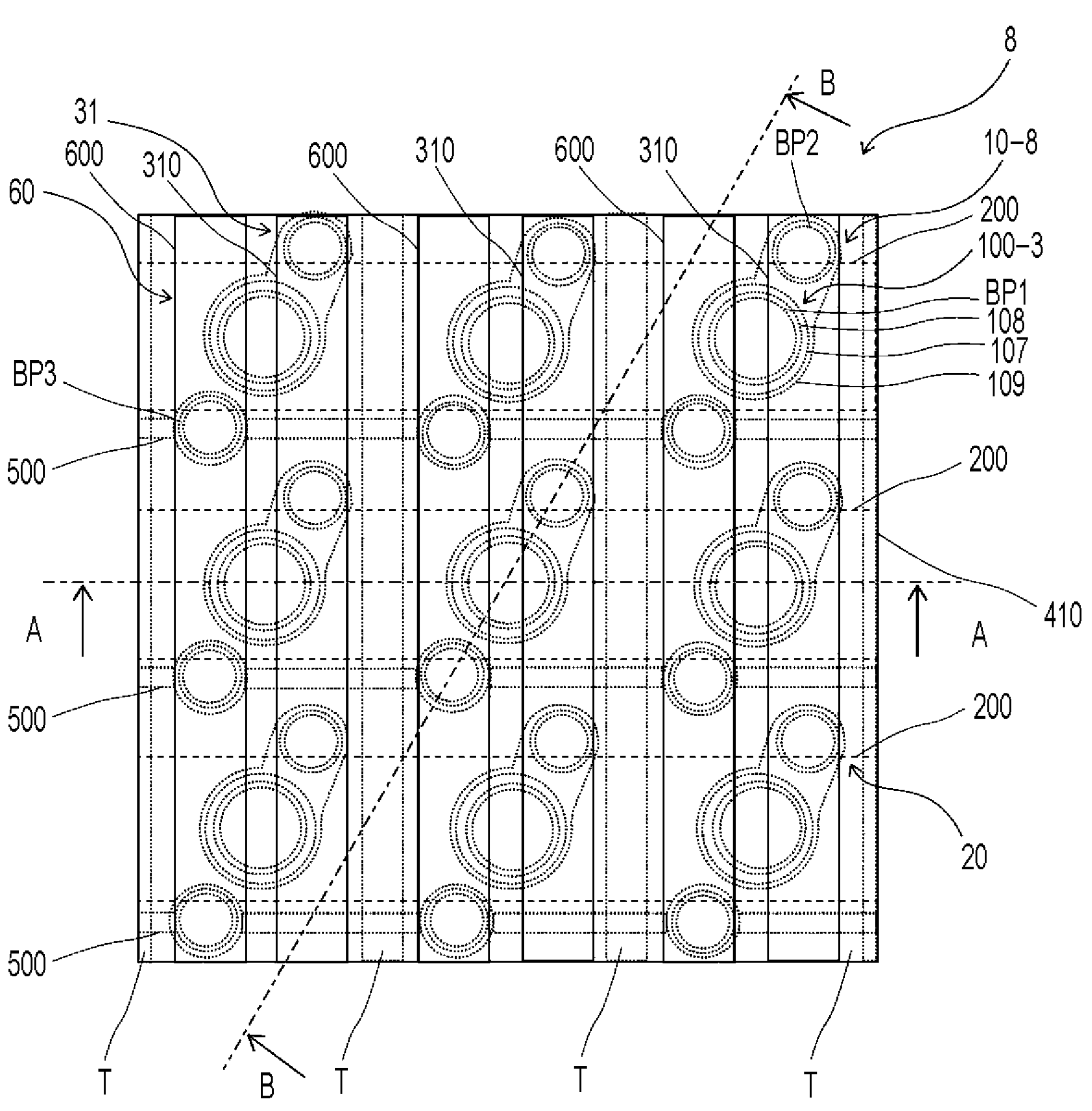
FIG. 67 is an extracted plan view illustrating a part of a surface emitting laser device according to an eighth embodiment of the present technology.
Figure 68:
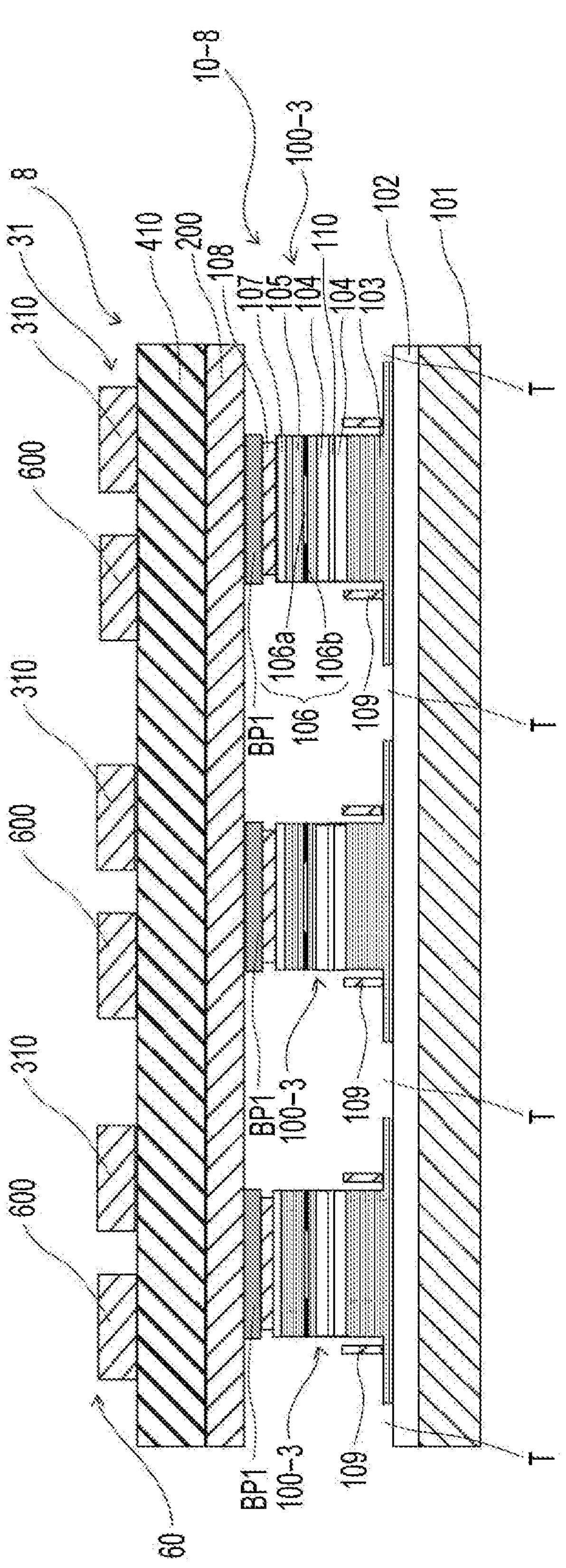
FIG. 68 is a cross-sectional view taken along line A-A of FIG. 67.
Figure 69:
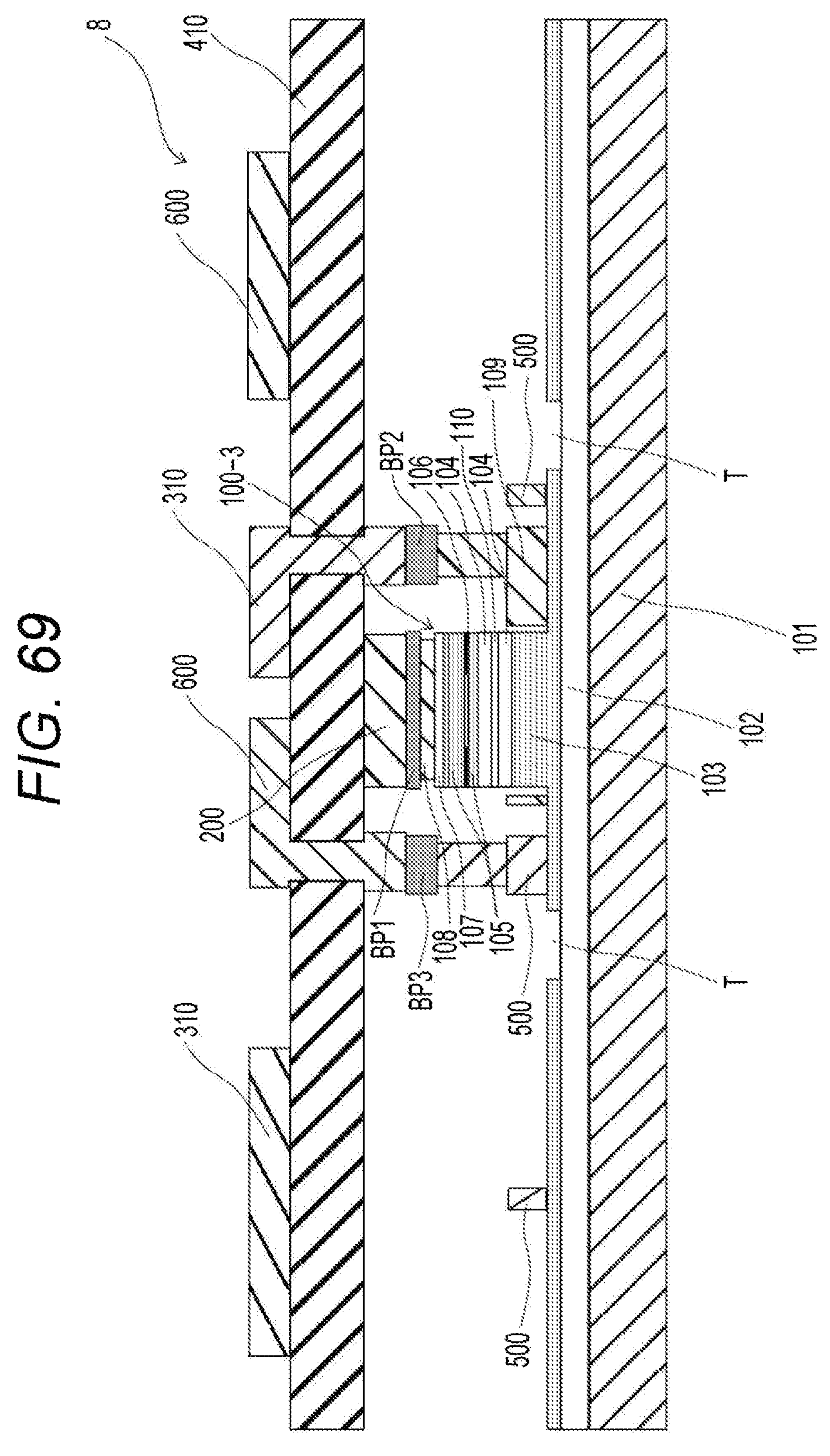
FIG. 69 is a cross-sectional view taken along line B-B in FIG. 67.

FIG. 67 is an extracted plan view illustrating a part of a surface emitting laser device 8 according to an eighth embodiment of the present technology. FIG. 68 is a cross-sectional view taken along line A-A in FIG. 67. FIG. 69 is a cross-sectional view taken along line B-B in FIG. 67.

The surface emitting laser device 8 is a modification of the surface emitting laser device 2 of the second embodiment.

In a surface emitting laser array 10-8 of the surface emitting laser device 8, as illustrated in FIGS. 67 to 69, each light emitting unit 100-3 has a layered structure including a plurality of (for example, two) active layers 104 layered on one another and a tunnel junction 110 disposed between two active layers adjacent in a layering direction among the plurality of active layers 104. The tunnel junction 110 includes a p-type semiconductor layer and an n-type semiconductor layer layered on one another.

According to the surface emitting laser device 8, the layered structure described above is included, and resistance of a first wiring group 20 and a second wiring group 30 is reduced. Therefore, a surface emitting laser having excellent luminous efficiency and a small output loss can be achieved, and it is possible to obtain a high laser light output while suppressing deterioration depending on a current amount, such as electromigration. Moreover, a surface emitting laser and a surface emitting laser array having a smaller size can be achieved.

The surface emitting laser device 8 can be manufactured by a manufacturing method according to the manufacturing method for the surface emitting laser device 2 of the second embodiment. However, at the time of manufacturing, after a buffer layer 102 and a first multilayer film reflector 103 are layered on a first board 101, the active layer 104, the tunnel junction 110, and the active layer 104 need to be sequentially layered.

14. <Surface Emitting Laser Device According to Ninth Embodiment of Present Technology>

Figure 70:
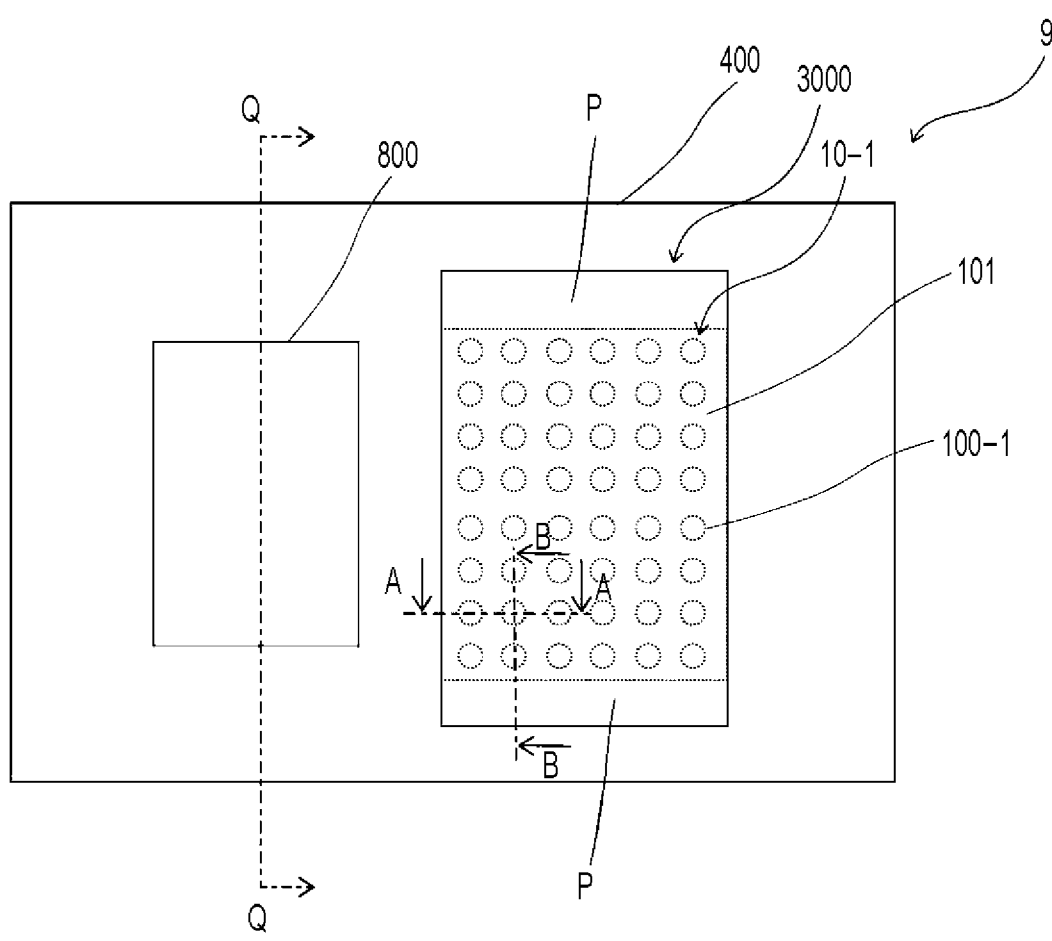
FIG. 70 is a plan view of a surface emitting laser device according to a ninth embodiment of the present technology.
Figure 71:
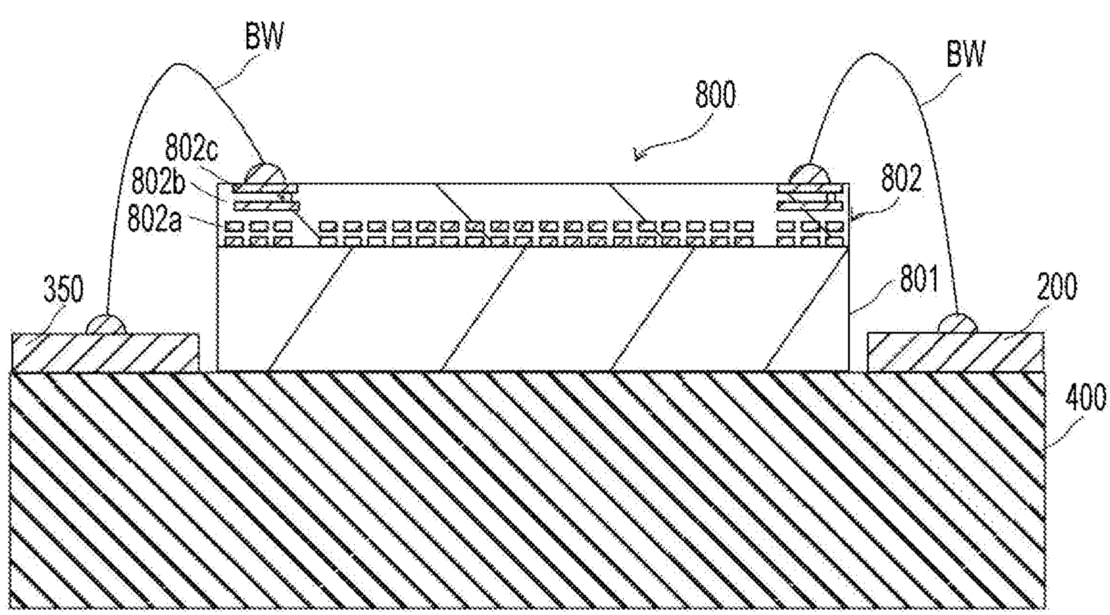
FIG. 71 is a cross-sectional view taken along line Q-Q in FIG. 70.

FIG. 70 is a plan view of a surface emitting laser device 9 according to a ninth embodiment of the present technology. FIG. 71 is a cross-sectional view taken along line Q-Q in FIG. 70. FIG. 70 is a plan view as viewed from an emission side of a surface emitting laser array 10-1 (a back surface side of a first board 101).

The surface emitting laser device 9 is a modification of the surface emitting laser device 1 of the first embodiment. A cross section taken along line A-A in FIG. 70 corresponds to a cross section taken along line A-A in FIG. 1, and a cross section taken along line B-B in FIG. 70 corresponds to a cross section taken along line B-B in FIG. 1.

As an example, the surface emitting laser device 9 includes a second board 400, a surface emitting laser array chip 3000 including the surface emitting laser array 10-1, and a laser driver 800 (an electronic circuit).

The surface emitting laser array 10-1 and the laser driver 800 are mounted on a surface of the second board 400 on the first board 101 side by flip chip (for example, junction down). The second board 400 is provided with a first wiring group 20 and a second wiring group 30 (see FIGS. 1 to 3).

As an example, the surface emitting laser array chip 3000 includes pedestal portions P on one side and another side of the surface emitting laser array 10-1.

(Laser Driver)

The laser driver 800 controls each light emitting unit 100-1 of the surface emitting laser array 10-1. The laser driver 800 causes at least some of a plurality of light emitting units 100-1 to emit light by independently driving the plurality of light emitting units 100-1. The laser driver 800 drives, for example, at least some light emitting units 100-1 selected by a system controller 4000 (see FIG. 74) as described later, among the plurality of light emitting units 100-1.

As illustrated in FIG. 71, the laser driver 800 includes a semiconductor board 801 (for example, Si board) on which a driver IC is formed, and a wiring layer 802 layered on the semiconductor board 801.

As an example, the driver IC includes an NMOS driver that controls a voltage applied to the surface emitting laser array 10-1. This NMOS driver generates a drive pulse for performing light emission and extinction of the plurality of light emitting units 100-1 of the surface emitting laser array 10-1. This NMOS driver is electrically connected to the surface emitting laser array 10-1 via the wiring layer 802, the first wiring group 20, the second wiring group 30, and each wiring line 350.

The wiring layer 802 is joined to the plurality of light emitting units 100-1 via the first wiring group 20, the second wiring group 30, and each wiring line 350. The wiring layer 802 includes, for example, a plurality of metal layers **802*a* and a plurality of connection pads 802*c*, in an insulating layer 802*b***.

The plurality of metal layers **802*a* electrically connects the NMOS driver in the semiconductor board 801 and the plurality of connection pads 802*c***.

The plurality of connection pads **802*c* is electrically connected to a first wiring line 200 and the wiring line 350** via, for example, a bonding wire BW.

Note that, in the ninth embodiment, the surface emitting laser array 10-1 of the first embodiment and the laser driver 800 are mounted on the second board 400, but similarly, a surface emitting laser array of another embodiment and the laser driver 800 may be mounted on the second board. At this time, at least one of a conductor 500, the third wiring line 600, or third wiring line 700 is preferably mounted on the first board 101 and/or the second board.

Figure 72:
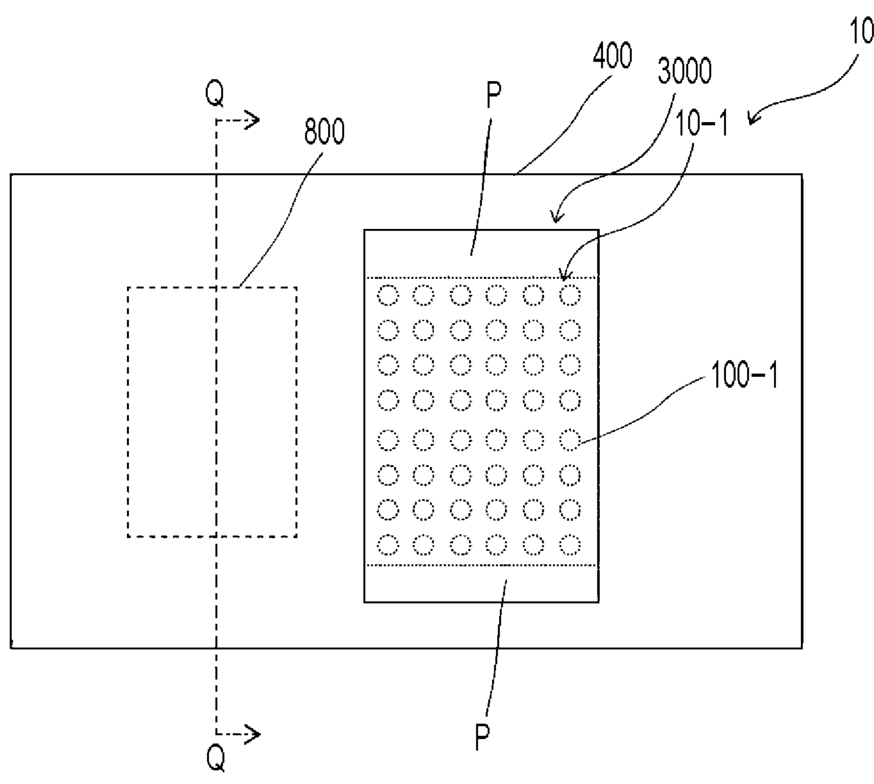
FIG. 72 is a plan view of a surface emitting laser device according to a tenth embodiment of the present technology.
Figure 73:
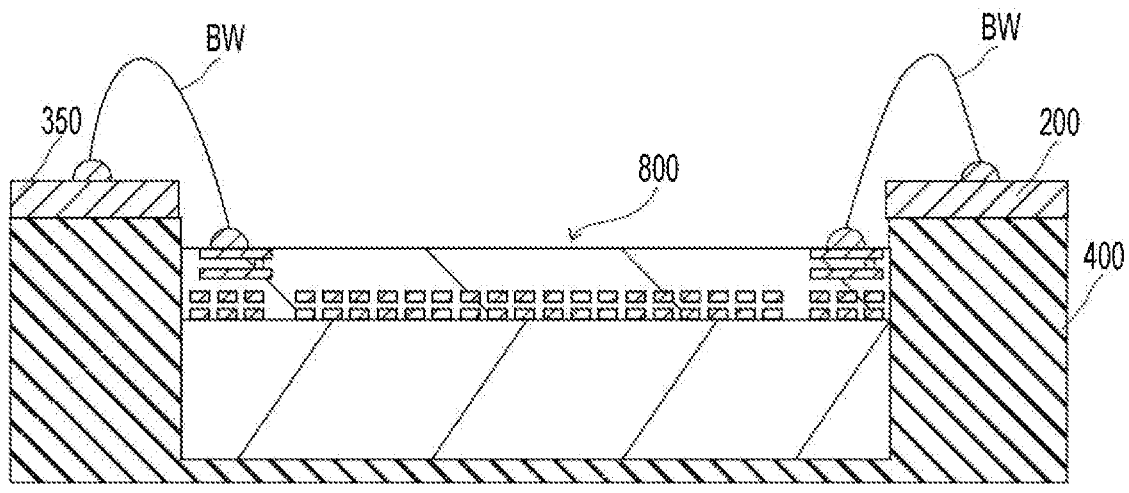
FIG. 73 is a cross-sectional view taken along line Q-Q in FIG. 72.

15. Surface Emitting Laser Device According to Tenth Embodiment of Present Technology FIG. 72 is a plan view of a surface emitting laser device 10 according to a tenth embodiment of the present technology. FIG. 73 is a cross-sectional view taken along line Q-Q in FIG. 72. FIG. 73 is a plan view as viewed from an emission side of a surface emitting laser array 10-1 (a back surface side of a first board 101).

The surface emitting laser device 10 is a modification of the surface emitting laser device 9 of the ninth embodiment.

As illustrated in FIGS. 72 and 73, the surface emitting laser device 10 has a configuration similar to that of the surface emitting laser device 9 except that a laser driver 800 is disposed in a second board 400.

Note that, in the tenth embodiment, the surface emitting laser array 10-1 of the first embodiment and the laser driver 800 are mounted on the second board 400, but similarly, a surface emitting laser array of another embodiment and the laser driver 800 may be mounted on the second board. At this time, at least one of a conductor 500, the third wiring line 600, or third wiring line 700 is preferably mounted on the first board 101 and/or the second board.

16. <Surface Emitting Laser Device According to Eleventh Embodiment of Present Technology>

Figure 74:
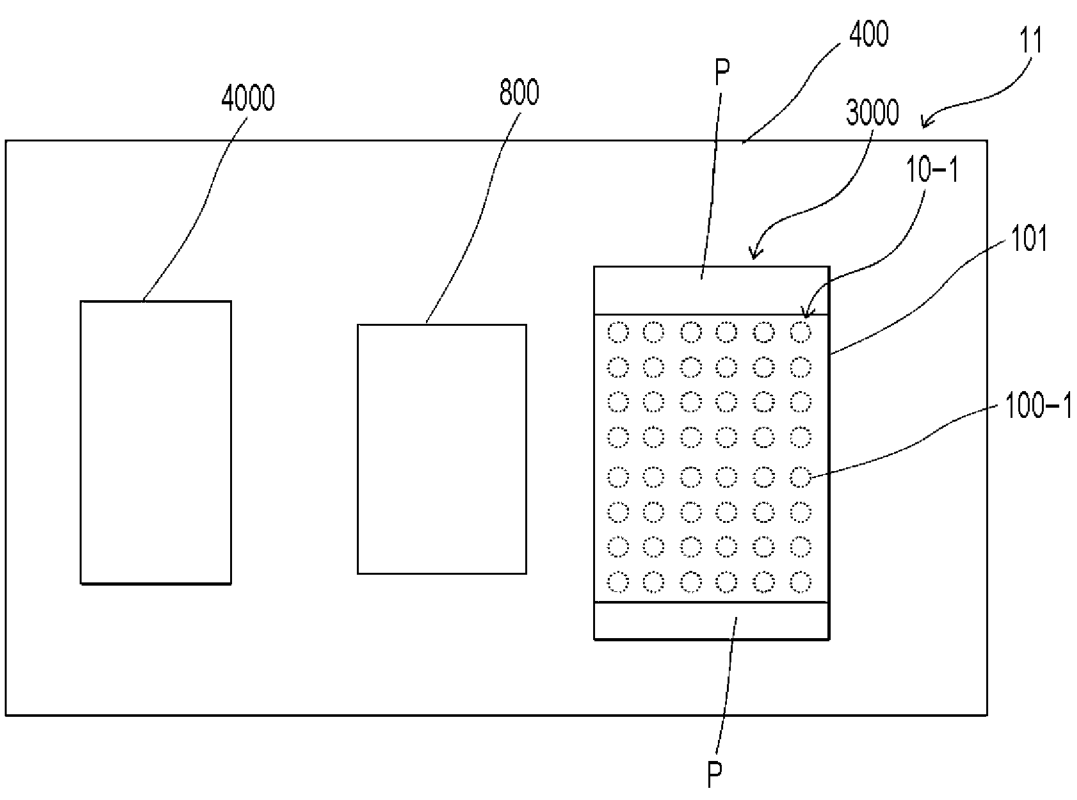
FIG. 74 is a plan view of a surface emitting laser device according to an eleventh embodiment of the present technology.

FIG. 74 is a plan view of a surface emitting laser device 11 according to an eleventh embodiment of the present technology. FIG. 74 is a plan view as viewed from an emission side of a surface emitting laser array 10-1 (a back surface side of a first board 101).

The surface emitting laser device 11 is a modification of the surface emitting laser device 9 of the ninth embodiment.

In the surface emitting laser device 11, a second board 400 is a printed wiring board.

On the second board 400, a surface emitting laser array chip 3000, a laser driver 800, and a system controller 4000 are mounted. The surface emitting laser array chip 3000 and the laser driver 800 are mounted on a surface of the second board 400 on the first board 101 side by flip chip (for example, junction down). As an example, the system controller 4000 is mounted on a surface of the second board 400 on the first board 101 side by wire bonding or flip chip.

Note that, in the eleventh embodiment, the surface emitting laser array 10-1 of the first embodiment, the laser driver 800, and the system controller 4000 are mounted on the second board 400, but similarly, a surface emitting laser array of another embodiment, the laser driver 800, and the system controller 4000 may be mounted on the second board. At this time, at least one of a conductor 500, the third wiring line 600, or third wiring line 700 is preferably mounted on the first board 101 and/or the second board.

17. <Modification of Present Technology>

The surface emitting laser device according to the present technology is not limited to the configuration described in each of the embodiments described above, and can be appropriately changed.

Figure 75:
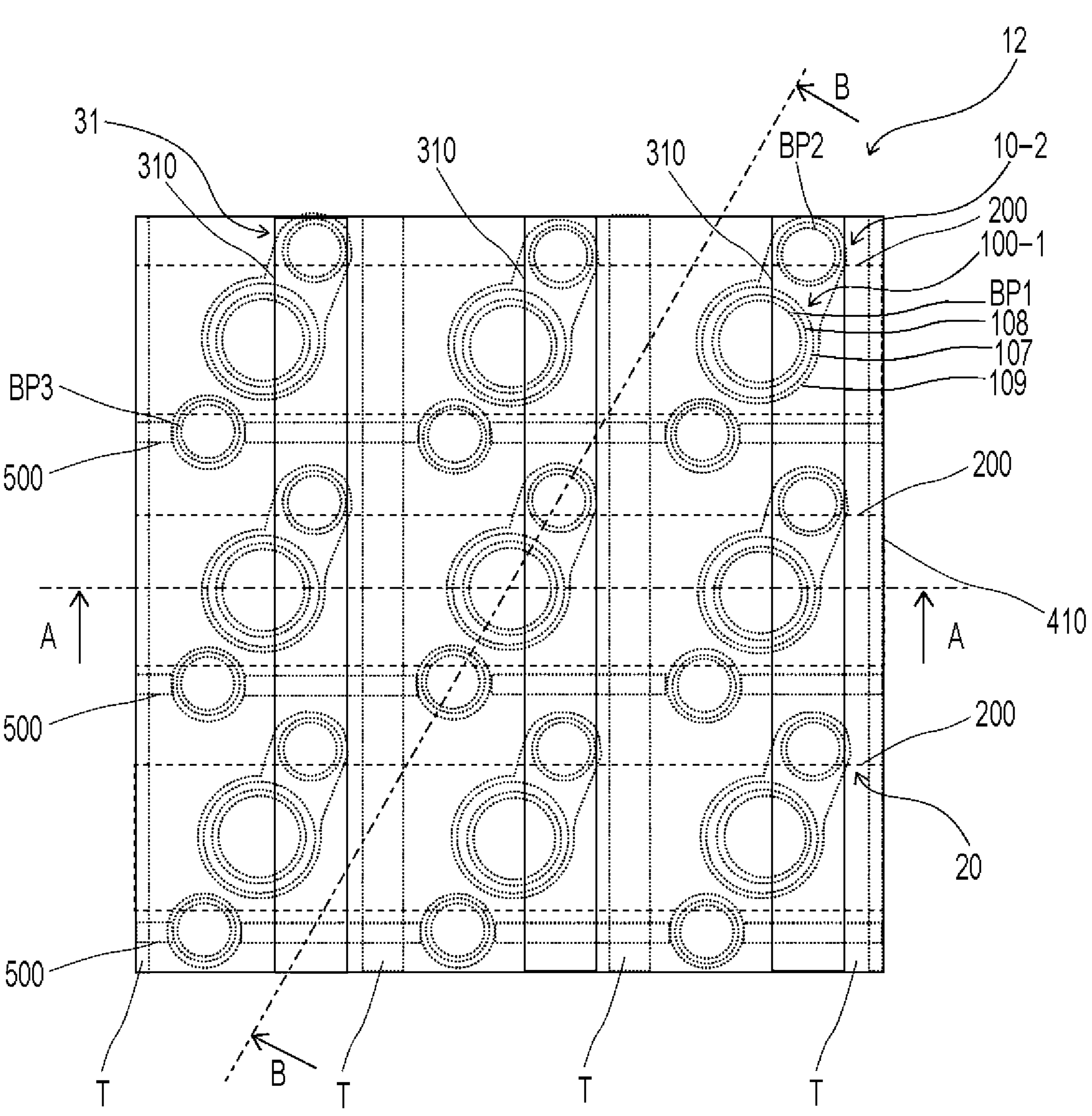
FIG. 75 is an extracted plan view illustrating a part of a surface emitting laser device according to Modification 1 of the second embodiment of the present technology.
Figure 76:
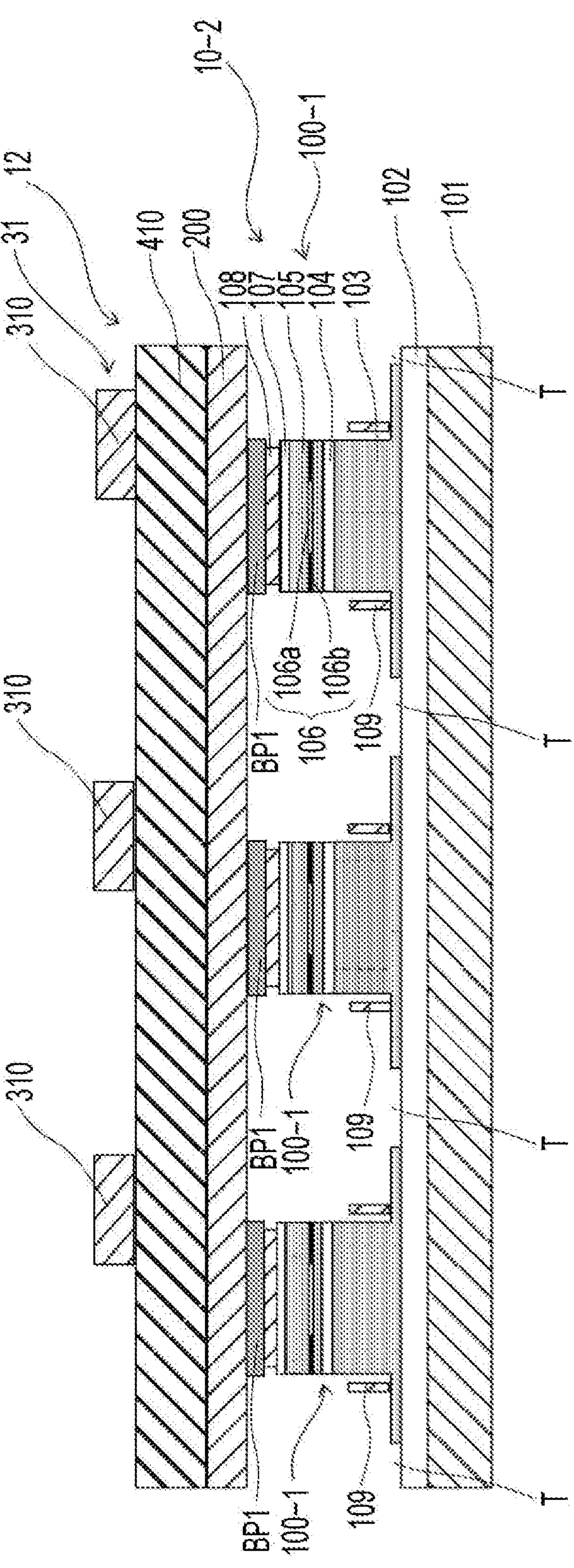
FIG. 76 is a cross-sectional view taken along line A-A of FIG. 75.
Figure 77:
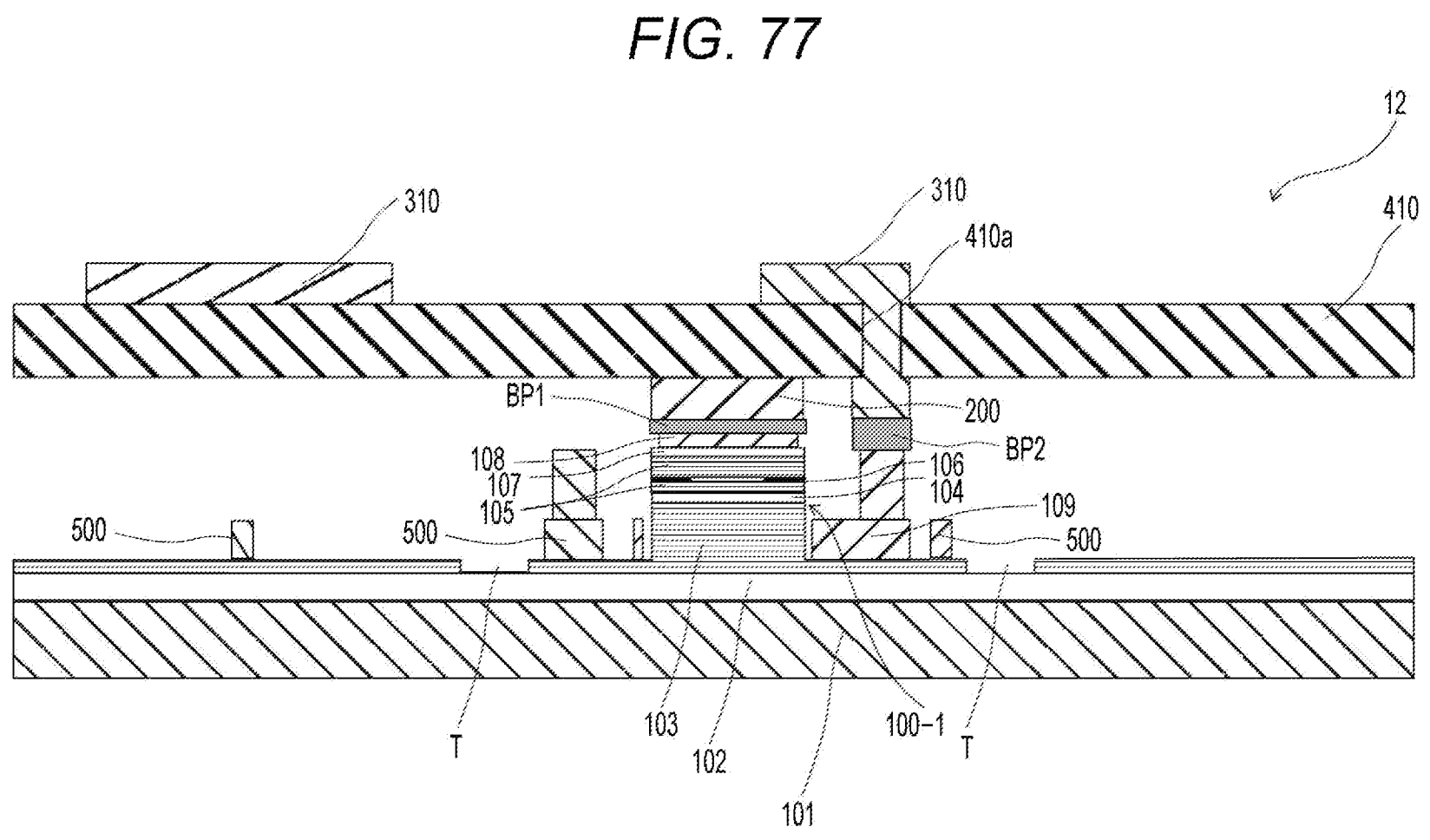

For example, as in a surface emitting laser device-12 according to Modification 1 of the second embodiment illustrated in FIGS. 75 to 77, the third wiring line 600 may not be provided on the second board 410. In this case, the third wiring line 600 is not provided, a wiring step is simplified, and a space is formed on a surface of the second board 410 on the first board 101 side and on a surface on a side opposite to the first board 101 side. Therefore, for example, it is possible to reduce resistance by increasing a line width of the first wiring line 200 and/or the wiring line 350. However, in this case, it is preferable to separately connect the conductor 500 to a reference potential (for example, ground).

Figure 78:
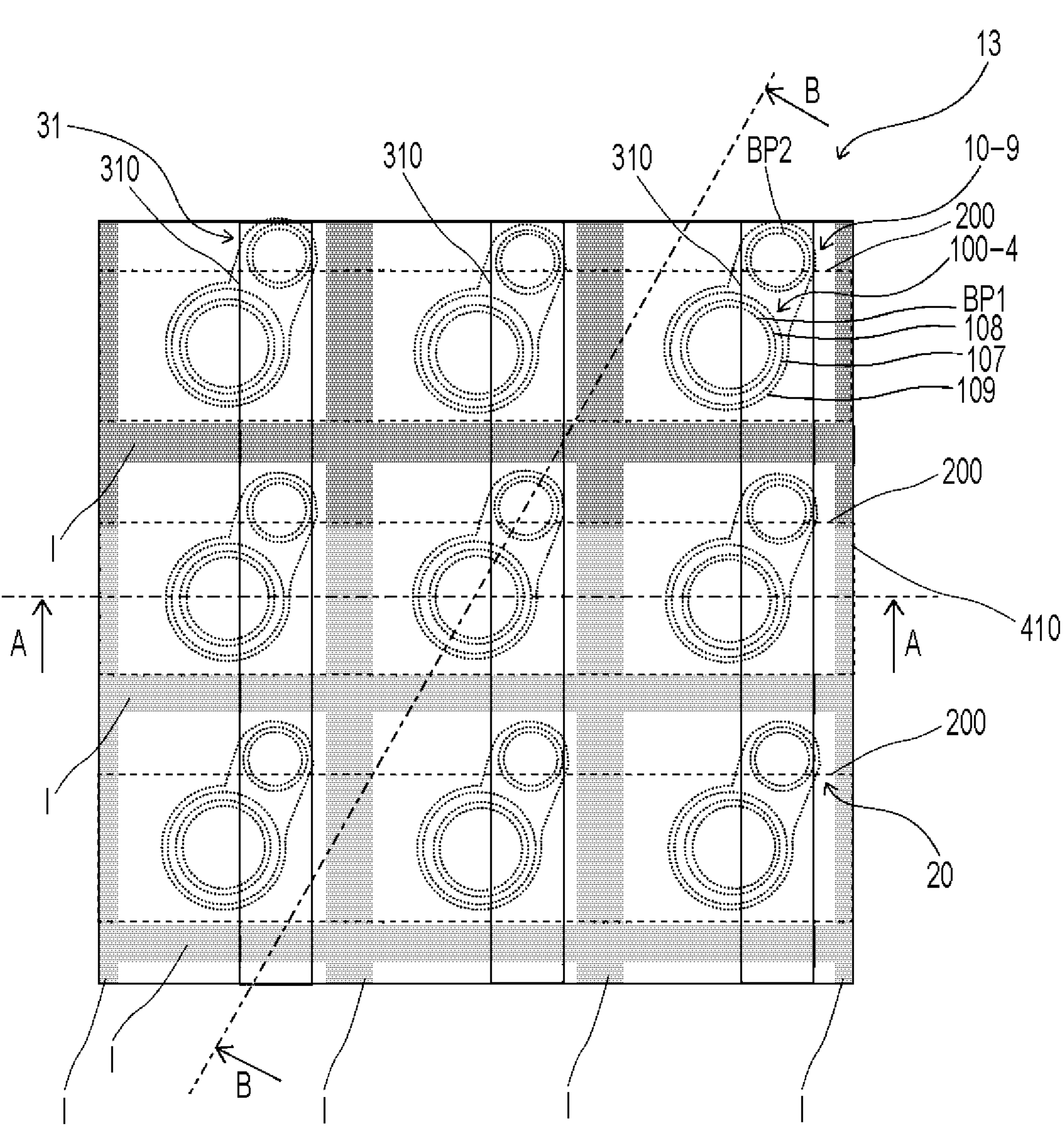
FIG. 78 is an extracted plan view illustrating a part of a surface emitting laser device according to Modification 2 of the second embodiment of the present technology.
Figure 79:
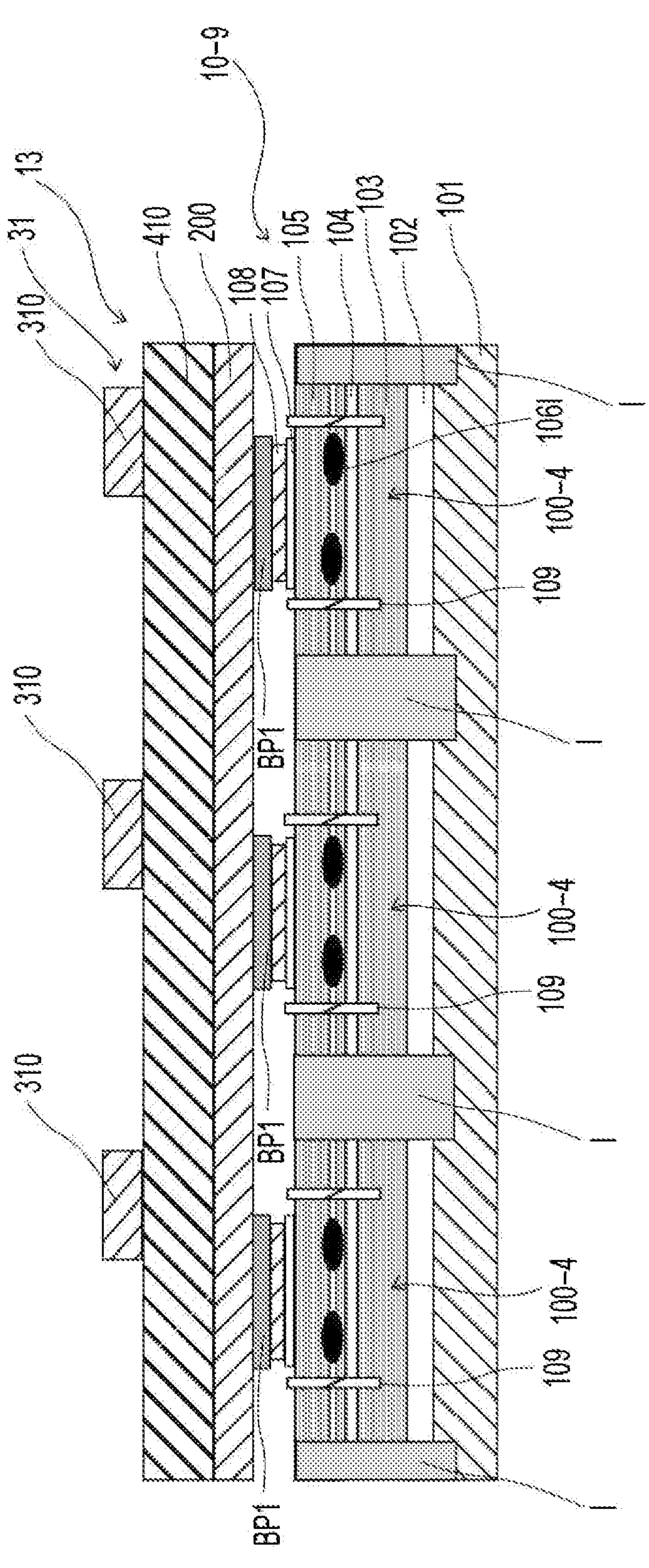
FIG. 79 is a cross-sectional view taken along line A-A of FIG. 78.
Figure 80:
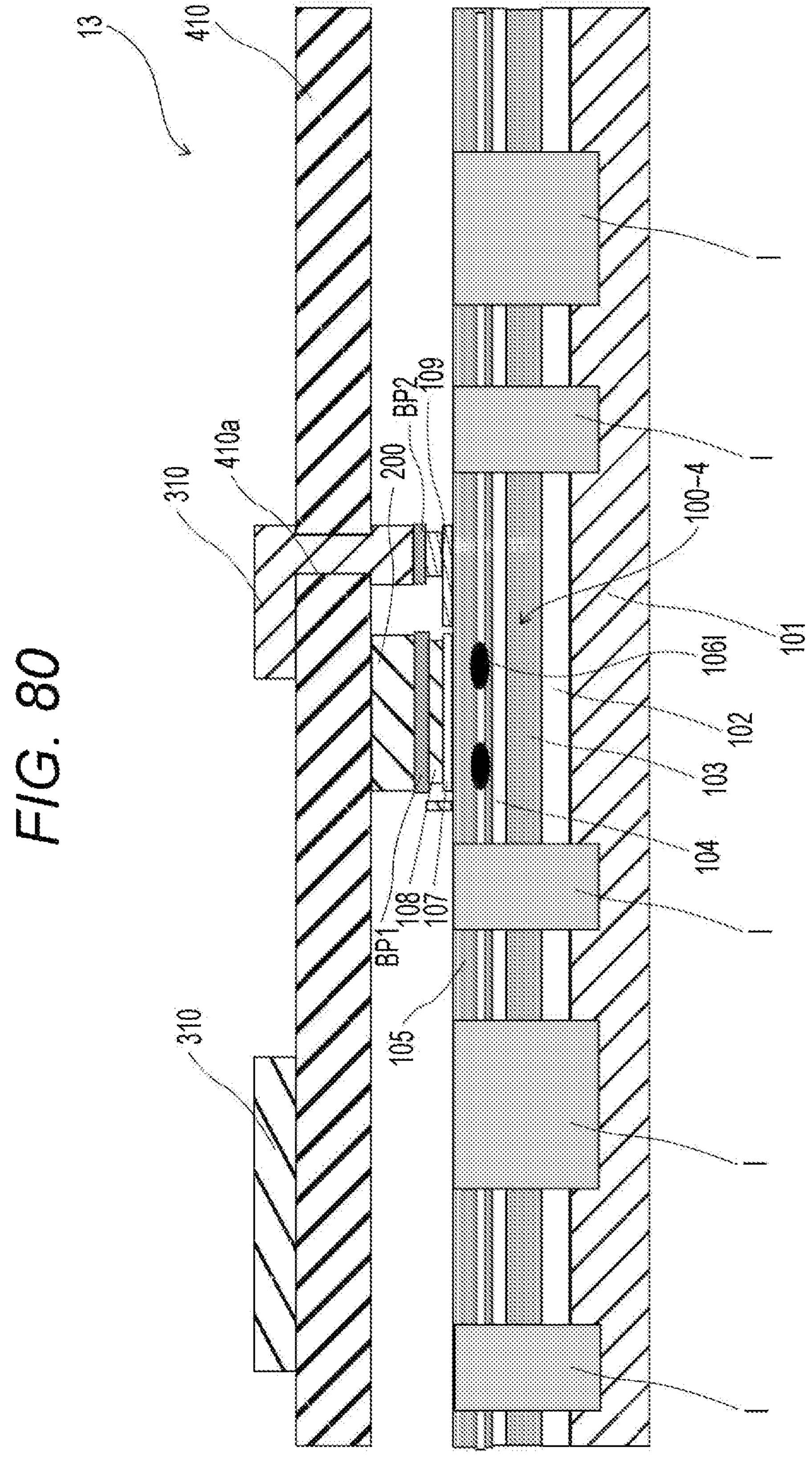
FIG. 80 is a cross-sectional view taken along line B-B in FIG. 78.

For example, as in a surface emitting laser device 13 according to Modification 2 of the second embodiment illustrated in FIGS. 78 to 80, a light emitting unit may not have a mesa protruding toward the second board side.

Each light emitting unit 100-4 of a surface emitting laser array 10-9 of the surface emitting laser device 13 is a gain-guided light emitting unit having no mesa.

In the surface emitting laser device 13, a plurality of gain-guided light emitting units 100-4 is joined to a wiring board including a second board 410 by flip chip (for example, junction down).

The light emitting units 100-4 each are insulated from each other by the plurality of implantations I as described above. The implantation I extends from an upper surface of a second multilayer film reflector 105 (a surface on the second board 410 side) to the inside of a board 101. Each light emitting unit 100-4 individually includes only a contact layer 107.

A second electrode 109 includes: a via portion (however, formed only in a partial region in plan view) extending from an upper surface of the second multilayer film reflector 105 (a surface on the second board 410 side) to the inside of a first multilayer film reflector 103; and a joining portion continuous with the via portion and disposed on the second multilayer film reflector 105 so as to surround the contact layer 107. The joining portion is joined to a second wiring line 310 via a second bump BP2.

In the surface emitting laser device 13, a current constriction layer is implemented by an annular ion implantation region 106I generated by ion implantation similarly to the implantation I described above.

In the above-described embodiment and modification, both the first and second multilayer film reflectors 103 and 105 are semiconductor multilayer film reflectors, but are not limited thereto.

For example, the first multilayer film reflector 103 may be a semiconductor multilayer film reflector, and the second multilayer film reflector 105 may be a dielectric multilayer film reflector. The dielectric multilayer film reflector is also a kind of distributed Bragg reflector.

For example, the first multilayer film reflector 103 may be a dielectric multilayer film reflector, and the second multilayer film reflector 105 may be a semiconductor multilayer film reflector.

For example, both the first and second multilayer film reflectors 103 and 105 may be dielectric multilayer film reflectors.

In the surface emitting laser device according to the present technology, the arrangement of the plurality of light emitting units provided on the first board 101 may be, for example, two-dimensional arrangement such as random arrangement.

In the surface emitting laser device according to the present technology, the light emitting unit may have a spacer layer between the active layer 104 and the first multilayer film reflector 103 and/or the second multilayer film reflector 105.

In the surface emitting laser device according to the present technology, the current constriction layer 106 is not necessarily provided.

In the surface emitting laser device according to the present technology, the contact layer 107 is not necessarily provided.

In the surface emitting laser device according to the present technology, the buffer layer 102 is not necessarily provided.

The surface emitting laser device according to the present technology can also be installed with a front-side emission surface emitting laser array that emits light from a mesa top portion. Specifically, for example, a surface emitting laser array chip may be mounted by wire bonding on a surface of the second board on the first board side or a surface on a side opposite to the first board.

In the surface emitting laser device according to the present technology, at least one of the first wiring line, the second wiring line, or the third wiring line may be, for example, a mesh-shaped wiring line, a wiring line having a branch portion, or a wiring line including a curved portion.

In the surface emitting laser device according to the present technology, the conductivity types (for example, p-type and n-type) of the individual light emitting units of the surface emitting laser array may be reversed.

In the surface emitting laser device according to the present technology, the third wiring line may be provided on the first board and/or the second board.

In the surface emitting laser device according to the present technology, a total number of third wiring lines provided on the first board and/or the second board may be one or more.

In the surface emitting laser device according to the present technology, a conductor may be provided on the first board and/or the second board.

In the surface emitting laser device according to the present technology, a total number of conductors provided on the first board and/or the second board may be one or more.

In the surface emitting laser device according to the present technology, the conductor provided on the first board and/or the second board is not limited to a straight shape, and may have, for example, a curved portion or a branched portion.

In the surface emitting laser device according to the present technology, the first wiring group or the second wiring group may be provided on a third board different from both the first board and the second board. In this case, the conductor or the third wiring line may be provided along at least a part of the first wiring group or the second wiring group provided on the third board.

In each of the embodiments and the modifications described above, the first wiring line is an anode wiring line and the second wiring line is a cathode wiring line, but the first wiring line may be a cathode wiring line and the second wiring line may be an anode wiring line.

In each of the embodiments and the modifications described above, the first electrode is an anode electrode, and the second electrode is a cathode electrode, but the first electrode may be a cathode electrode, and the second electrode may be an anode electrode.

The surface emitting laser device according to the present technology may include at least two light emitting units electrically connected to the common first wiring line and the common second wiring line and turned on/off in synchronization.

Some of the configurations of the surface emitting laser devices in each of the embodiments and the modifications described above may be combined in a range not inconsistent with each other.

18. Application Example to Electronic Device

The technology according to the present disclosure (the present technology) can be applied to various products (electronic devices). For example, the technology according to the present disclosure may be realized as a device equipped on any type of mobile objects, such as an automobile, an electric car, a hybrid electric car, a motorcycle, a bicycle, personal mobility, an airplane, a drone, a ship, a robot, and the like.

The surface emitting laser device according to the present technology can be applied to, for example, a light source of a device (for example, a laser printer, a laser copier, a projector, a head-mounted display, a head-up display, or the like) that forms or displays an image by laser light.

19. <Example in Which Surface Emitting Laser Device is Applied to Distance Measuring Device>

Hereinafter, an application example of the surface emitting laser device according to the above-described each embodiment and each modification will be described.

Figure 81:
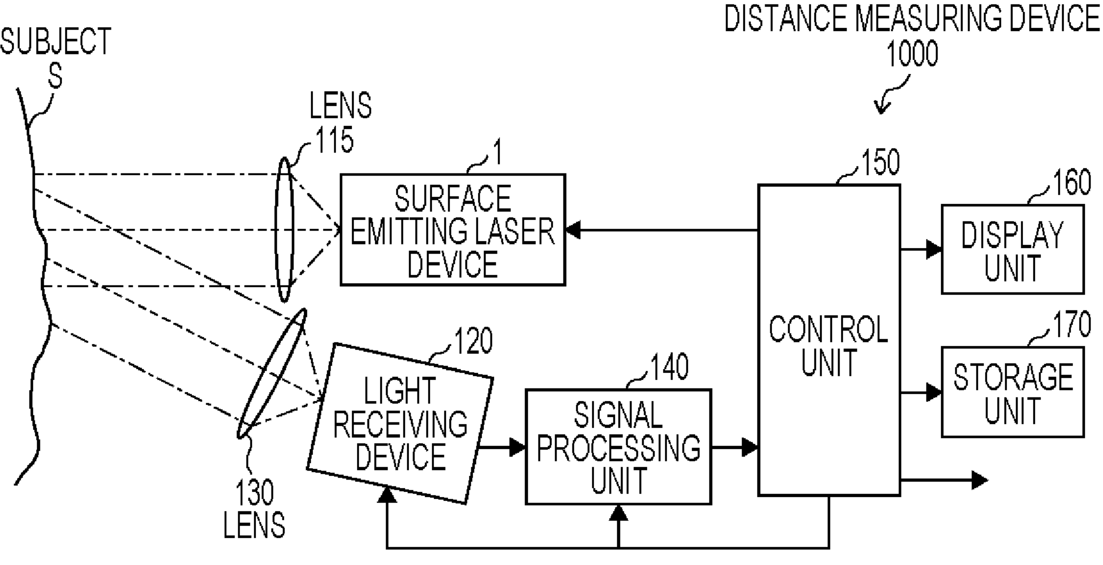
FIG. 81 is a diagram illustrating an application example of the surface emitting laser device according to each embodiment of the present technology and the modification thereof to a distance measuring device.

FIG. 81 illustrates an example of a schematic configuration of a distance measuring device 1000 including the surface emitting laser device 1, as an example of an electronic device according to the present technology. The distance measuring device 1000 measures a distance to a subject S by a time of flight (TOF) method. The distance measuring device 1000 includes the surface emitting laser device 1 as a light source. The distance measuring device 1000 includes, for example, the surface emitting laser device 1, a light receiving device 120, a lenses 115 and 130, a signal processing unit 140, a control unit 150, a display unit 160, and a storage unit 170.

The light receiving device 120 detects light reflected by the subject S. The lens 115 is a lens for collimating light emitted from the surface emitting laser device 1, and is a collimating lens. The lens 130 is a lens for condensing light reflected by the subject S and guiding the light to the light receiving device 120, and is a condenser lens.

The signal processing unit 140 is a circuit for generating a signal corresponding to a difference between a signal inputted from the light receiving device 120 and a reference signal inputted from the control unit 150. The control unit 150 includes, for example, a time-to-digital converter (TDC). The reference signal may be a signal inputted from the control unit 150, or may be an output signal of a detection unit that directly detects an output of the surface emitting laser device 1. The control unit 150 is, for example, a processor that controls the surface emitting laser device 1, the light receiving device 120, the signal processing unit 140, the display unit 160, and the storage unit 170. The control unit 150 is a circuit that measures a distance to the subject S on the basis of a signal generated by the signal processing unit 140. The control unit 150 generates a video signal for displaying information about a distance to the subject S, and outputs the video signal to the display unit 160. The display unit 160 displays information about the distance to the subject S, on the basis of the video signal inputted from the control unit 150. The control unit 150 stores information about the distance to the subject S in the storage unit 170.

In the present application example, instead of the surface emitting laser device 1, any one of the surface emitting laser devices 2 to 12 described above can be applied to the distance measuring device 1000.

20. <Example in Which Distance Measuring Device is Installed on Mobile Object>

Figure 82:
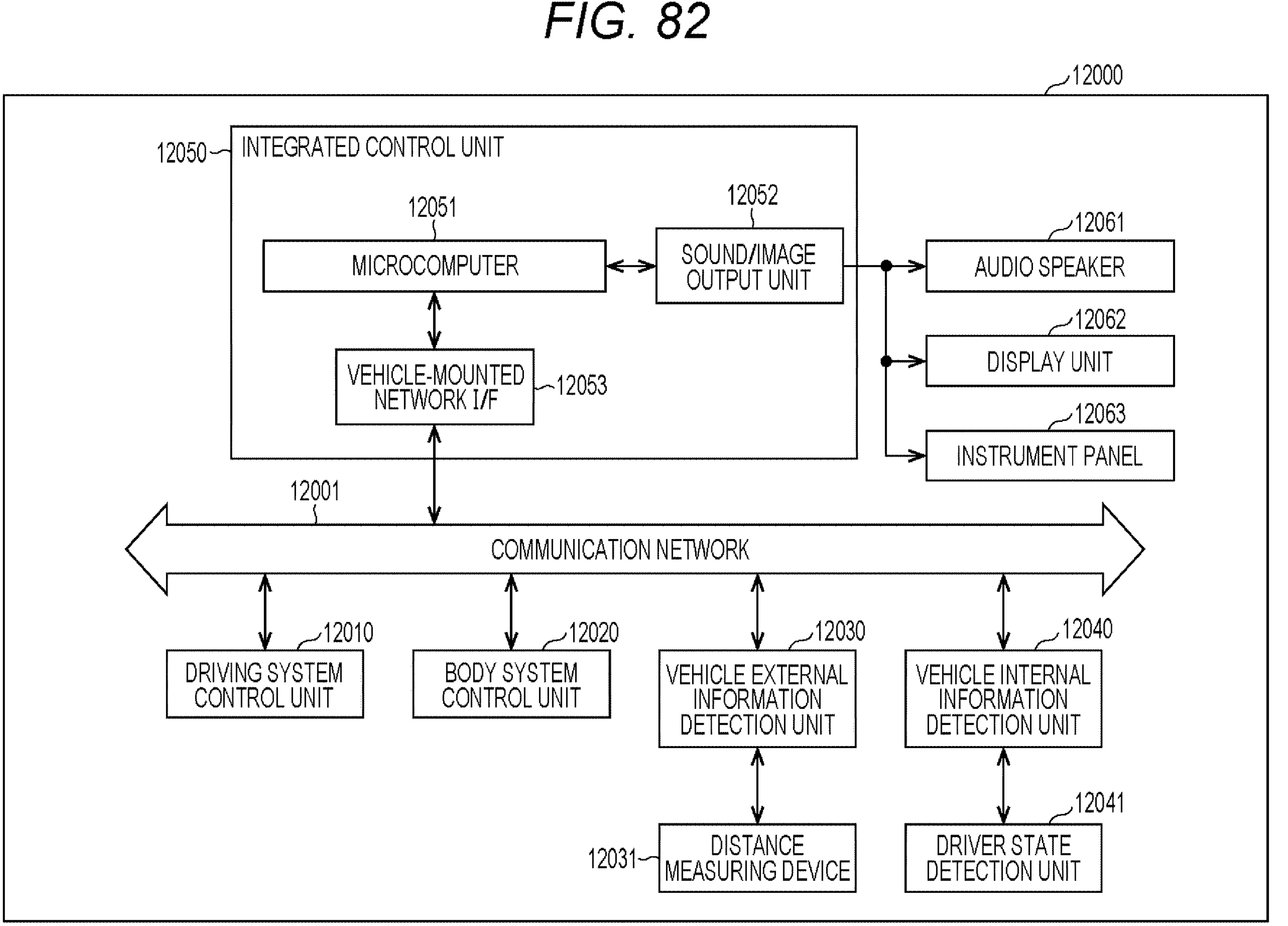
FIG. 82 is a block diagram illustrating an example of a schematic configuration of a vehicle control system.

FIG. 82 is a block diagram illustrating a schematic configuration example of a vehicle control system, which is an example of a mobile object control system to which the technology according to the present disclosure may be applied.

A vehicle control system 12000 includes a plurality of electronic control units connected to each other via a communication network 12001. In the example illustrated in FIG. 82, the vehicle control system 12000 includes a driving system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, a sound/image output unit 12052, and a vehicle-mounted network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various lamps such as a headlamp, a back lamp, a brake lamp, a turn indicator, or a fog lamp. In this case, the body system control unit 12020 may be inputted with radio waves or signals of various switches transmitted from a portable device that substitutes for a key. The body system control unit 12020 receives these input radio waves or signals, and controls a door lock device, the power window device, the lamps, or the like of the vehicle.

The vehicle external information detection unit 12030 detects information about the outside of the vehicle including the vehicle control system 12000. For example, a distance measuring device 12031 is connected to the vehicle external information detection unit 12030. The distance measuring device 12031 includes the above-described distance measuring device 1000. The vehicle external information detection unit 12030 causes the distance measuring device 12031 to measure a distance to an object (the subject S) outside the vehicle, and acquires distance data obtained by the measurement. The vehicle external information detection unit 12030 may perform object detection processing of a person, a vehicle, an obstacle, a sign, or the like on the basis of the acquired distance data.

The vehicle internal information detection unit 12040 detects information about the inside of the vehicle. The vehicle internal information detection unit 12040 is connected with, for example, a driver state detection unit 12041 that detects a state of a driver. The driver state detection unit 12041, for example, includes a camera that images the driver. On the basis of detection information inputted from the driver state detection unit 12041, the vehicle internal information detection unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the vehicle external information detection unit 12030 or the vehicle internal information detection unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on an inter-vehicle interval, vehicle speed maintaining driving, a warning of collision of the vehicle, a warning of deviation of the vehicle from a lane, or the like.

Furthermore, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the vehicle external information detection unit 12030 or the vehicle internal information detection unit 12040.

Furthermore, the microcomputer 12051 can output a control command to the body system control unit 12020 on the basis of information about the outside of the vehicle acquired by the vehicle external information detection unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the vehicle external information detection unit 12030.

The sound/image output unit 12052 transmits an output signal of at least one of a sound and an image to an output device capable of visually or auditorily notifying information to an occupant of the vehicle or the outside of the vehicle. In the example of FIG. 82, an audio speaker 12061, a display unit 12062, and an instrument panel 12063 are illustrated as the output device. The display unit 12062 may, for example, include at least one of an on-board display and a head-up display.

Figure 83:
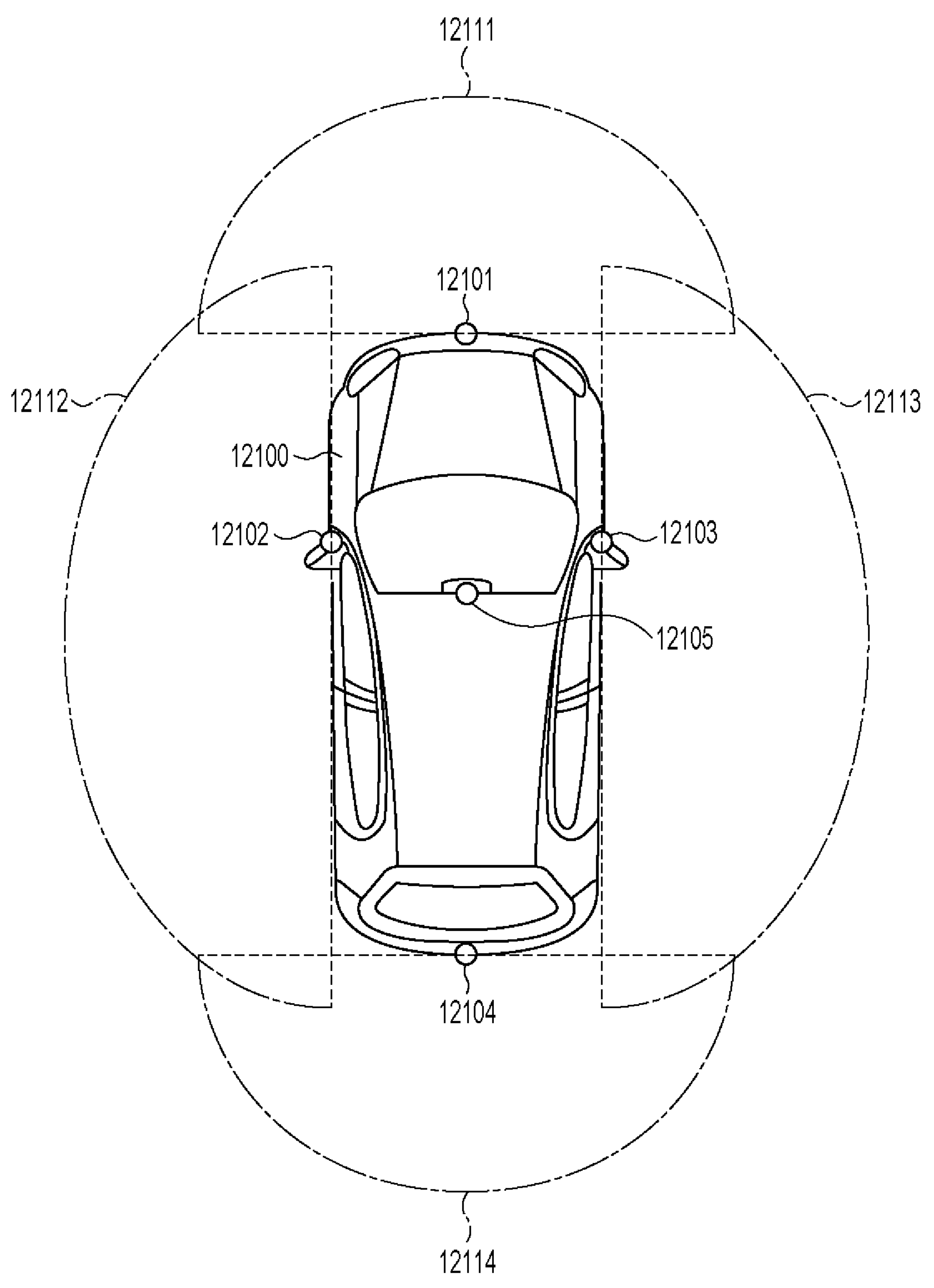
FIG. 83 is an explanatory view illustrating an example of an installation position of the distance measuring device.

FIG. 83 is a view illustrating an example of an installation position of the distance measuring device 12031.

In FIG. 83, a vehicle 12100 includes distance measuring devices 12101, 12102, 12103, 12104, and 12105 as the distance measuring device 12031.

The distance measuring devices 12101, 12102, 12103, 12104, and 12105 are provided at positions such as, for example, a front nose, side mirrors, a rear bumper, a back door, and an upper part of a windshield in a vehicle cabin, of the vehicle 12100. The distance measuring device 12101 provided at the front nose and the distance measuring device 12105 provided at the upper part of the windshield in the vehicle cabin mainly acquire data of a front side of the vehicle 12100. The distance measuring devices 12102 and 12103 provided at the side mirrors mainly acquire data of a side of the vehicle 12100. The distance measuring device 12104 provided at the rear bumper or the back door mainly acquires data of a rear side of the vehicle 12100. The data of the front side acquired by the distance measuring devices 12101 and 12105 is mainly used for detecting a preceding vehicle, a pedestrian, an obstacle, a traffic light, a traffic sign, or the like.

Note that FIG. 83 illustrates an example of detection ranges of the distance measuring devices 12101 to 12104. A detection range 12111 indicates a detection range of the distance measuring device 12101 provided at the front nose, detection ranges 12112 and 12113 individually indicate detection ranges of the distance measuring devices 12102 and 12103 provided at the side mirrors, and a detection range 12114 indicates a detection range of the distance measuring device 12104 provided at the rear bumper or the back door.

For example, the microcomputer 12051 can determine a distance to each three-dimensional object within the detection ranges 12111 to 12114 and a temporal change in the distance (a relative speed with respect to the vehicle 12100) on the basis of the distance data obtained from the distance measuring devices 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Moreover, the microcomputer 12051 can set an inter-vehicle interval to be secured from a preceding vehicle in advance, and perform automatic brake control (including follow-up stop control), automatic acceleration control (including follow-up start control), and the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance data obtained from the distance measuring devices 12101 to 12104, extract the classified three-dimensional object data, and use the extracted three-dimensional object data for automatic avoidance of an obstacle. For example, the microcomputer 12051 distinguishes obstacles around the vehicle 12100 into obstacles that are visible to the driver of the vehicle 12100 and obstacles that are difficult to see. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

An example of the mobile object control system to which the technology according to the present disclosure can be applied has been described above. The technology according to the present disclosure can be applied to the distance measuring device 12031 among the configurations described above.

The specific numerical values, shapes, materials (including compositions), and the like described in the present specification are merely examples, and are not limited thereto.

Furthermore, the present technology can also have the following configurations.

(1) A surface emitting laser device including:

a first wiring group including a plurality of first wiring lines insulated from each other;

a second wiring group including a plurality of second wiring lines insulated from each other;

a first board provided with a plurality of light emitting units electrically connected to any one of the plurality of first wiring lines and electrically connected to any one of the plurality of second wiring lines; and a second board disposed to face the first board and provided with the first wiring group and/or the second wiring group.

(2) The surface emitting laser device according to (1), in which each of a plurality of the light emitting units is joined to a corresponding wiring line of one wiring group provided on the second board among the first wiring group and the second wiring group.

(3) The surface emitting laser device according to (1) or (2), in which both the first wiring group and the second wiring group are provided on the second board.

(4) The surface emitting laser device according to (3), in which each of the plurality of light emitting units has a mesa protruding on the second board side, a first electrode provided at a top portion of the mesa of each light emitting unit among the plurality of light emitting units is joined via a first bump to each of the first wiring lines corresponding to the each light emitting unit, and a second electrode provided in a peripheral portion of each light emitting unit among the plurality of light emitting units on the first board is joined via a second bump to each of the second wiring lines corresponding to the each light emitting unit.

(5) The surface emitting laser device according to (1) or (2), in which the first wiring group or the second wiring group is provided on the second board.

(6) The surface emitting laser device according to (5), in which each of the plurality of light emitting units has a mesa protruding on the second board side, the first wiring group is provided on the second board, the second wiring group is provided on the first board, a first electrode provided at a top portion of the mesa of each light emitting unit among the plurality of light emitting units is joined via a first bump to each of the first wiring lines corresponding to the each light emitting unit, and each second wiring line among the plurality of second wiring lines is joined via a second bump to a wiring line provided on the second board and corresponding to the each second wiring line.

(7) The surface emitting laser device according to (6), in which each of the plurality of second wiring lines includes a first portion provided along the first board and a second portion provided along a pedestal portion provided on the first board, and the second portion of each of the second wiring lines is joined via the second bump to the wiring line that is corresponding.

(8) The surface emitting laser device according to any one of (1) to (7), further including a conductor that is disposed along at least a part of the first wiring group and/or the second wiring group and insulated from both the first wiring group and the second wiring group.

(9) The surface emitting laser device according to (8), in which the conductor is provided on the first board and/or the second board.

(10) The surface emitting laser device according to (8) or (9), in which the conductor is connected to a reference potential.

(11) The surface emitting laser device according to any one of (8) to (10), in which the conductor is metal or an alloy.

(12) The surface emitting laser device according to any one of (8) to (10), in which the conductor is a semiconductor containing impurities.

(13) The surface emitting laser device according to any one of (8) to (11), further including a third wiring line that is provided on the second board and insulated from both the first wiring group and the second wiring group, in which the conductor is provided on the first board, and the conductor and the third wiring line are joined via a bump.

(14) The surface emitting laser device according to (13), in which the third wiring line is provided along at least a part of the first wiring group and/or the second wiring group.

(15) The surface emitting laser device according to any one of (1) to (14), further including a third wiring line provided on the first board and/or the second board and insulated from both the first wiring group and the second wiring group, in which the third wiring line is provided along at least a part of the first wiring group and/or the second wiring group.

(16) The surface emitting laser device according to any one of (1) to (15), in which a total of a number of the plurality of first wiring lines and a number of the plurality of second wiring lines is less than twice a number of the light emitting units.

(17) The surface emitting laser device according to any one of (1) to (16), in which each of the light emitting units includes a layered structure in which a first multilayer film reflector, an active layer, and a second multilayer film reflector are layered in this order on the first board.

(18) The surface emitting laser device according to any one of (1) to (17), in which both the first wiring group and the second wiring group are connected to an electronic circuit.

(19) The surface emitting laser device according to any one of (1) to (18), in which the second board contains an insulating material, an electronic circuit is disposed on the second board or in the second board, and the first wiring group and the second wiring group are connected to the electronic circuit.

(20) The surface emitting laser device according to (19), further including a conductor that is disposed along at least a part of the first wiring group and/or the second wiring group and insulated from both the first wiring group and the second wiring group.

(21) The surface emitting laser device according to any one of (1) to (20), in which the plurality of light emitting units is two-dimensionally arranged on the first board, the plurality of first wiring lines extends in a first direction, the plurality of second wiring lines extends in a second direction, and the first direction and the second direction are not parallel to each other when viewed from a direction perpendicular to the first board.

(22) The surface emitting laser device according to (17), in which each of the light emitting units includes a plurality of the active layers layered on one another between the first multilayer film reflector and the second multilayer film reflector, and includes a tunnel junction arranged between two adjacent active layers among the plurality of active layers.

(23) An electronic device including the surface emitting laser device according to any one of (1) to (22).

(24) A manufacturing method for a surface emitting laser device, the manufacturing method including:

a step of forming a plurality of light emitting units on a first board; and a step of joining each of a plurality of the light emitting units and a wiring line that is corresponding in a wiring group, the wiring group being formed on a second board and including a plurality of the wiring lines insulated from each other.

REFERENCE SIGNS LIST

1 to 12 Surface emitting laser device
10-1 to 10-8 Surface emitting laser array
20 First wiring group
30, 31 Second wiring group
100-1 to 100-3 Light emitting unit
101 First board
103 First multilayer film reflector
104 Active layer
105 Second multilayer film reflector
108 First electrode
109 Second electrode
200 First wiring line
300, 310 Second wiring line
300*a* First portion
300*b* Second portion
400, 410 Second board
500, 600, 700 Conductor
600, 700 Third wiring line
800 Laser driver (electronic circuit)
M Mesa
P Pedestal portion
BP1 First bump
BP2 Second bump
BP3 Third bump

The invention claimed is:

1. A surface emitting laser device, comprising:

a first wiring group including a plurality of first wiring lines insulated from each other;

a second wiring group including a plurality of second wiring lines insulated from each other;

a first board including a plurality of light emitting units electrically connected to one of the plurality of first wiring lines and electrically connected to one of the plurality of second wiring lines; and a second board that faces the first board and includes at least one of the first wiring group or the second wiring group, wherein each of the plurality of light emitting units is joined to a corresponding wiring line of a wiring group provided on the second board among the first wiring group and the second wiring group, each of the plurality of light emitting units has a mesa protruding toward the second board, a first electrode provided at a top portion of the mesa of each light emitting unit among the plurality of light emitting units is joined via a first bump to a corresponding first wiring line of the plurality of first wiring lines, a second electrode provided in a peripheral portion of each light emitting unit among the plurality of light emitting units on the first board is joined via a second bump to a corresponding second wiring line of the plurality of second wiring lines, and each of the plurality of second wiring lines includes:

a first portion provided along the first board; and a second portion provided along a pedestal portion on the first board, wherein the second portion of each of the plurality of second wiring lines is joined via the second bump to the corresponding wiring line provided on the second board.

2. The surface emitting laser device according to claim 1, further comprising a conductor disposed along at least a part of the first wiring group or the second wiring group and insulated from both the first wiring group and the second wiring group.

3. The surface emitting laser device according to claim 2, wherein the conductor is on at least one of the first board or the second board.

4. The surface emitting laser device according to claim 2, wherein the conductor is connected to a reference potential.

5. The surface emitting laser device according to claim 2, wherein the conductor is one of metal or an alloy.

6. The surface emitting laser device according to claim 2, wherein the conductor is a semiconductor containing impurities.

7. The surface emitting laser device according to claim 2, further comprising:

a third wiring line on the second board and insulated from both the first wiring group and the second wiring group, wherein the conductor is on the first board, and the conductor and the third wiring line are joined via a third bump.

8. The surface emitting laser device according to claim 7, wherein the third wiring line is along at least a part of the first wiring group or the second wiring group.

9. The surface emitting laser device according to claim 1, further comprising:

a third wiring line on at least one of the first board or the second board and insulated from both the first wiring group and the second wiring group, wherein the third wiring line is along at least a part of the first wiring group or the second wiring group.

10. The surface emitting laser device according to claim 1, wherein a total of a number of the plurality of first wiring lines and a number of the plurality of second wiring lines is less than twice a number of the plurality of light emitting units.

11. The surface emitting laser device according to claim 1, wherein each of the plurality of light emitting units includes a layered structure in which a first multilayer film reflector, an active layer, and a second multilayer film reflector are layered in this order on the first board.

12. The surface emitting laser device according to claim 1, wherein both the first wiring group and the second wiring group are connected to an electronic circuit.

13. The surface emitting laser device according to claim 1, wherein the second board contains an insulating material, an electronic circuit is on the second board or in the second board, and the first wiring group and the second wiring group are connected to the electronic circuit.

14. The surface emitting laser device according to claim 13, further comprising a conductor that is disposed along at least a part of the first wiring group or the second wiring group and insulated from both the first wiring group and the second wiring group.

* * * * *